(12) United States Patent
Ning

(10) Patent No.: US 10,387,244 B2
(45) Date of Patent: Aug. 20, 2019

(54) METHODS FOR ERROR CORRECTION WITH RESISTIVE CHANGE ELEMENT ARRAYS

(71) Applicant: Nantero, Inc., Woburn, MA (US)

(72) Inventor: Sheyang Ning, Xian (CN)

(73) Assignee: Nantero, Inc., Woburn, MA (US)

(*) Notice: Subject to any disclaimer, the term of this patent is extended or adjusted under 35 U.S.C. 154(b) by 0 days.

(21) Appl. No.: 15/621,757

(22) Filed: Jun. 13, 2017

(65) Prior Publication Data
US 2018/0004599 A1  Jan. 4, 2018

Related U.S. Application Data

(60) Provisional application No. 62/357,716, filed on Jul. 1, 2016.

(51) Int. Cl.
*G06F 11/10* (2006.01)
*G11C 29/52* (2006.01)
(Continued)

(52) U.S. Cl.
CPC ...... *G06F 11/1068* (2013.01); *G06F 11/1048* (2013.01); *G11C 13/0069* (2013.01); *G11C 29/44* (2013.01); *G11C 29/52* (2013.01); *G11C 13/003* (2013.01); *G11C 13/004* (2013.01); *G11C 2013/0083* (2013.01);
(Continued)

(58) Field of Classification Search
CPC ............. G06F 11/1048; G06F 11/1068; G06F 11/1072; G11C 13/0004; G11C 13/0069; G11C 13/0025; G11C 29/44; G11C 29/52
See application file for complete search history.

(56) References Cited

U.S. PATENT DOCUMENTS 6,584,589 B1   6/2003 Perner et al.
7,865,810 B2 * 1/2011 Chang ................ H04N 19/89
714/784
(Continued)

OTHER PUBLICATIONS

Ning et al., "Reset-Check-Reverse-Flag Scheme on NRAM With 50% Bit Error Rate or 35% Parity Overhead and 16% Decoding Latency Reductions for Read-Intensive Storage Class Memory," IEEE Journal of Solid State Circuits vol. 51, No. 8, Aug. 2018, pp. 1938-1951.
(Continued)

*Primary Examiner* — Shelly A Chase
(74) *Attorney, Agent, or Firm* — Nantero, Inc.

(57) ABSTRACT

Error correction methods for arrays of resistive change elements are disclosed. An array of resistive change elements is organized into a plurality of subsections. Each subsection includes at least one flag bit and a plurality of data bits. At the start of a write operation, all bits in a subsection are initialized. If any data bits fail to initialize, the pattern of errors is compared to the input data pattern. The flag cells are then activated to indicate the appropriate encoding pattern to apply to the input data to match the errors. The input data is then encoded according to this encoding pattern before being written to the array. A second error correction algorithm can be used to correct remaining errors. During a read operation, the encoding pattern indicated by the flag bits is used to decode the read data and retrieve the original input data.

34 Claims, 69 Drawing Sheets

(51) Int. Cl.
    *G11C 13/00*     (2006.01)
    *G11C 29/44*     (2006.01)
    *G11C 29/04*     (2006.01)

(52) U.S. Cl.
    CPC ............... *G11C 2029/0407* (2013.01); *G11C 2029/0411* (2013.01); *G11C 2213/71* (2013.01); *G11C 2213/79* (2013.01); *G11C 2213/82* (2013.01)

(56) References Cited

U.S. PATENT DOCUMENTS

| | | | |
|---|---|---|---|
| 8,923,043 B2* | 12/2014 | Roh | G11C 13/0004 365/163 |
| 9,299,430 B1 | 3/2016 | Bertin et al. | |
| 9,640,257 B2 | 5/2017 | Javerliac et al. | |
| 2005/0275573 A1* | 12/2005 | Raveendran | H03M 13/2927 341/120 |
| 2006/0250843 A1 | 11/2006 | Bertin et al. | |
| 2008/0273388 A1 | 11/2008 | Chin et al. | |
| 2009/0055708 A1 | 2/2009 | Chang et al. | |
| 2011/0038195 A1* | 2/2011 | Hamilton | B82Y 10/00 365/148 |
| 2012/0069622 A1 | 3/2012 | Parkinson et al. | |
| 2015/0261602 A1* | 9/2015 | Fujita | G06F 11/1048 714/764 |
| 2016/0126980 A1* | 5/2016 | Blaettler | H04L 1/0061 714/755 |

OTHER PUBLICATIONS

PCT International Search Report, Application No. PCT/US2017/038478, dated Oct. 17, 2017, 4 pages.

PCT Written Opinion of the International Searching Authority, Application No. PCT/US2017/038478, dated Oct. 17, 2017, 7 pages.

* cited by examiner

300

| | RESET | SET | READ |
|---|---|---|---|
| WL[0] | $V_{PP}$ | $V_{PP}$ | $V_{PP}$ |
| BL[0] | $V_{RST}$ | 0V | 0V |
| SL[0] | 0V | $V_{SET}$ | $V_{RD}$ |
| WL[1:y] | 0V | 0V | 0V |
| BL[1:x] | Z | Z | Z |
| SL[1:x] | Z | Z | Z |

| Correctable BER | Correctable Errors per Block | Required BCH Parity Bits (BCH alone) | Total Bits (Data + BCH) | Parity Overhead (BCH alone) |
|---|---|---|---|---|
| 0.1% | 8 | 112 | 8,304 | 1.4% |
| 0.2% | 17 | 238 | 8,430 | 2.9% |
| 0.3% | 26 | 364 | 8,556 | 4.4% |
| 0.4% | 35 | 490 | 8,682 | 6.0% |
| 0.5% | 44 | 616 | 8,808 | 7.5% |

| Correctable BER | Correctable Errors per 1kB (8192 bit) Block | Required Parity Bits (RFEC + BCH) | Total Bits (Data + RFEC + BCH) | Parity Overhead (RFEC + BCH) |
|---|---|---|---|---|
| 0.1% | 8 | 74 | 8,266 | 0.9% |

FIG. 9C

Single Flag DFEC (RFEC)                                                                                    1301

| Subsections per Block | Bits in Subsection | Total errors per Block RESET / SET | | Flag Bit Correctable Errors (RESET ONLY) | Flag Bit Parity Overhead | BCH Correctable Errors RESET / SET | | Required BCH Parity Bits | BCH Parity Overhead | Total Parity Overhead | Total Decoding Latency |
|---|---|---|---|---|---|---|---|---|---|---|---|
| 4 | 2048 | 12 | 4 | 3 | 0.05% | 9 | 4 | 182 | 2.2% | 2.3% | 1.18 µs |
| 8 | 1024 | 12 | 4 | 5 | 0.1% | 7 | 4 | 154 | 1.9% | 2.0% | 1.10 µs |
| 16 | 512 | 12 | 4 | 8 | 0.2% | 4 | 4 | 112 | 1.4% | 1.6% | 0.98 µs |
| 32 | 256 | 12 | 4 | 9 | 0.4% | 3 | 4 | 98 | 1.2% | 1.6% | 0.94 µs |
| 64 | 128 | 12 | 4 | 10 | 0.8% | 2 | 4 | 84 | 1.0% | 1.8% | 0.9 µs |

Block Size = 1024 Bytes / 8192 Bits
Correctable BER of 0.2% = 16 Correctable Errors within 8192 Bits
(12 RESET Errors / 4 SET Errors)

FIG. 13A

Single Flag DFEC (RFEC)

| Subsections per Block | Bits in Subsection | Total errors per Block RESET / SET | | Flag Bit Correctable Errors (RESET ONLY) | Flag Bit Parity Overhead | BCH Correctable Errors RESET / SET | | Required BCH Parity Bits | BCH Parity Overhead | Total Parity Overhead | Total Decoding Latency |
|---|---|---|---|---|---|---|---|---|---|---|---|
| 4 | 2048 | 20 | 4 | 3 | 0.05% | 17 | 4 | 294 | 3.6% | 3.6% | 1.33 μs |
| 8 | 1024 | 20 | 4 | 6 | 0.1% | 14 | 4 | 252 | 3.1% | 3.2% | 1.14 μs |
| 16 | 512 | 20 | 4 | 11 | 0.2% | 9 | 4 | 182 | 2.2% | 2.4% | 0.98 μs |
| 32 | 256 | 20 | 4 | 14 | 0.4% | 6 | 4 | 140 | 1.7% | 2.1% | 0.90 μs |
| 64 | 128 | 20 | 4 | 17 | 0.8% | 3 | 4 | 98 | 1.2% | 2.0% | 0.86 μs |

1303

Block Size = 1024 Bytes / 8192 Bits
Correctable BER of 0.3% = 24 Correctable Errors within 8192 Bits
(20 RESET Errors / 4 SET Errors)

FIG. 13C

Dual Flag DFEC (DRFEC)                                                                1401

| Subsections per Block | Bits in Subsection | Total errors per Block RESET \| SET | | Flag Bit Correctable Errors (RESET ONLY) | Flag Bit Parity Overhead | BCH Correctable Errors RESET \| SET | | Required BCH Parity Bits | BCH Parity Overhead | Total Parity Overhead | Total Decoding Latency |
|---|---|---|---|---|---|---|---|---|---|---|---|
| 4 | 2048 | 12 | 4 | 5 | 0.1% | 7 | 4 | 154 | 1.9% | 2.0% | 1.10 µs |
| 8 | 1024 | 12 | 4 | 8 | 0.2% | 4 | 4 | 112 | 1.4% | 1.6% | 0.98 µs |
| 16 | 512 | 12 | 4 | 9 | 0.4% | 3 | 4 | 98 | 1.2% | 1.6% | 0.94 µs |
| 32 | 256 | 12 | 4 | 10 | 0.8% | 2 | 4 | 84 | 1.0% | 1.8% | 0.90 µs |
| 64 | 128 | 12 | 4 | 11 | 1.6% | 1 | 4 | 70 | 0.9% | 2.4% | 0.86 µs |

Block Size = 1024 Bytes / 8192 Bits
Correctable BER of 0.2% = 16 Correctable Errors within 8192 Bits
(12 RESET Errors / 4 SET Errors)

FIG. 14A

Dual Flag DFEC (DRFEC) 1403

| Subsections per Block | Bits in Subsection | Total errors per Block RESET / SET | | Flag Bit Correctable Errors (RESET ONLY) | Flag Bit Parity Overhead | BCH Correctable Errors RESET / SET | | Required BCH Parity Bits | BCH Parity Overhead | Total Parity Overhead | Total Decoding Latency |
|---|---|---|---|---|---|---|---|---|---|---|---|
| 4 | 2048 | 20 | 4 | 6 | 0.1% | 14 | 4 | 252 | 3.1% | 3.2% | 1.37 μs |
| 8 | 1024 | 20 | 4 | 11 | 0.2% | 9 | 4 | 182 | 2.2% | 2.4% | 1.18 μs |
| 16 | 512 | 20 | 4 | 14 | 0.4% | 6 | 4 | 140 | 1.7% | 2.1% | 1.06 μs |
| 32 | 256 | 20 | 4 | 17 | 0.8% | 3 | 4 | 98 | 1.2% | 2.0% | 0.94 μs |
| 64 | 128 | 20 | 4 | 18 | 1.6% | 2 | 4 | 84 | 1.0% | 2.6% | 0.90 μs |

Block Size = 1024 Bytes / 8192 Bits
Correctable BER of 0.3% = 24 Correctable Errors within 8192 Bits
(20 RESET Errors / 4 SET Errors)

FIG. 14C

Three Flag DFEC (ABF)

| Subsections per Block | Bits in Subsection | Total errors per Block RESET / SET | | Flag Bit Correctable Errors (RESET ONLY) | Flag Bit Parity Overhead | BCH Correctable Errors RESET / SET | | Required BCH Parity Bits | BCH Parity Overhead | Total Parity Overhead | Total Decoding Latency |
|---|---|---|---|---|---|---|---|---|---|---|---|
| 4 | 2048 | 12 | 4 | 6 | 0.15% | 6 | 4 | 140 | 1.7% | 1.9% | 1.06 µs |
| 8 | 1024 | 12 | 4 | 9 | 0.3% | 3 | 4 | 98 | 1.2% | 1.5% | 0.94 µs |
| 16 | 512 | 12 | 4 | 11 | 0.6% | 1 | 4 | 70 | 0.9% | 1.4% | 0.86 µs |
| 32 | 256 | 12 | 4 | 11 | 1.2% | 1 | 4 | 70 | 0.9% | 2.0% | 0.86 µs |
| 64 | 128 | 12 | 4 | 11 | 2.4% | 1 | 4 | 70 | 0.9% | 3.1% | 0.86 µs |

1501

Block Size = 1024 Bytes / 8192 Bits
Correctable BER of 0.2% = 16 Correctable Errors within 8192 Bits
(12 RESET Errors / 4 SET Errors)

FIG. 15A

Three Flag DFEC (ABF)                                                                                                                      1503

| Subsections per Block | Bits in Subsection | Total errors per Block RESET / SET | | Flag Bit Correctable Errors (RESET ONLY) | Flag Bit Parity Overhead | BCH Correctable Errors RESET / SET | | Required BCH Parity Bits | BCH Parity Overhead | Total Parity Overhead | Total Decoding Latency |
|---|---|---|---|---|---|---|---|---|---|---|---|
| 4 | 2048 | 20 | 4 | 7 | 0.15% | 13 | 4 | 238 | 2.9% | 3.1% | 1.33 µs |
| 8 | 1024 | 20 | 4 | 12 | 0.3% | 8 | 4 | 168 | 2.1% | 2.3% | 1.14 µs |
| 16 | 512 | 20 | 4 | 16 | 0.6% | 4 | 4 | 112 | 1.4% | 2.0% | 0.98 µs |
| 32 | 256 | 20 | 4 | 18 | 1.2% | 2 | 4 | 84 | 1.0% | 2.2% | 0.90 µs |
| 64 | 128 | 20 | 4 | 19 | 2.4% | 1 | 4 | 70 | 0.9% | 3.2% | 0.86 µs |

Block Size = 1024 Bytes / 8192 Bits
Correctable BER of 0.3% = 24 Correctable Errors within 8192 Bits
(20 RESET Errors / 4 SET Errors)

Parity Overhead at 0.2% BER

Number of Subections

|  | 4 | 8 | 16 | 32 | 64 |
|---|---|---|---|---|---|
| BCH Only | 2.73% | 2.73% | 2.73% | 2.73% | 2.73% |
| RFEC | 2.27% | 1.98% | 1.56% | 1.59% | 1.81% |
| DRFEC | 1.98% | 1.56% | 1.59% | 1.81% | 2.42% |
| 3-flag ABF | 1.85% | 1.49% | 1.44% | 2.03% | 3.20% |
| 5-flag ABF | 1.24% | 1.05% | 1.54% | 2.51% | 4.47% |

Parity Overhead includes BCH parity bits and DFEC flag bits
All calculations assume 80% RESET error rate

FIG. 25B

| | Optimal Configuration (Number of Subsections) | | | | | | Parity Overhead for Optimal Configuration | | | | | |
|---|---|---|---|---|---|---|---|---|---|---|---|---|
| | Correctable BER | | | | | | Correctable BER | | | | | |
| | 0.1% | 0.2% | 0.3% | 0.4% | 0.5% | | 0.1% | 0.2% | 0.3% | 0.4% | 0.5% | |
| RFEC | 16 | 16 | 64 | 64 | 64 | | 1.22% | 1.56% | 1.98% | 2.32% | 2.83% | |
| DRFEC | 8* | 8 | 32 | 32* | 32* | | 1.22%* | 1.56% | 1.98% | 2.49%* | 2.83%* | |
| 3-flag ABF | 8 | 16 | 16 | 32 | 32 | | 1.15% | 1.44% | 1.95% | 2.20% | 2.54% | |
| 5-flag ABF | 4 | 8 | 8 | 16 | 16 | | 0.52% | 1.05% | 1.64% | 2.10% | 2.44% | |
| * Estimated values | | | | | | | Optimal Method | | | | | |
| | | | | | | | 5-Flag ABF | 5-Flag ABF | 5-Flag ABF | 5-Flag ABF | 5-Flag ABF | |

FIG. 25C

METHODS FOR ERROR CORRECTION WITH RESISTIVE CHANGE ELEMENT ARRAYS

TECHNICAL FIELD

The present disclosure relates generally to error correction methods suitable for use with resistive change element arrays, and, more specifically, to such error correction methods that reduce parity overhead and improve error decoding latency within resistive change element arrays while still maintaining a required correctable bit error rate (BER).

CROSS-REFERENCE TO RELATED APPLICATIONS

This application is related to the following U.S. Patents, which are assigned to the assignee of the present application, and are hereby incorporated by reference in their entirety:
U.S. Pat. No. 6,835,591, filed on Apr. 23, 2002, entitled Methods of Nanotube Films and Articles;
U.S. Pat. No. 7,335,395, filed on Jan. 13, 2003, entitled Methods of Using Pre Formed Nanotubes to Make Carbon Nanotube Films, Layers, Fabrics, Ribbons, Elements, and Articles;
U.S. Pat. No. 6,706,402, filed on Mar. 16, 2004, entitled Nanotube Films and Articles;
U.S. Pat. No. 7,115,901, filed on Jun. 9, 2004, entitled Non-Volatile Electromechanical Field Effect Devices and Circuits Using Same and Methods of Forming Same;
U.S. Pat. No. 7,365,632, filed on Sep. 20, 2005, entitled Resistive Elements Using Carbon Nanotubes;
U.S. Pat. No. 7,781,862, filed on Nov. 15, 2005, entitled Two-Terminal Nanotube Devices and Systems and Methods of Making Same;
U.S. Pat. No. 8,513,768, filed on Aug. 8, 2007, entitled Nonvolatile Nanotube Diodes and Nonvolatile Nanotube Blocks and Systems Using Same and Methods of Making Same;
U.S. Pat. No. 8,541,843, filed on Aug. 6, 2009, entitled Nonvolatile Nanotube Programmable Logic Devices and a Nonvolatile Nanotube Field Programmable Gate Array Using Same;
U.S. Pat. No. 8,000,127, filed on Nov. 13, 2009, entitled Method for Resetting a Resistive Change Memory Element;
U.S. Pat. No. 8,619,450, filed on Sep. 1, 2010, entitled A Method for Adjusting a Resistive Change Element Using a Reference;
U.S. Pat. No. 9,263,126, filed on Aug. 12, 2014, entitled Method for Dynamically Accessing and Programming Resistive Change Element Arrays; and
U.S. Pat. No. 9,299,430, filed on Jan. 22, 2015, entitled Methods for Reading and Programming 1-R Resistive Change Element Arrays.
This application is related to the following U.S. Patent Applications, which are assigned to the assignee of the application, and are hereby incorporated by reference in their entirety:
U.S. patent application Ser. No. 14/812,173, filed on Jul. 29, 2015, entitled DDR Compatible Memory Circuit Architecture for Resistive Change Element Arrays; and
U.S. patent application Ser. No. 15/136,414, filed on Apr. 22, 2016, entitled Methods for Enhanced State Retention within a Resistive Change Cell.

BACKGROUND OF THE INVENTION

Any discussion of the related art throughout this specification should in no way be considered as an admission that such art is widely known or forms part of the common general knowledge in the field.

Resistive change devices and arrays, often referred to as resistance RAMs by those skilled in the art, are well known in the semiconductor and electronics industry. Such devices and arrays, for example, include, but are not limited to, phase change memory, solid electrolyte memory, metal oxide resistance memory, and carbon nanotube memory such as NRAM™.

Resistive change devices and arrays store information by adjusting a resistive change element, typically comprising some material that can be adjusted between a number of non-volatile resistive states in response to some applied stimuli, within each individual array cell between two or more resistive states. For example, each resistive state within a resistive change element cell can correspond to a data value which can be programmed and read back by supporting circuitry within the device or array.

For example, a resistive change element might be arranged to switch between two resistive states: a high resistive state (which might correspond to a logic "0") and a low resistive state (which might correspond to a logic "1"). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store three bits of data. Or a resistive change element might be arranged to switch between $2^n$ resistive states, so as to store n bits of data.

In some cases, a resistive change element may exhibit a higher error rate when attempting to place it into one of its resistive states compared to other resistive states. This error bias can be substantially large. For example, two-state resistive change element with states SET and RESET may show an error distribution of 80% RESET and 20% SET, wherein RESET errors occur four times as often as SET errors. In such circumstances, it is possible to design an error correction method which takes advantage of this error bias to significantly reduce the reliance on traditional error correction methods.

As arrays of resistive change elements are increasingly used to create flash memories, solid state drives (SSDs), and the like in the current state of the art, there is a growing need for improved error detection and correction algorithms specifically designed for resistive change memory arrays to reduce parity overhead and latency. To this end, the present disclosure provides such improved error correction methods.

SUMMARY OF THE INVENTION

The present disclosure relates to error correction methods for arrays of resistive change elements and, more specifically, to such error correction methods that provide reduced parity overhead and latency while still maintaining a required correctable bit error rate (BER).

In particular, the present disclosure provides a method for error correction within a resistive change element array. The method comprises first dividing the array into a plurality of subsections, each subsection comprising one flag cell and a plurality of data cells. Each of the data cells is comprised of a resistive change element capable of being adjusted between two non-volatile resistive states. The method next comprises receiving a set of input data to be programmed into the array. The method then comprises initializing all of the data cells within each subsection to an initial condition and all of the flag cells to a deactivated state. The method then comprises activating the flag cell within any of the subsections in which a data cell failed to initialize and is due to be programmed into a state matching the initial condition according to the set of input data.

The method next comprises programming each subsection with an inactivated flag cell according to the input data and each subsection with an activated flag cell according to the logical inverse of the input data to realize a set of programmed data for each subsection. The method next comprises accessing the programmed data during a read operation to realize a set of output data for each subsection. Finally, the method comprises inverting said output data for each subsection with an activated flag cell, wherein the step of inverting according to the flag cells provides a first error correction operation.

According to one aspect of the present disclosure the method further comprises encoding the input data according to a second error correction operation prior to the programming step and decoding the output data according to this second error correction operation subsequent to the accessing step.

According to another aspect of the present disclosure the second error correction operation is Bose-Chaudhuri-Hocquenghem (BCH) error correction algorithm.

According another aspect of the present disclosure the combined parity overhead from the first error correction operation and the second error correction operation is less than the parity overhead of the second error correction operation used alone for an equivalent correctable bit error rate (BER).

According another aspect of the present disclosure the combined decoding latency for the first error correction operation and the second error correction operation is less than the decoding latency of the second error correction operation used alone for an equivalent correctable bit error rate (BER).

According another aspect of the present disclosure the first error correction operation corrects initialization errors and the second error correction operation corrects programming errors.

According another aspect of the present disclosure the total number of errors does not change no matter which error correction scheme is used. The initialization error will be found as programming error by using conventional error correction scheme, BCH along.

According to another aspect of the present disclosure the initial condition for a resistive change element array is a RESET state and the first error correction operation is capable of correcting RESET errors.

According to another aspect of the present disclosure the initial condition for a resistive change element array is a SET state and the first error correction operation is capable of correcting SET errors.

According to another aspect of the present disclosure the first error correction operation is capable of correcting at least one initialization error per subsection within the resistive change element array.

According to another aspect of the present disclosure the first error correction operation and the second error correction operation provide a preselected correctable bit error rate (BER).

According to another aspect of the present disclosure the preselected bit error correction rate is on the order of 0.1%.

According to another aspect of the present disclosure the preselected bit error correction rate is on the order of 0.2%.

According to another aspect of the present disclosure the resistive change elements are two-terminal nanotube switching elements comprising a nanotube fabric.

According to another aspect of the present disclosure the resistive change elements are metal oxide memory elements.

According to another aspect of the present disclosure the resistive change elements are phase change memory elements.

According to another aspect of the present disclosure the resistive change element array is a memory array.

Other features and advantages of the present disclosure will become apparent from the following description of the invention, which is provided below in relation to the accompanying drawings.

BRIEF DESCRIPTION OF THE DRAWINGS

FIG. 3 is table detailing READ and programming voltages required for adjusting or inspecting CELL00 of the array architecture illustrated in FIG. 2.

FIG. 8C is a table detailing the parity overhead for different correctable bit error rate (BER) for the exemplary 8-kilobyte resistive element array of FIG. 8A (using conventional BCH error correction alone).

FIG. 9C is a table detailing the parity overhead for different correctable bit error rate (BER) for the exemplary resistive element array of FIG. 9A (using the RFEC method of the present disclosure).

FIG. 13A is a table detailing parity overhead for different subsection size configurations on an exemplary array with 8-kilobyte data using the reverse flag error correction (RFEC) method of the present disclosure to obtain a correctable bit error rate (BER) of 0.2%.

FIG. 13C is a table detailing parity overhead for different subsection size configurations on an exemplary array with 8-kilobyte data using the RFEC method of the present disclosure to obtain a correctable bit error rate (BER) of 0.3%.

FIG. 14A is a table detailing parity overhead for different subsection size configurations on an exemplary array with 8-kilobyte data using the dual reverse flag error correction (DRFEC) method of the present disclosure to obtain a correctable bit error rate (BER) of 0.2%.

FIG. 14C is a table detailing parity overhead for different subsection size configurations on an exemplary array with 8-kilobyte data using the DRFEC method of the present disclosure to obtain a correctable bit error rate (BER) of 0.3%.

FIG. 15A is a table detailing parity overhead for different subsection size configurations on an exemplary array with 8-kilobyte data using the advanced bit flip (ABF) method of the present disclosure to obtain a correctable bit error rate (BER) of 0.2%.

FIG. 15C is a table detailing parity overhead for different subsection size configurations on an exemplary array with 8-kilobyte data using the ABF method of the present disclosure to obtain a correctable bit error rate (BER) of 0.3%.

FIG. 21B is a diagram showing all 24 possible encoding patterns for a 2-bit subset for use with the 2-bit ABF methods of the present disclosure.

FIG. 25B is a table comparing the parity overhead necessary to achieve a 0.2% correctable BER for each of the DFEC methods of the present disclosure.

FIG. 25C is a table showing the optimal subsection configuration and the corresponding parity overhead for each of the DFEC methods of the present disclosure for five correctable BERs.

DETAILED DESCRIPTION

Figure 1A:
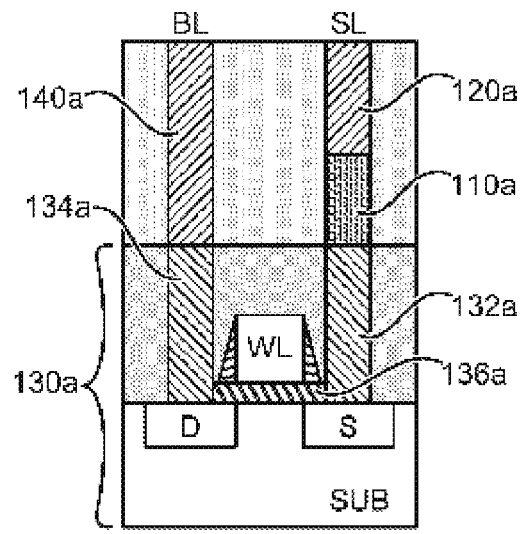
FIG. 1A illustrates an exemplary layout of a vertically oriented resistive change cell.

The present disclosure relates to error correction methods for resistive change element arrays. More specifically, the present disclosure teaches distributed flag error correction (DFEC) methods for resistive change element arrays that provide reduced parity overhead and reduced latency as compared with traditional error correction methods. Within certain applications the error correction methods of the present disclosure are used in concert with conventional error correction techniques to reduce the number of parity bits required for a desired correctable bit error rate (BER).

According to the error correction methods of the present disclosure, a block of resistive change elements within an array is divided into a number of subsections by distributing flag cells across the memory block. The parity overhead added by the distributed flags may be calculated by dividing the number of flag cells by the number of data cells remaining in the subsection (e.g., 1/512 or 0.2% for a 512-bit subsection with one flag bit). At the start of a write operation, the entire subsection is put into an initial state (either a SET or a RESET state, as befits the needs of a specific application). Each subsection is then checked to determine if any cells failed to initialize into the required state. If any errors are found within the subsection, the error pattern (that is, the number and position of errors in the subsection) is then compared to the input data (that is, the data to be written to the subsection) in a data pattern matching (DPM) step. If the input data for an error cell is the opposite of the selected initialization state, then the error cell is already in the desired programming state and there is effectively no error. If the input data does not match the current logical state of the error cell, however, one or more of the subsection flags are activated to indicate the appropriate encoding pattern to apply to the input data in order to correct the error(s) according to a pattern reference code (PRC).

The input data for the subsection is then encoded according to the encoding pattern indicated by the pattern reference code (PRC) stored in the flag bits. If the pattern reference code (PRC) indicates there are no effective errors, the input data may remain unchanged. Otherwise the input data is selectively inverted to match the error pattern of the subsection such that the error cells are now in the desired programming state and are no longer effectively an error. Next, the DFEC encoded input data, along with the flag bits activated with the corresponding pattern reference code (PRC), is processed with a conventional error correction method (such as, but not limited to, a Bose-Chaudhuri-Hocquenghem (BCH) error correction algorithm) and then programmed into the subsection. Since the entire subsection has already been initialized to either a SET or a RESET state (aside from any error cells), only those data cells that require values opposite the initialized state (that is, a logic "1" if the subsection was initialized into a RESET state, or a logic "0" if the subsection was initialized into a SET state) need to be programmed.

After the input data is written, it can be read out and decoded using the conventional error correction method to correct any remaining errors, including write errors, data retention errors, and any initialization errors which were not corrected by the DFEC methods. If a flag cell is in an activated state, however, the read data may differ from the input data as it has been further encoded according to a DFEC encoding pattern. A reverse data pattern matching (RDPM) step is then performed, wherein the encoding pattern indicated by PRC stored in the flag bits is reversed to decode the read data and thereby recover the original input data. In this way, the initialization and programming errors in a memory array may be corrected by combining the DFEC methods with a secondary error correction method.

The present disclosure provides three examples of DFEC methods using different numbers of flag bits per subsection which are distributed across a memory block. The number of flag bits used to delimitate a subsection determines the number of error patterns which may be matched to the input data in a data pattern matching (DPM) step. Thus, a single flag may match the input data according to two patterns (inverted and not inverted), two flag bits may match the input data according to four patterns, three flag bits may match the input data according to eight patterns, and N flag bits may match the input data according to $2^N$ patterns. Increasing the number of distributed flag bits may allow the correction of a larger number of errors by employing more complex patterns, thereby reducing the number of parity bits required for a second error correction algorithm while also increasing the DFEC overhead. Further, each method may be ideally suited to correct certain types and patterns of errors, and may introduce differing amounts of latency. The DFEC method employed, and the specific configuration thereof, may therefore be chosen according to the requirements of a specific application, as will be discussed in depth below.

In a first DFEC method, referred to as RFEC (reverse flag error correction) or single-flag DFEC, a single flag bit per subsection is used to indicate that at least one data cell in the subsection is in an incorrect state following initialization (that is, for instance, a cell in a logic "1" state which is due to be programmed to a logic "0"). As will be described in more detail with respect to FIGS. 9A-C, 10, and 11A-E, if at least one effective initialization error is detected during a data pattern matching (DPM) step following initialization of the subsection, the flag bit is activated in order to invert the input data before it is written to the array. Thus, for example, an error cell which was originally intended to be written as a logic "0" would now be written as a logic "1", and the error is effectively corrected. Once the subsection is read, a reverse data pattern matching (RDPM) step detects whether the flag bit is activated. If so, the read data is inverted again to recover the input data.

Similarly, a second DFEC method uses two flag bits per subsection, referred to as dual reverse flag error correction (DRFEC) or dual-flag DFEC. In this case, one flag bit indicates an effective initialization error in the even bits within the subsection while the other indicates an effective initialization error in the odd bits. As will be described in more detail with respect to FIGS. 16A-C, 17, and 18A-E, following initialization of the subsection, a DPM step activates one or both of the flags if an effective initialization error is detected in their respective data cells. Thus, if an effective initialization error is detected in at least one even data cell the even flag bit is activated, and if at least one initialization error is detected in an odd data cell the odd flag bit is activated. Following this DPM step, the input data is encoded by inverting all of the bits corresponding to the activated flags. Thus, if the even flag bit is activated all of the even bits in the input data are inverted, and if the odd flag bit is activated all of the odd bits in the input data are inverted. The encoded input data is then written to the array. Following a read operation, a RDPM step is performed to detect the PRC indicated by the flag bits. The bits in the read data corresponding to an activated flag are then inverted again to recover the input data.

A third DFEC method, referred to as advanced bit flip (ABF) DFEC, uses the flag bits in each subsection to store a pattern reference code (PRC) which refers to an encoding pattern. In this method, all of the data bits within the array are divided into data subsets (that is, groups of two or more data bits grouped together) during the data pattern matching (DPM) and reverse DPM (RDPM) steps. If one or multiple effective initialization errors are detected within the subsection, a DPM step is initiated which matches the input data to the array subsets containing at least one error to select an encoding pattern from a set of reversible encoding patterns. Each encoding pattern provides a way to translate any given logical pattern of bits within each data subset (10, 01, 00, 11, for instance) into an encoded pattern (11 is encoded as 00, or 10 is encoded as 11, for example), so as to correct initialization errors in the subsection. The pattern reference code (PRC) corresponding to the matched encoding pattern is then stored in the flag bits, and the data subsets within the input data are encoded using the matched encoding pattern before being written to the subsection. In order to recover the input data, a RDPM step is initiated during the read operation in which the encoding pattern is reversed to recover the input data. In this way, the DFEC methods of the present disclosure allow the correction of one or multiple initialization errors in a memory array.

As will be explained in detail below, the distributed flag error correction (DFEC) methods of the present disclosure only correct initialization errors (either SET or RESET, whichever was selected for the initialization state). As such, another error correction method—such as, but not limited to, a Bose-Chaudhuri-Hocquenghem (BCH) error correction algorithm—is employed to correct the opposite type of error (programming errors), and the remaining initialization errors that DFEC failed to correct. That is, if all cells are initialized to a RESET condition, the DFEC methods of the present disclosure would correct RESET errors and a second error correction algorithm (such as, but not limited to, a BCH error correction algorithm) would be employed to correct SET errors, and remaining RESET errors. However, since the DFEC methods of the present disclosure require a very small parity overhead, and can be used to correct a percentage of the total expected errors, the required correctable bit error rate (BER) of this second error correction algorithm is reduced and fewer total parity bits are required. This results in an overall reduction in parity overhead, as detailed in FIGS. 16A-16C, particularly since resistive change element arrays typically exhibit a higher rate of initialization errors than programming errors, as discussed in more detail with respect to FIGS. 7A-7C below.

Resistive Change Element Arrays

Resistive change cells store information through the use of a resistive change element within the cell. Responsive to electrical stimuli, a resistive change element can be adjusted between at least two non-volatile resistive states. Typically, two resistive states are used: a low resistive state (corresponding, typically, to a logic '1,' a SET state) and a high resistive state (corresponding, typically, to a logic '0,' a RESET state). In this way, the resistance value of the resistive change element within the resistive change element cell can be used to a store a bit of information (functioning, for example, as a 1-bit memory element). According to other aspects of the present disclosure, more than two resistive states may be used, allowing a single cell to store more than one bit of information. For example, a resistive change memory cell might adjust its resistive change element between four non-volatile resistive states, allowing for the storage of two bits of information in a single cell.

Within the present disclosure the term "programming" is used to describe an operation wherein a resistive change element is adjusted from an initial resistive state to a new desired resistive state. Such programming operations can include a SET operation, wherein a resistive change element is adjusted from a relatively high resistive RESET state (e.g., on the order of 1 MΩ) to a relatively low resistive SET state (e.g., on the order of 100 kΩ). Such programming operations (as defined by the present disclosure) can also include a RESET operation, wherein a resistive change element is adjusted from a relatively low resistive SET state (e.g., on the order of 100 kΩ) to a relatively high resistive RESET state (e.g., on the order of 1 MΩ). Additionally, a "READ" operation, as defined by the present disclosure, is used to describe an operation wherein the resistive state of a resistive change element is determined without significantly altering the stored resistive state. Within certain embodiments of the present disclosure these resistive states (that is, both the initial resistive states and the new desired resistive states) are non-volatile. It should also be noted that the terms program and write are used interchangeably throughout the present disclosure.

Though the present disclosure uses resistive change memory cells as an example, the present disclosure is not limited to memory. Indeed, the methods of the present disclosure could be used to adjust the resistance of resistive change elements within logic devices, analog circuitry, sensors, and the like.

Resistive change elements include, but are not limited to, two-terminal nanotube switching elements, phase change memory cells, and metal oxide memory cells. For example, U.S. Pat. Nos. 7,781,862 and 8,013,363 teach non-volatile two-terminal nanotube switches comprising nanotube fabric layers. As described in those patents, responsive to electrical stimuli a nanotube fabric layer can be adjusted or switched among a plurality of non-volatile resistive states, and these non-volatile resistive states can be used to reference informational (logic) states. In this way, resistive change elements (and arrays thereof) are well suited for use as non-volatile memory devices for storing digital data (storing logic values as resistive states) within electronic devices (such as, but not limited to, cell phones, digital cameras, solid state hard drives, and computers). However, the use of resistive change elements is not limited to memory applications. Indeed, arrays of resistive change elements as well as the advanced architectures taught by the present disclosure could also be used within logic devices or within analog circuitry.

FIG. 1A illustrates the layout of an exemplary resistive change cell that includes a vertically oriented resistive change element (such a structure is sometimes termed a 3D cell by those skilled in the art). A typical field effect transistor (FET) device 130a is formed within a first device layer, including a drain D, a source S, and a gate structure 136a. The structure and fabrication of such an FET device 130a will be well known to those skilled in the art.

A resistive change element 110a is formed in a second device layer. Conductive structure 132a electrically couples a first end of resistive change element 110a with the source terminal of FET device 130a. Conductive structure 120a electrically couples a second end of resistive change element 110 with an array source line SL outside the resistive change cell. Conductive structures 134a and 140a electrically couple the drain terminal of FET device 130a with an array bit line BL outside the resistive change cell. An array word line WL is electrically coupled to gate structure 136a.

Figure 1B:
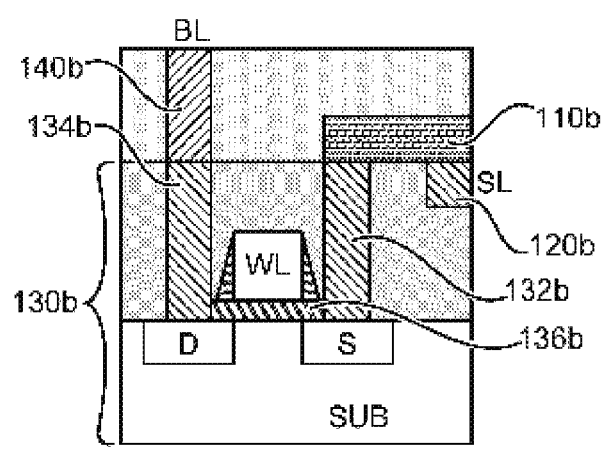
FIG. 1B illustrates an exemplary layout of a horizontally oriented resistive change cell.

FIG. 1B illustrates the layout of an exemplary resistive change cell that includes a horizontally oriented resistive change element (such a structure is sometimes termed a 2D memory cell by those skilled in the art). A typical FET device 130b is formed within a first device layer, including a drain D, a source S, and a gate structure 136b. As with the FET device (130a) depicted in FIG. 1A, the structure and fabrication of such an FET device 130b will be well known to those skilled in the art.

A resistive change element 110b is formed in a second device layer. Conductive structure 132b electrically couples a first end of resistive change element 110b with the source terminal of FET device 130b. Conductive structure 120b electrically couples a second end of resistive change element 110b with an array source line SL outside the memory cell. Conductive structures 134b and 140b electrically couple the drain terminal of FET device 130b with an array bit line BL outside the memory cell. An array word line WL is electrically coupled to gate structure 136b.

Within both of the resistive change cells depicted in FIGS. 1A and 1B, the resistive change element is adjusted between different resistive states by applying electrical stimulus, typically one or more programming pulses of specific voltages and pulse widths, between the bit line (BL) and the source line (SL). A voltage is applied to the gate structure (136a in FIG. 1A and 136b in FIG. 1B) through the word line (WL), which enables electrical current to flow through the series combination of the FET device (130a in FIG. 1A and 130b in FIG. 1B) and the resistive change element (110a in FIG. 1A and 110b in FIG. 1B). Depending on the gate voltage applied by the word line (WL), current to the resistive change element (110*a* in FIG. 1A and 110*b* in FIG. 1B) may be limited by design, thereby enabling the FET device to behave as a current limiting device. By controlling the magnitude and the duration of this electrical current, the resistive change element (110*a* in FIG. 1A and 110*b* in FIG. 1B) can be adjusted between a plurality of resistive states.

The state of the resistive change element cells depicted in FIGS. 1A and 1B can be determined, for example, by applying a DC test voltage, for example, but not limited to, 0.5V, between the source line (SL) and the bit line (BL) while applying a voltage to gate structure (136*a* in FIG. 1A and 136*b* in FIG. 1B) sufficient to turn on the FET device (130*a* in FIG. 1A and 130*b* in FIG. 1B) and measuring the current through the resistive change element (110*a* in FIG. 1A and 110*b* in FIG. 1B). In some applications this current can be measured using a power supply with a current feedback output, for example, a programmable power supply or a sense amplifier. In other applications this current can be measured by inserting a current measuring device in series with the resistive change element (110*a* in FIG. 1A and 110*b* in FIG. 1B).

Alternatively, the state of the resistive change element cells depicted in FIGS. 1A and 1B can also be determined, for example, by driving a fixed DC current, for example, but not limited to, 1 μA, through the series combination of the FET device (130*a* in FIG. 1A and 130*b* in FIG. 1B) and the resistive change element (110*a* in FIG. 1A and 110*b* in FIG. 1B) while applying a voltage to the gate (136*a* in FIG. 1A and 136*b* in FIG. 1B) sufficient to turn on the FET device (130*a* in FIG. 1A and 130*b* in FIG. 1B) and measuring the voltage across the resistive change element (110*a* in FIG. 1A and 110*b* in FIG. 1B).

The resistive change element (such as, but not limited to, those depicted in FIGS. 1A and 1B) can be formed from a plurality of materials, such as, but not limited to, metal oxide, solid electrolyte, phase change material such as a chalcogenide glass, graphene fabrics, and carbon nanotube fabrics.

For example, U.S. Pat. No. 7,781,862 to Bertin et al., incorporated herein by reference in its entirety, discloses a two-terminal nanotube switching device comprising a first and second conductive terminals and a nanotube fabric article. Bertin teaches methods for adjusting the resistivity of the nanotube fabric article between a plurality of non-volatile resistive states. In at least one embodiment, electrical stimulus is applied to at least one of the first and second conductive elements such as to pass an electric current through said nanotube fabric layer. By carefully controlling this electrical stimulus within a certain set of predetermined parameters (as described by Bertin in U.S. patent application Ser. No. 11/280,786) the resistivity of the nanotube article can be repeatedly switched between a relatively high resistive state and relatively low resistive state. In certain embodiments, these high and low resistive states can be used to store a bit of information.

As described by the incorporated references, a nanotube fabric as referred to herein for the present disclosure comprises a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity maybe found on a larger scale, with regions of ordered nanotubes, in some cases, extended over substantially the entire fabric layer. Such larger scale positional regularity is of particular interest to the present disclosure. Nanotube fabrics are described in more detail in U.S. Pat. No. 6,706,402, which is included by reference in its entirety.

While some examples of resistive change cells and elements within the present disclosure specifically reference carbon nanotube based resistive change cells and elements, the methods of the present disclosure are not limited in this regard. Indeed, it will be clear to those skilled in the art that the methods of the present disclosure are applicable to any type of resistive change cell or element (such as, but not limited to, phase change and metal oxide).

Figure 2:
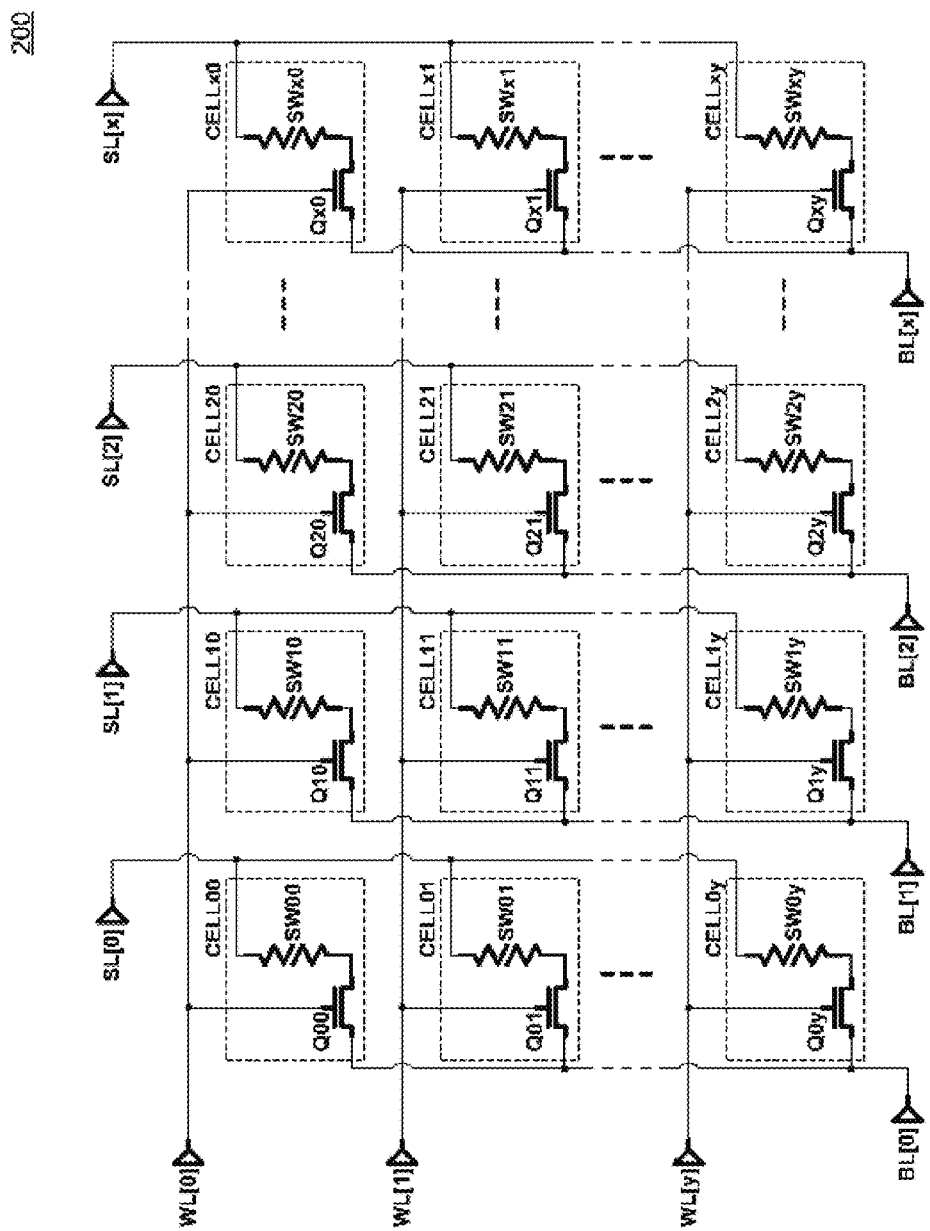
FIG. 2 is a simplified schematic illustrating an exemplary architecture for an array of resistive change elements wherein FET selection devices are used within the cells of the array.

Referring now to FIG. 2, an exemplary architecture for a resistive change element memory array 200 is illustrated in a schematic diagram. The array 200 comprises a plurality of cells (CELL00-CELLxy), each cell including a resistive change element (SW00-SWxy) and a selection device (Q00-Qxy). The individual array cells (CELL00-CELLxy) within resistive change array 200 are selected for reading and programming operations using arrays of source lines (SL[0]-SL[x]), word lines (WL[0]-WL[y]), and bit lines (BL[0]-BL[x]) as will be described below.

Within the exemplary architecture of FIG. 2, the selection devices (Q00-Qxy) used with the individual array cells (CELL00-CELLxy) are conventional silicon based FETs. However, such arrays are not limited in this regard. Indeed, other circuit elements (such as, but not limited to, diodes or relays) could be used within similar architecture structures to provide cell selection functionality within an array (for example, selection devices such as bipolar devices, and FET devices such as SiGe FETs, FinFETs, and FD-SOI).

FIG. 3 is a table 300 describing exemplary programming and READ operations for the resistive change element array 200 shown in FIG. 2. The table lists the word line, bit line, and source line conditions required to perform a RESET operation, a SET operation, and a READ operation on CELL00 of resistive change element array 200. These operations as well as the function of the resistive change element array 200 depicted in FIG. 2 within these operations will be described in detail below.

The first column of the table within FIG. 3 describes a RESET operation of CELL00—that is, a programming operation which adjusts the resistive state of resistive change element SW00 from a relatively low resistive state to a relatively high resistive state. WL[0] is driven to $V_{PP}$, the logic level voltage required to enable select device Q00, while the remaining word lines WL[1:y] are driven to 0V (essentially grounded). In this way, only the select devices in the first row of the array, Q00-Qx0, are enabled (or, "turned on"). BL[0] is driven to VRST (the programming voltage level required to RESET element SW00), and SL[0] is driven to 0V. The remaining bit lines, BL[1:xi], and the remaining source lines, SL[1:x], are held in high impedance states. In this way VRST is driven across only the cells in the first column of the array, CELL00-CELL0y, while $V_{PP}$ is applied across only WL[0], enabling the first row of the array, CELL00-CELLx0. As a result of these conditions, the programming voltage VRST is driven only across SW00 to adjust its resistive state. The other select devices within the array remain isolated from the programming voltage and thus retain their originally programmed resistive state.

The second column of the table within FIG. 3 describes a SET operation of CELL00—that is, a programming operation which adjusts the resistive state of resistive change element SW00 from a relatively high resistive state to a relatively low resistive state. As with the RESET operation, WL[0] is driven to $V_{PP}$, while the remaining word lines, WL[1:y], are driven to 0V (essentially grounded). In this way, only the select devices in the first row of the array, Q00-Qx0 are enabled (or "turned on"). SL[0] is driven to $V_{SET}$, the programming voltage level required to drive SW00 into a relatively low resistive state, and BL[0] is driven to 0V. The remaining source lines, SL[1:x], and the remaining bit lines, BLit:xi, are held in high impedance states. In this way, $V_{SET}$ is driven across only the cells in the first column of the array, CELL00-CELL0y, and $V_{PP}$ is driven across only WL[0], enabling the first row of the array, CELL00-CELLx0. As a result of these conditions, the programming voltage $V_{SET}$ is driven only across SW00 through enabled selection device Q00, changing its resistive state to one of low impedance. The other select devices within the array remain isolated from the programming voltage and thus retain their originally programmed resistive state.

Finally, the third column of the table within FIG. 3 describes a READ operation of CELL00, that is, an operation which determines the resistive state of resistive change element SW00. As with the SET and RESET operations, WL[0] is driven to $V_{PP}$, the programming voltage required to enable select device Q00, while the remaining word lines WL[1:y] are held at low voltage (approximately 0V in this example) so that only the select devices in the first row of the array Q00-Qx0 are enabled (or "turned on"). SL[0] is driven to $V_{RD}$, the voltage level required to READ the resistive state of SW00, and BL[0] is driven to 0V (essentially grounded). The remaining source lines SL[1:x] and the remaining bit lines BL[1:x] are held in high impedance states. In this way, $V_{RD}$ is driven across only the cells in the first column of the array, CELL00-CELL0y, and $V_{PP}$ is driven across only WL[0], enabling the first row of the array, CELL00-CELLx0. As a result of these conditions, the READ voltage $V_{RD}$, is driven only across SW00, while the other select devices within the array remain isolated from the READ voltage. In this way, current will flow only through resistive change element SW00, and by measuring that current, the resistive state of SW00 can be determined.

It should be noted that the programming voltages for the RESET and SET operations ($V_{RST}$ and $V_{SET}$, respectively) as described in the preceding paragraphs were applied in opposite polarities. However, the methods of the present disclosure are not limited in this regard. Indeed, the differing polarity of the RESET and SET operations were used in order to better illustrate the functionality of the array depicted in FIG. 2. That is to say, programming (SET and RESET) voltage and READ voltages can be driven in either polarity (that is, positive voltage on the source line or positive voltage on the bit line) dependent upon the needs of the specific type of resistive change element used or the specific programming operation in question. Also, within FIG. 3 the voltage level required to enable the select devices is listed as system voltage $V_{PP}$ for ease of explanation. However, it should be noted that such a voltage can be, in certain applications, less than a supply rail or other system level voltage depending on the type and requirements of a specific select device and the needs of a given application. As such, the use of $V_{PP}$ within table 300 is intended as a non-limiting example only.

Figure 4:
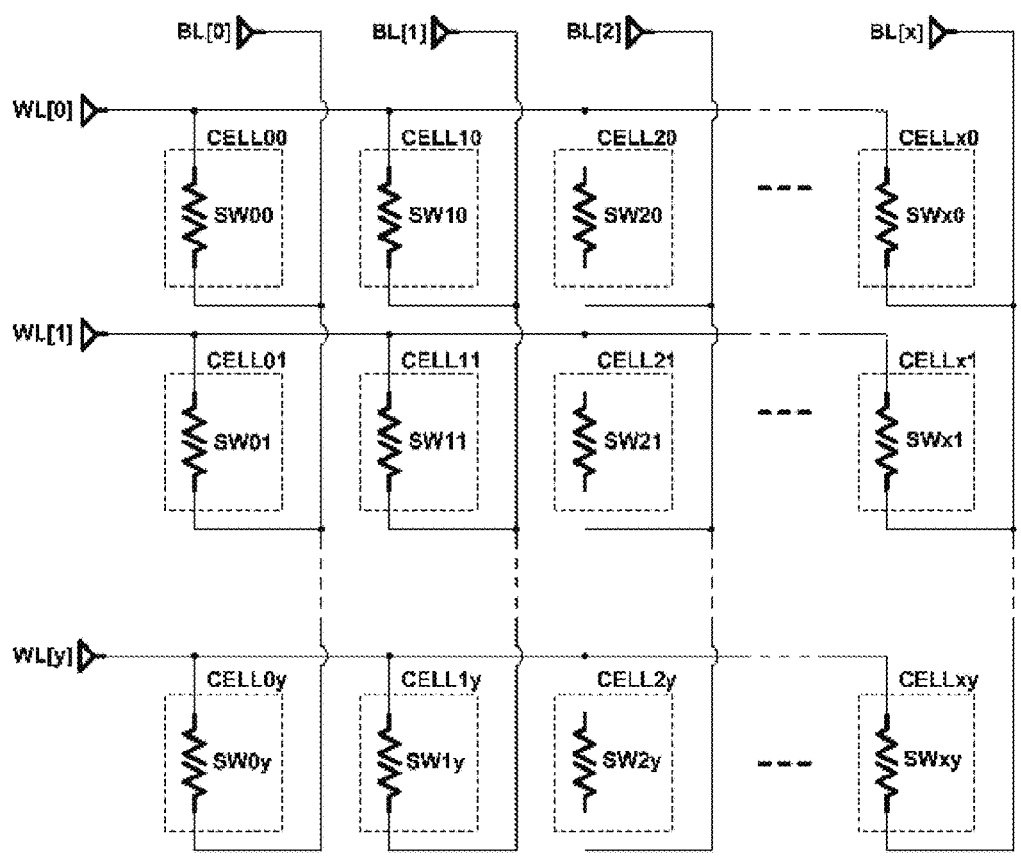
FIG. 4 is a simplified schematic illustrating an exemplary architecture for an array of resistive change elements wherein no selection devices or other current limiting circuitry are used within the cells of the array.

Referring now to FIG. 4, a second exemplary architecture for a resistive change element array 400 is illustrated in a simplified schematic diagram. Within the exemplary architecture 400, no selection devices or other current limiting elements are used within the resistive change element cells. That is, each cell is comprised only of a resistive change element that is accessed via two control lines (a word line and a bit line). Such an architecture is sometimes referred to as a 1-R array by those skilled in the art.

As with the array architecture 200 detailed in FIG. 2, the array architecture 400 of FIG. 4 can address individual resistive change cells within the array by driving the word lines and bit lines with a specific bias. In the absence of any selection devices within the individual array cells (CELL00-CELLxy), an access operation to array architecture 400 must provide a sufficient electrical stimulus—as required for a programming (SET or RESET) or READ operation—to a selected array cell and, at the same time, prevent the other cells in the array from experiencing any electrical stimuli that would alter their stored resistive state. Methods and circuits for programming and accessing cells within 1-R array architectures (as depicted in FIG. 4) are disclosed in U.S. Pat. Nos. 9,263,126 and 9,299,430, both of which are incorporated herein by reference in their entireties.

For example, to access CELL00 within array architecture 400 of FIG. 4, a sufficient READ, SET, or RESET voltage (or current) is applied to WL[0] while BL[0] is driven to ground (0V). The remaining word lines (WL[1]-WL[y]) and the remaining bit lines (BL[1]-BL[x]) are driven at half the voltage (or current) supplied to WL[0]. In this way, only half of an applied programming or READ voltage (or current) is applied to the resistive change elements within the remaining cells on the selected bit line (BL[0])—that is, CELL01-CELL0y—and within the remaining cells on the selected word line (WL[0])—that is, CELL10-CELLx0. That is, CELL01-CELL0y each see half of the applied programming or READ voltage on their associated word line and 0V on their associated bit lines, and CELL10-CELLx0 see the full programming or READ voltage on their associated word lines but only half the programming or READ voltage on their associated bit line. The remaining cells in the array—that is, CELL11-CELLxy—are unbiased, each of those cells seeing half of the applied programming or READ voltage (or current) on both its associated word line and on its associated bit line, resulting in no voltage drop or current flow across/through the resistive change elements in those cells. In this way, the applied programming or READ voltage is applied only over the selected resistive change element SW00, and while some of the unselected cells within the array are partially biased during the access and addressing operation, the electrical stimuli applied to those cells is not sufficient to alter the resistive state of those cells or disturb the programming or READ operation being performed on the selected cell.

Figure 5:
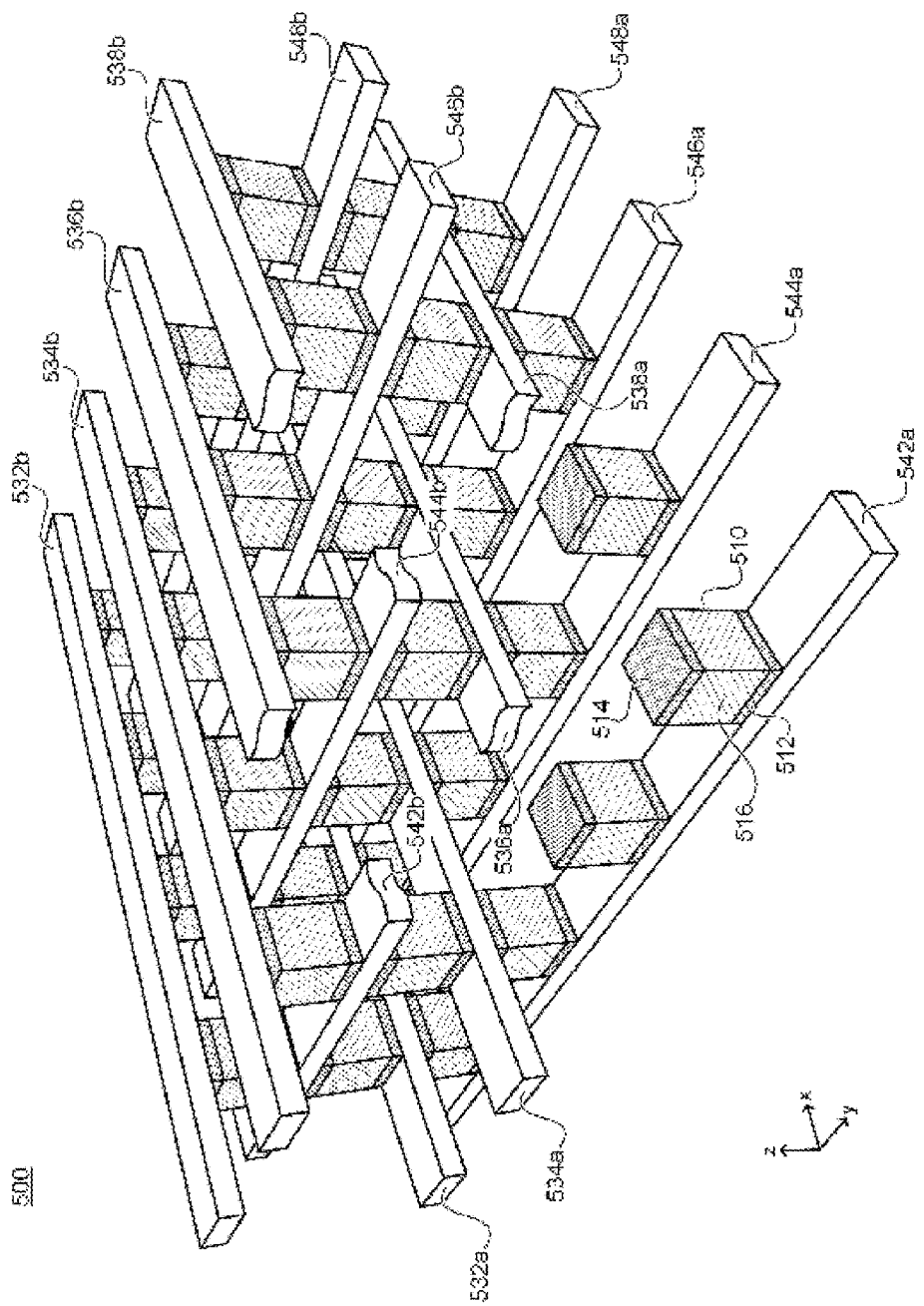
FIG. 5 is a perspective drawing illustrating the layout of a 3D array of 1-R resistive change element cells

FIG. 5 is a perspective drawing of a 3D 1-R resistive change element array 500. Resistive change element array 500 is comprised of 1-R resistive change cells arranged in three dimensions (along the x-, y-, and z-axes). A first layer of bit lines (542a, 544a, 546a, and 548a) are disposed along the y-axis, and a first layer of word lines (532a, 534a, 536a, and 538a) are disposed along the x-axis and above this first layer of bit lines. Between these first two layers of bit lines (542a, 544a, 546a, and 548a) and words lines (532a, 534a, 536a, and 538a), a first layer of resistive change elements 510 is disposed, one resistive change element at each word line and bit line crossing. The resistive change elements are each comprised of a resistive change material 516 (such as, but not limited to, a nanotube fabric layer or a block of phase change material) disposed between a first conductive element 512 and a second conductive element 514. It is desirable, in certain applications, to use these first and second conductive elements (512 and 514, respectively) to provide a conductive path between an array line (a word or bit line) and the actual resistive change material 516. However, these conductive elements (512 and 514) are not required in every application. For example, depending on the material used for the array lines, the particular material selected for the resistive change element 516, and the layout and fabrication methods being used, in certain applications it could be more favorable for the resistive change material block to connect directly to the array lines themselves. As such, the inclusion of first and second conductive elements (512 and 514, respectively) should not be seen as limiting with respect to the architecture of 1-R resistive change element arrays.

A second layer of bit lines (542b, 544b, 546b, and 548b) is disposed along the y-axis above the first layer of word lines. Between this second layer of bit lines (542b, 544b, 546b, and 548b) and the first layer of words lines (532a, 534a, 536a, and 538a), a second layer of resistive change elements 510 is disposed, one resistive change element at each word line and bit line crossing. A second layer of word lines (532b, 534b, 536b, and 538b) is disposed along the x-axis above the second layer of bits lines (542b, 544b, 546b, and 548b), and a third layer of resistive change elements 510 is disposed, one resistive change element at each word line and bit line crossing. In this way, an array of forty-eight 1-R resistive change element cells is arranged within essentially the same cross sectional area that would be used for an array of only sixteen array cells within a traditional 2D array structure.

Arrays of non-volatile, reprogrammable resistive change element arrays (such as those detailed in FIGS. 2, 4, and 5) are highly desirable within certain applications, for example in solid state drives (SSDs) or as replacements for silicon based flash memory. As technology increases, resistive change elements are scaling smaller, and more compact, denser arrays of such elements are being developed. As such, an improved error correction method that takes advantage of the programming characteristics of resistive change elements (as described in detail above) to improve error correction latency and reduce parity cell overhead is highly desirable. To this end, the distributed flag error correction (DFEC) methods of the present disclosure is well suited for such applications.

Figure 6:
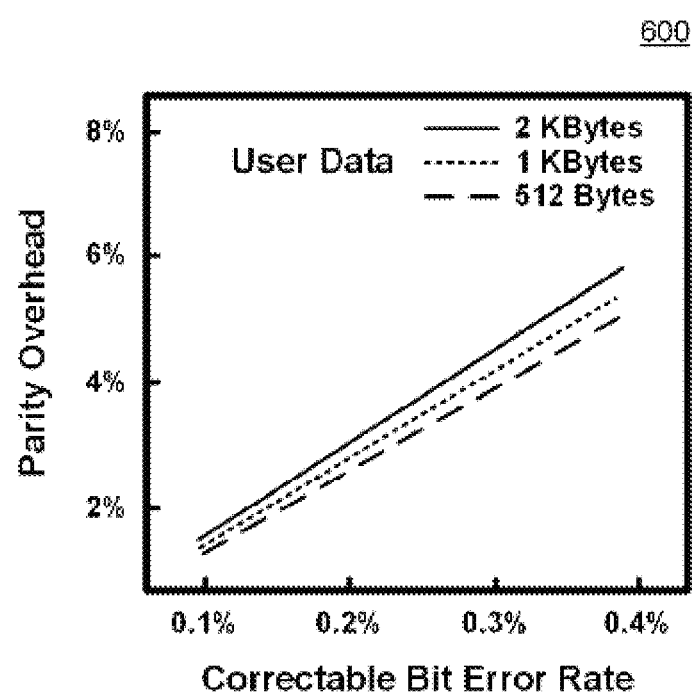
FIG. 6 is a graph plotting parity overhead for memory arrays using conventional Bose-Chaudhuri-Hocquenghem (BCH) error correction algorithms.

FIG. 6 is a graph 600 plotting parity overhead against correctable bit error rate (BER) for three difference sized memory arrays (512 byte, 1 kilobyte, and 2 kilobyte) using a conventional Bose-Chaudhuri-Hocquenghem (BCH) error correction algorithm. BCH codes are well known by those skilled in the art and form a class of cyclic error-correcting codes that are constructed using finite fields. BCH error correction is commonly used in electronics applications (such as, but not limited to, flash memory, solid state drives, and digital media) and is particularly useful as there is a precise control over the number of errors correctable by the code. In particular, it is possible to design binary BCH codes that can correct multiple bit errors. Using a BCH error correction algorithm, the number of parity bits "m" theoretically required to correct one bit error within "n" bits (user data bits plus overhead bits) is given by:

$$n \leq 2^m - 1 \quad \text{(EQ1)}$$

For example, 13 BCH parity bits are required to find a single error in a block with 512 bytes (4096 bits) of user data bits plus overhead bits, since $2^{12}-1=4095<4096$ and $2^{13}-1=8191\geq 4096$. The overhead bits include BCH parity bits for error correction. The number of overhead bits is much less than the number of data bits so that the total number of bits, including 512-bytes of data bits plus overhead bits, is less than 8191. Similarly, it would require 14 BCH parity bits to find a single error in a block containing 1 kilobyte (8192 bits) of data bits plus overhead bits, and 15 BCH parity bits to find a single error in a block containing 2 kilobytes (16,384 bits) of data bits plus overhead bits. In order to realize a 0.1% correctable bit error rate (BER) in a memory block with 512-bytes of data bits (4096 bits), an error correction algorithm would need to be able to correct four bit errors (0.1%*4096≈4), which would require 52 BCH parity bits (4*13=52). Using similar calculations, 112 BCH parity bits are required to realize a 0.1% correctable BER in a block containing 1 kilobyte of data bits plus overhead bits, and 240 BCH parity bits are required to realize a 0.1% correctable BER in a block containing 2 kilobytes of data bits plus overhead bits. The number of BCH parity bits increases for higher correctable BERs. For example, a correctable BER of 0.2% on a block with 512 bytes of user data would require 104 BCH parity bits. According to the present disclosure, the number of parity bits within a block of memory can be used to define the parity overhead, given by the following:

$$\text{Parity Overhead} = \text{Parity Bits/Data Bits} \quad \text{(EQ2)}$$

Using EQ2, it can be seen that using a BCH algorithm to realize a 0.1% correctable BER on a memory block with 512 bytes of data bits and parity bits results in a parity overhead of approximately 1.3% (52 parity bits/(4096 data bits+52 parity overhead bits+other overhead bits)). To realize a 0.2% correctable BER on the same 512 byte memory block results in a parity overhead of 2.5% (104 parity bits/4096 data bits). As shown in FIG. 6, when using a BCH error correction method alone parity overhead increases linearly with increasing correctable BER, approaching 4% parity overhead as correctable BER moves past 0.3% for 512 bytes, 1 kilobyte, and 2 kilobytes of data bits. In certain applications, this increased parity overhead results in increased latency within the decoding process for the error correction algorithm as well as using increasingly more surface area on a chip. To this end, it would be highly desirable to achieve a required correctable BER with a lower parity overhead, providing a resistive change element array with increased storage capacity, faster operating speed, and a more compact surface area.

The above calculation of correctable BER is valid only for one memory block in which a BCH ECC operates. In a memory array with multiple memory blocks, the correctable BER is much less than this calculated number due to variation of error occurrence among different ECC blocks. For example, if a three-block memory array is manufactured such that one memory block has a BER of 0.3% while the other two experience zero error, the averaged correctable BER would be 0.1%. However, since the location of a manufacturing defect cannot be predicted, a parity overhead of 4% must be used on all three memory blocks.

Figure 7A:
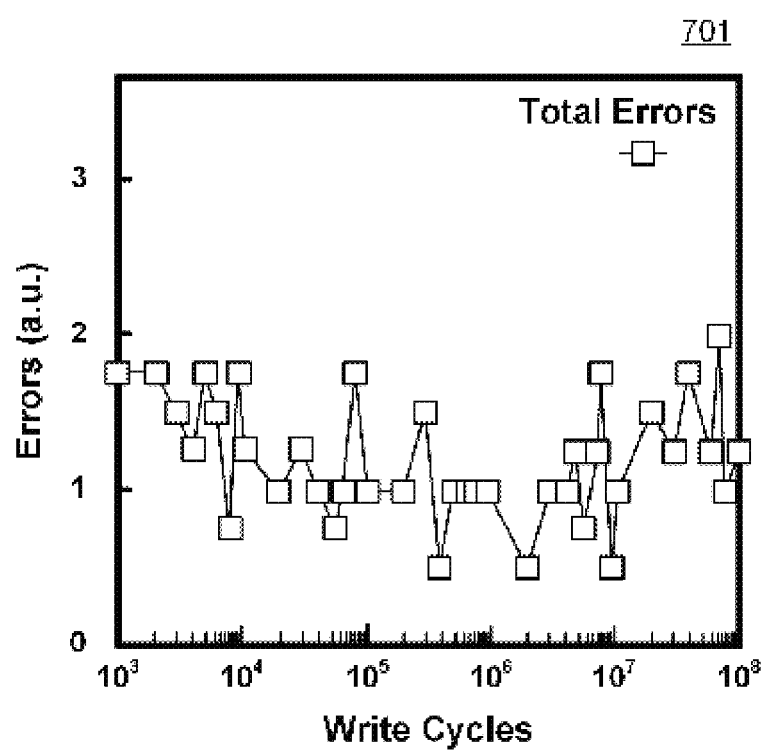
FIG. 7A is a graph plotting the error rates observed from an exemplary resistive change element array (both SET and RESET errors).
Figure 7B:
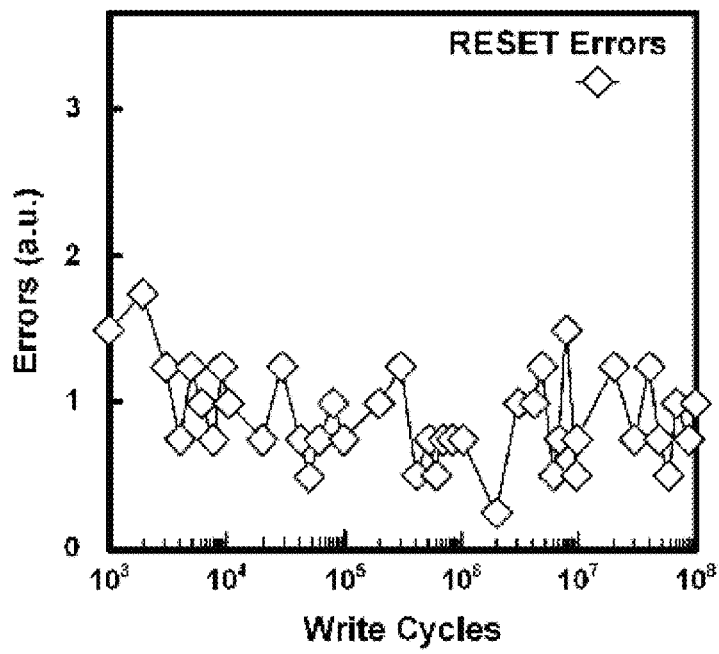
FIG. 7B is a graph plotting breaking out only the RESET errors from the error rates observed from an exemplary resistive change element array (as shown in FIG. 7A).
Figure 7C:
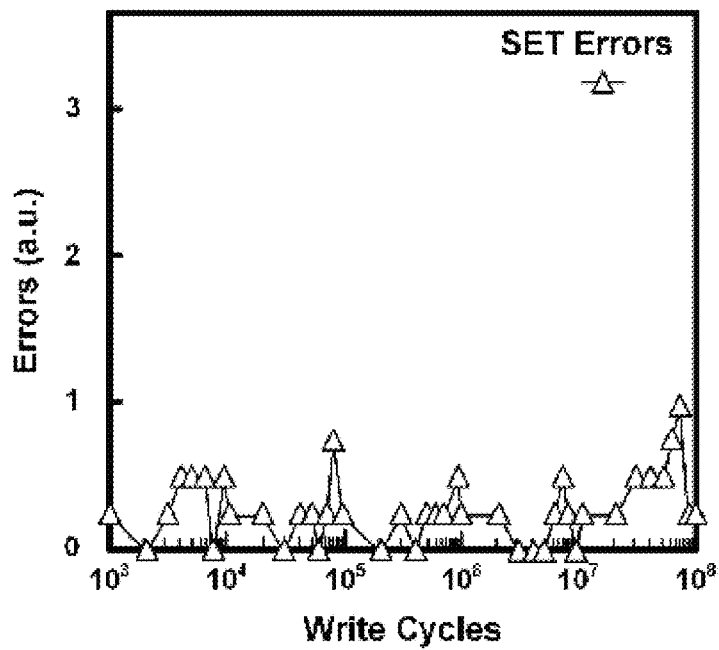
FIG. 7C is a graph plotting breaking out only the SET errors from the error rates observed from an exemplary resistive change element array (as shown in FIG. 7A).

FIG. 7A is a plot 701 characterizing the error rates of an exemplary resistive change element array. The exemplary array used to generate the characterization data in FIG. 7A (as well as FIGS. 7B and 7C, discussed below) was a 256-byte array of non-volatile two-terminal nanotube switches comprising nanotube fabric layers, as are taught in U.S. Pat. Nos. 7,781,862 and 8,013,363 and described in detail with respect to FIGS. 1A and 1B above. The exemplary array was written through $10^8$ write cycles and the total number of errors observed was plotted in FIG. 7A. It should be noted that FIGS. 7A, 7B, and 7C plot the number of errors observed with normalized arbitrary units (a. u.) for ease of explanation. Characterizing a resistive change element array in this way provides a statistical model of the number of errors that can be expected during write operations to the array and the correctable BER required within an error correction method designed for the array. All three plots (701, 702, and 703) use the same a.u. scale for the y-axis so that the relative error rates between plots can be compared.

Looking now to FIGS. 7B and 7C, the errors plotted in FIG. 7A are broken out into plots showing the RESET errors (plot 702 in FIG. 7B) and SET errors (plot 703 in FIG. 7C). As described above, a RESET error, according to the methods of the present disclosure, occurs when a programming operation attempts to adjust a resistive change element into a relatively high resistance RESET state (a logic "0") but the cell remains in a relatively low resistance SET state (a logic "1"). Conversely, a SET error, according to the methods of the present disclosure, occurs when programming operation attempts to adjust a resistive change element into a relatively low resistance SET state (a logic "1") but the cell remains in a relatively high resistance RESET state (a logic "0"). As can be seen comparing FIGS. 7B and 7C, the exemplary resistive change element array characterized within plots 701, 702, and 703 possesses a significant bias toward RESET errors. That is, when programming this exemplary array, significantly more RESET errors can be expected to occur as compared to SET errors. In this particular example, at $10^8$ write cycles, it was found that 80% of the total errors (as plotted in FIG. 7A) were RESET errors and 20% were SET errors. This characteristic bias toward RESET errors makes this exemplary array well suited for the distributed flag error correction (DFEC) methods of the present disclosure, as will be explained in more detail below.

In addition to the bias toward one type of error, resistive change element arrays also exhibit other characteristics that make them well suited for the DFEC methods of the present disclosure. For example, programming errors within resistive change elements tend to be randomly distributed across the array. That is, unlike, for example, silicon based memory technologies, programming errors within resistive change elements typically do not cluster around a certain region or area of the array and are generally spread uniformly across the array. Additionally, programming errors within resistive change element arrays tend to be temporary and repairable, or, "soft" errors, whereas programming errors in silicon based memories, for example, are typically caused by damaged or otherwise broken cells, referred to as "hard" errors. That is, some types of resistive change elements, such as NRAM, that exhibit a RESET error can be corrected by simply repeating a programming operation, or, more commonly, by taking the cell through a full SET/RESET cycle. As will be described in detail below, the DFEC methods of the present disclosure take advantage of these characteristics of resistive change element arrays to provide error correction methods with reduced parity overhead—and, by extension, improved latency and smaller chip surface area—as compared with conventional error correction techniques.

Further, as will be described in detail within the discussion of FIGS. 10 and 11A-11E below, the DFEC methods of the present disclosure can program—that is, write data to—a resistive change element array using a two step process. In a first process step, all of the cells within a block or subsection of a resistive change element array are initialized to either a RESET or a SET state, as befits the needs of a particular application. As described above, the selection of the initialization state for an array is typically dependent on which state can be expected to exhibit a greater percentage of errors. After this initialization process adjusts all cells within the block or subsection into a single state, only those cells that are required to store a data value opposite of the initialization state are programmed in a second operation. For example, for an array wherein the initialization condition was RESET, a first programming operation would RESET all of the cells within a block. Then a second programming operation would then SET only those cells that require a logic "1" according to the data being written, as those cells that require a logic "0" are already in the desired state.

Figure 8A:
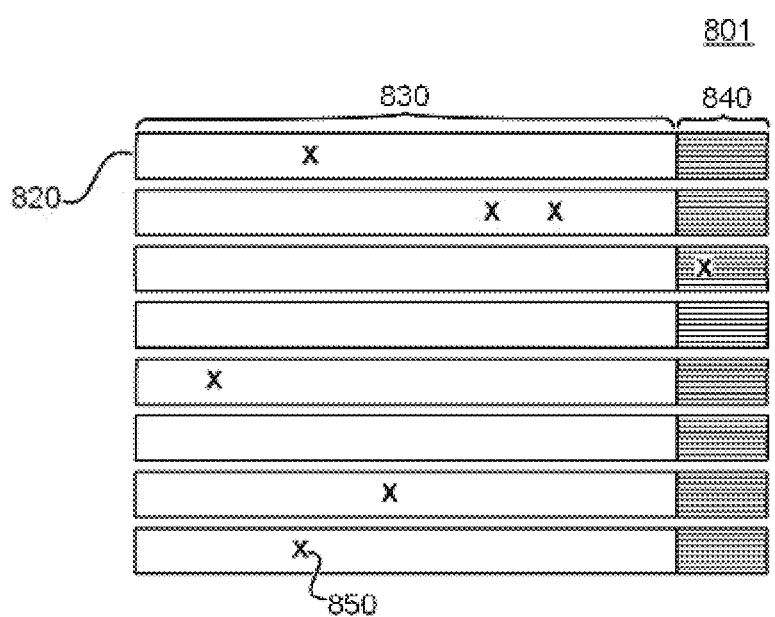
FIG. 8A is a diagram of an exemplary resistive element array with 8-kilobyte user data divided into eight blocks with 1-kilobyte user data, each block using conventional BCH error correction alone.
Figure 8B:
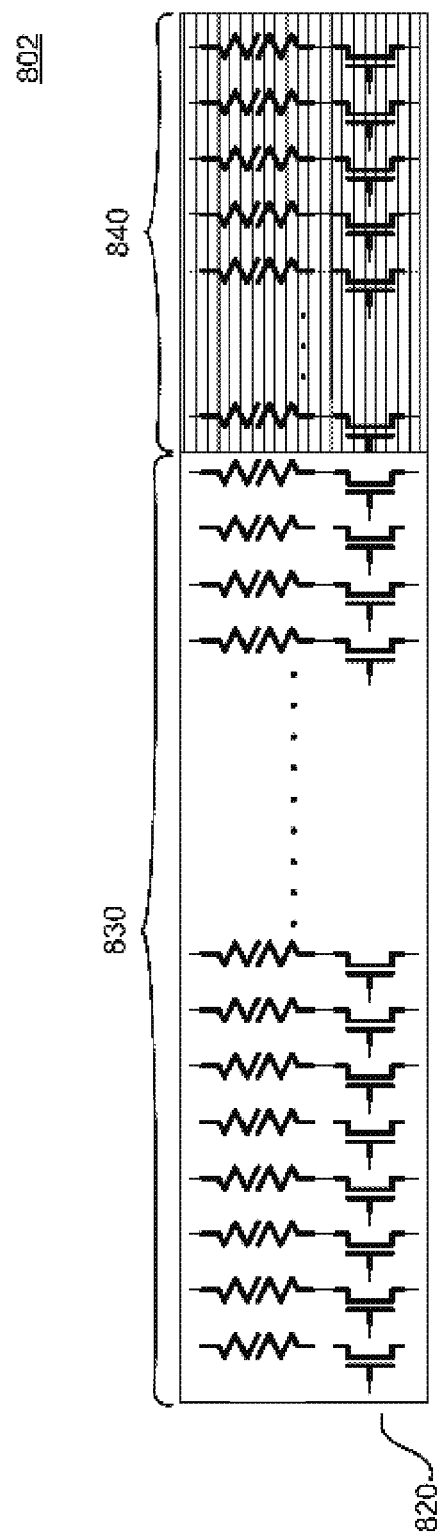
FIG. 8B is a diagram showing a block of FIG. 8A in more detail.

FIG. 8A is a diagram illustrating an exemplary resistive change element array 801 configured to use a conventional BCH error correction method alone. The array 801 is divided into eight blocks 820. FIG. 8B illustrates these blocks 820 in more detail in diagram 802. Errors 850 within the array 801 are indicated with an X. As can be seen in both FIGS. 8A and 8B, each of the blocks 820 include a region of data cells 830 and a region of BCH parity cells 840. The number of parity cells 840 is determined by the correctable BER required for the array and EQ1 (as discussed in detail above). For example, if FIG. 8A represented an array including 8-kilobyte (65,536 bit) data bits and overhead bits, and each block has a maximum correctable BER of 0.1%, each block would include a data region 830 with 8,192 data cells and a parity region 840 with 8×14=112 BCH parity cells. In this example, the ratio of parity cells to data cells within each block 820 would be 1.4%, as given by EQ2 and discussed in detail above, representing the parity overhead of the block.

FIG. 8C is a table 803 detailing the number of BCH parity bits (840 in FIGS. 8A and 8B) and the parity overhead required to achieve a specified correctable BER using only BCH error correction for a resistive change element array with 8 kilobytes of data bits configured as shown in FIG. 8A. For instance, looking to the first row of table 803, a correctable BER of 0.1% would require the BCH error correction algorithm to find 8 errors in each block containing 1 kilobyte of data bits (8192 bits), as shown in the second column of table 803. According to EQ1, 14 BCH parity bits are required to find a single error in a 1 kilobyte block, so 112 BCH parity bits are required to find 8 errors (14 parity bits×8 errors), as shown in the third column of table 803. A block with 112 BCH parity bits and 8192 data bits, as described above, results in a parity overhead (given by EQ2) of 1.4%. As detailed in table 803, similar calculations show that for 0.2%, 0.3%, 0.4%, and 0.5% correctable BER on the resistive change element array configured as detailed in FIG. 8A, parity overheads of 2.9%, 4.4%, 6.0%, and 7.5% are required, respectively. As will be shown in at least FIGS. FIGS. 16A-16C, the DFEC methods of the present disclosure may significantly reduce these parity overheads while maintaining the required correctable BER.

Reverse Flag Error Correction

As discussed previously, the simplest DFEC method of the present disclosure, the reverse-flag error correction (RFEC) method, distributes flag bits across a resistive change element array to delimitate each DFEC subsection with a single flag cell. This distributed flag can be used to indicate the presence of at least one initialization error in its subsection and thereby match the input data to the error pattern. The use of a single flag bit allows the input data to be matched to the errors according to two patterns—no effective errors (flag bit is not activated), and at least one effective error (flag bit is activated), as will be described in detail with respect to FIGS. 9A-9C, 10, and 11A-11E. In this way, the single-flag DFEC method of the present disclosure may be guaranteed to correct at least one initialization error per subsection.

Figure 9A:
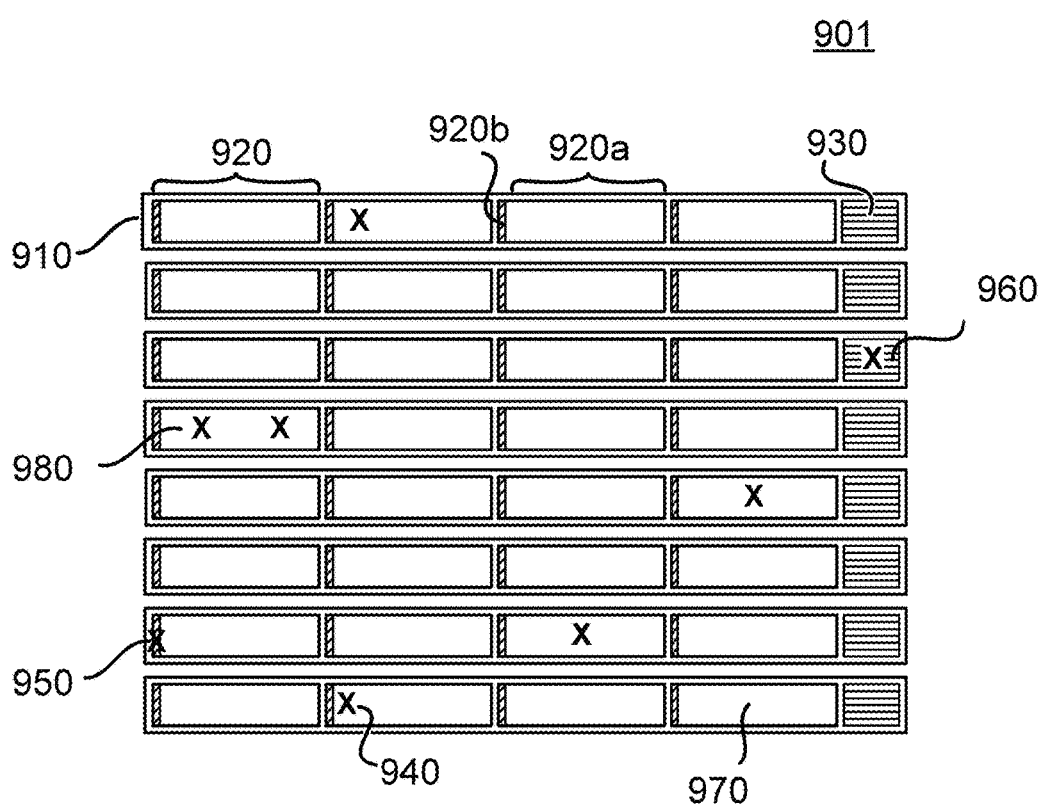
FIG. 9A is a diagram of an exemplary resistive element array with 8-kilobyte user data divided into eight blocks with 1-kilobyte user data, each block divided into four array subsections and using the reverse flag error correction (RFEC) method of the present disclosure.

Looking now to FIG. 9A, this diagram illustrates a resistive change element array 901 configured to use the RFEC method of the present disclosure in concert with a BCH error correction method. As with array 801 shown in FIG. 8A, array 901 is divided into eight blocks 910, which are illustrated in more detail in FIG. 9B. As can be seen in both FIGS. 9A and 9B, each block 910 is further divided into four subsections 920. Each of these four subsections 920 includes a region of data cells 920a and a single flag cell 920b for storing a single DFEC flag bit. Each block also includes a region of BCH parity cells 930 configured to correct errors across the entire block 910. Errors may occur across the array, including data bit errors 940, flag bit errors 950, and BCH parity bit errors 960. As will be discussed in detail below with respect to FIG. 10, flag cells 920b provide the ability to correct at least one initialization error within the data bits 920a of each subsection 920, reducing the total number of errors required to be corrected by the BCH error correction algorithm and, in turn, the number of BCH parity cells 930 required for each block 910. As will be shown in FIG. 9C, this configuration (one flag cell per subsection combined with a reduced number of BCH parity cells) provides a lower overall parity overhead for the array 901 as compared with using BCH error correction alone (as is shown in FIGS. 8A and 8B).

As described above, and in more detail with respect to FIG. 10 below, the flag bits used in the DFEC methods of the present disclosure are only capable of correcting initialization errors within an array. That is, for a resistive change element array that initializes cells into a RESET state during a programming operation, the flag bits will correct only RESET errors within each subsection. And, similarly, for a resistive change element array that initializes cells into a SET state during a programming operation, the flag bits will only correct SET errors within each subsection. Further, the DFEC methods of the present disclosure may only correct initialization errors 940 in data bits 920a. BCH parity bit errors 960 and flag bit errors 950, as well as programming errors, must be corrected by a secondary error correction method. As discussed previously, in certain applications wherein a resistive change element array tends to bias toward one type of error (SET or RESET), the type of error with greater occurrence should be selected as the initialization condition, as a higher number of errors can be expected to be corrected using the flag cell within each subsection (as will be shown in detail within the discussion of FIG. 10 below).

To this end, for an exemplary resistive change element array configured as shown in FIG. 9A, at the $10^8$th write cycle, 75% of the errors that occur may be expected to be RESET errors and 25% may be expected to be SET errors (such an error distribution is in line with the exemplary error rate characterization shown in FIGS. 7A-7C and discussed in detail above). Such an error distribution would mean that the majority of errors which occur are RESET errors, and thus the flag cells 920b could be expected to correct a significant portion of the total errors within their respective subsection. Specifically, each flag cell can be guaranteed to correct at least one RESET error per subsection 910, should a RESET occur. Effectively, this means that in an ideal case one error bit can be corrected by one flag cell 920b. This is much more efficient than using BCH alone, which needs 14 parity bits to correct one error. Flag bit cells 920b can therefore be used to reduce the number of bits 930 that a BCH error correction routine will require to achieve a given correctable BER and, in turn, reduce the parity overhead within array 901.

In real applications, however, RESET errors are not evenly distributed between subsections. Some subsections, such as 970, may not have a RESET error at all, while others, such as 980, may contain multiple errors. As a result, the flag bits in subsections with no errors may be unnecessary, while in subsections with multiple errors the flag bits may be unable to correct all of the errors. The number of flag bits 920b, and by extension the number and size of subsections 920, should therefore be carefully determined based on the RESET error rate, as will be described in more detail in FIGS. 13A-13D and 16A-16C. If too many flag bits are used, many subsections may not have a RESET error and the parity overhead may be unnecessarily large. On the other hand, some subsections may have multiple reset errors if too few flag bits are used or the RESET error rate is high. In this case, additional flag bits 920b may be used to reduce the subsection size and separate the RESET error bits into different subsections, thereby reducing the reliance on BCH correction.

FIG. 9C details this reduction in parity overhead for the resistive change element array configured as detailed in FIG. 9A for a correctable BER of 0.1%. Looking to the first row of table 903, a correctable BER of 0.1% would require an error correction algorithm to find 8 errors in each block with 1 kilobyte (8192 bit) of data bits plus overhead bits, as shown in the second column of table 903. In this analysis, assuming four flag bits 920b in each block 910 (one per subsection 920) can be statistically expected to correct 3 errors due to the error distribution. This means that a BCH error correction routine will only need to correct 5 additional errors, which due to set errors and multiple RESET errors in one subsection, to achieve the required 0.1% correctable BER (8 total errors over the 1 kilobyte block). As previously discussed with respect to FIG. 8C above, 14 BCH parity bits are required to correct a single error in the same 1-kilobyte block (as indicated by EQ1). As such, only 70 BCH parity cells are required to find the remaining 5 errors compared to the 112 BCH parity cells required for the BCH only configuration shown in FIG. 8C. This gives each block 910 a total of 74 parity cells (70 BCH parity cells 930 and 4 flag cells 920b) and a total parity overhead of 0.9% for a 0.1% correctable BER compared to 112 parity cells and 1.4% parity overhead in the BCH only configuration detailed in FIG. 8C.

Figure 10:
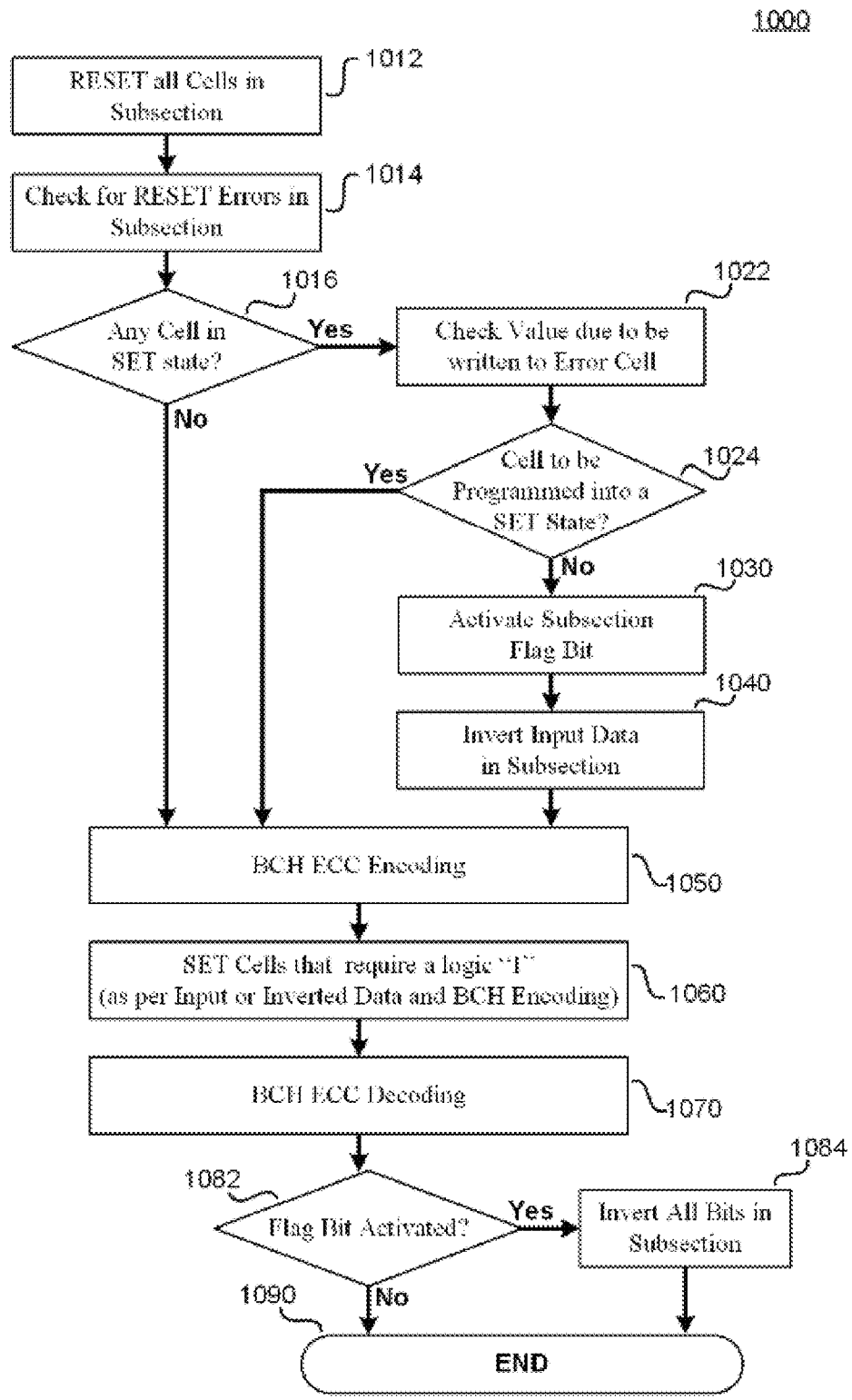
FIG. 10 is a flow chart detailing an exemplary programming/read back operation that uses the reverse flag error correction (RFEC) method of the present disclosure.

FIG. 10 is a flow chart illustrating the single-flag DFEC method of the present disclosure used during a programming/read back operation 1000 performed on a single subsection of a resistive change element array (analogous to subsection 920 in array 901 within FIG. 9A). It should be noted that within FIG. 10 (as well as within the examples presented within FIGS. 11A-11E, 16, and 17A-17F further below) a RESET state is selected as the initialization state for ease of explanation. However, the methods of the present disclosure are not limited in this regard. As described in detail above, the DFEC methods of the present disclosure can be used to correct either SET or RESET errors, as befits the needs of a particular application. As such, the examples of FIGS. 10 and 11A-11E (as well as those throughout the present disclosure), wherein the DFEC methods of the present disclosure are used to correct RESET errors within a resistive change element array that initializes cells to a RESET state during a programming/read back operation, should be considered non-limiting examples presented for illustrative purposes only.

Looking again to FIG. 10, within a first process step 1012 all of the cells within the subsection are initialized into a RESET condition. In a second operation 1014, the subsection is checked for any RESET errors (that is, the subsection is checked to ensure that no cells failed to be initialized into a relatively high resistive RESET state, corresponding to a logic "0"). Looking now to process step 1016, if there are no cells in the subsection in a SET state (that is, if there are no RESET errors after initialization), the programming/read back operation 1000 advances to process step 1050 wherein the input data to be programmed to the subsection is encoded with a BCH ECC algorithm. However, if at least one cell within the subsection remains uninitialized, programming/read back operation 1000 advances to data pattern matching (DPM) step 1022.

Within DPM step 1022, the data values required to be written to the subsection during programming/read back operation 1000 are checked to see if the uninitialized cell (or cells) is due to be programmed into either a SET or a RESET state. Within process step 1024, if the error cell (or all of the error cells, in the case of multiple initialization errors within the subsection) is due to be programmed into a SET condition there is effectively no error, and the programming/read back operation 1000 advances to process step 1050 wherein the input data to be programmed to the subsection is encoded with a BCH ECC algorithm. In this case, wherein the erroneously uninitialized cell—or cells—is due to be programmed into the opposite of the initialization state (a SET state in this example), there is effectively no error, and the uninitialized cell can be left alone or programmed more completely into a SET state within process state 1060.

However, if at least one effective error has occurred, wherein at least one cell is due to be programmed into a RESET state (as per the input data supplied to the programming/read back operation 1000), the programming/read operation 1000 advances to process step 1030 wherein the subsection's flag bit (960b in FIGS. 9A and 9B) is activated (set to a logic "1" in this example). As will be shown further below, the flag bit will be used in reverse data pattern matching (RDPM) step 1082 to decode the DFEC programmed data and recover at least one RESET error within the subsection. In some cases, however, wherein the number of effective initialization errors is less than half of the number of total initialization errors, the flag cell may remain un-activated. In such cases, inverting the input data will result in a larger number of errors than if it remains un-inverted. This situation may be detected during the DPM step to ensure the maximum number of errors are corrected. Once the flag bit is activated (in process step 1030), the programming/read back operation 1000 advances to DFEC encoding step 1040 wherein the input data due to be programmed into the subsection is inverted. That is, the input data due to be programmed into the subsection is logically inversed, such that logic "1" input data values become logic "0" and logic "0" input data values become logic "1". The programming/read back operation 1000 then advances to process step 1050 wherein the data to be programmed to the subsection, now inverted, is encoded with a BCH ECC algorithm.

It should be noted that in the present disclosure an "effective error" or "effective initialization error" may be used interchangeably to refer to a data cell which failed to initialize during an initialization step and is due to be programmed into an initialized state according to a set of input data. That is, for example, if a RESET state is selected as the initialization state, an effective error is a data cell which remains in a SET state following initialization of the array and is due to be programmed to a RESET state as per the input data. By contrast, an initialization error may also occur wherein a data cell fails to initialize into a selected initialization state (RESET, for instance) and remains in the opposite logical state (SET, for instance), but according to the input data is already in the correct state (that is, the cell was due to be programmed to a SET state, for instance). In this case there is an initialization error but not an effective error, as the error may not need to be corrected.

Figure 9B:
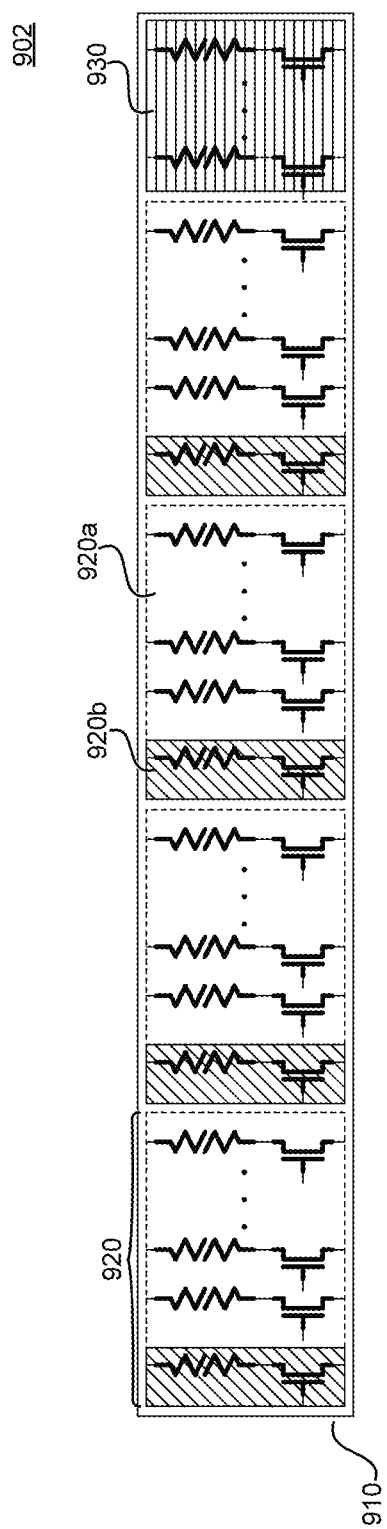
FIG. 9B is a diagram showing a 1-kilobyte block of FIG. 9A in more detail.

Next, within process step 1060, all of the cells that require a logic "1"—as per either the original input data supplied to the programming/read back operation 1000 or the inverted version of that data—are programmed with a SET operation, adjusting those cells into a relatively low resistance state corresponding to a logic "1". Within process step 1060, all of the cells that require a logic "1" (that is, the data cells within the subsection, the flag cell, and the BCH parity cells—as shown in FIGS. 9A and 9B) can, in certain applications, be programmed (that is, adjusted into a SET state) within a single operation. In this way, the DFEC encoded input data is further processed using the BCH error correcting code (BCH ECC) and written to the subsection. At this point the subsection has been successfully programmed and the programming operation ends In a next process step 1070, the programmed data is read out from the memory array and first processed through a BCH ECC decoding algorithm. Once corrected by BCH ECC, the subsection's flag bit (920b in FIGS. 9A and 9B) is checked in reverse data pattern matching (RDPM) step 1082. If the subsection's flag bit is not activated (that is, if the bit was not activated in process step 1030) then the read operation ends in step 1090, as no further processing needs to be done for the data bits in the subsection. However, if the subsection's flag bit is activated (that is, if the bit was activated in process step 1030), then read operation 1000 is advanced to DFEC decoding step 1084 wherein all of the bits in subsections with an activated flag bit are inverted to reflect the actual data values before the data inversion step 1040.

As previously discussed, the RFEC method of the present disclosure is capable of correcting at least one initialization error within a subsection. However, the RFEC method may not be able to correct all of the initialization errors in a subsection if it contains multiple errors, depending on the error locations and the user data pattern (as will be discussed in detail within the discussion of FIGS. 11D and 11E below). Further, as previously discussed, the DFEC methods of the present disclosure are only capable of correcting initialization errors (as occur in process step 1012) and cannot correct programming errors that occur in process step 1060. As such, an additional error correction process is required when using the DFEC methods of the present disclosure to correct any programming errors that occurred within process step 1060, as well as any initialization errors not corrected by the DFEC methods of the present disclosure in process steps 1030 and 1040. To this end, programming/read back operation 1000 performs a BCH error correction cycle on the subsection—via process steps 1050 and 1070—to correct any programming errors that occur within process step 1060, as well as any initialization errors not corrected within process steps 1030 and 1040.

It should be noted that while FIG. 10 (as well as the examples detailed in FIGS. 11A-11E) makes use of a BCH error correction method, the present disclosure is not limited in this regard.

FIGS. 11A-11E detail several examples of the RFEC method of the present disclosure used within different programming/read back operations (1101-1105) on a resistive change element array subsection (analogous to 920 in FIGS. 9A and 9B) that includes four data cells (analogous to 920a in FIGS. 9A and 9B) and one flag cell (analogous to 920b in FIGS. 9A and 9B). It should be noted that in real applications the number of bits in each subsection is much larger than 4. The examples within FIGS. 11A-11E describe a resistive change element array configuration wherein cells are initialized into a relatively high resistance RESET state (corresponding to a logic "0"), however, as previously discussed, the methods of the present disclosure are not limited in this regard. The exemplary programming operations in FIGS. 11A-11E are intended as non-limiting illustrative examples of the RFEC method of the present disclosure (as detailed in FIG. 10 and discussed above) applied to different types of error conditions with a resistive change element array. Further, the exemplary programming operation within FIGS. 11A-11E make use of a BCH error correction cycle (within programming steps 1150a-1150e and 1170a-1170e).

Figure 11A:
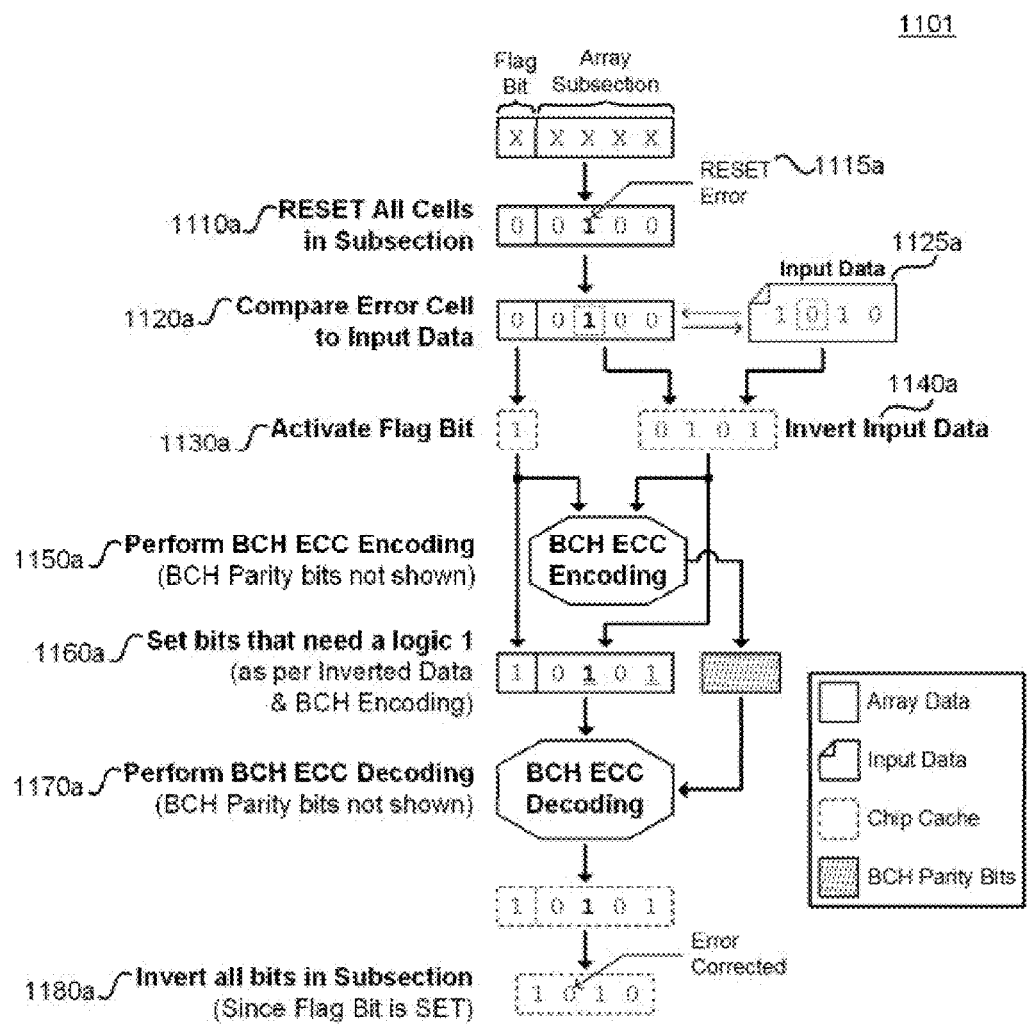
FIG. 11A is a diagram illustrating an exemplary error correction operation according to the RFEC method of the present disclosure used to correct a single RESET error on a cell intended to be written with a logic "0".

Looking now to FIG. 11A, the RFEC method of the present disclosure is used to correct a single initialization error (RESET error) on a data cell intended to be programmed into a RESET state. At the start of exemplary programming operation 1101, a first programming step 1110a (analogous to operations 1012, 1014, and 1016 in FIG. 10) attempts to initialize all of the bits within the array subsection (all originally in unknown logic states represented by an "X") into a RESET state (logic "0"). However, within this example, the second cell within the array subsection fails to initialize, introducing RESET error 1115a into the subsection. In a next programming step 1120a (analogous to operations 1022 and 1024 in FIG. 10), the input data 1125a (that is, the data due to be written into the subsection) is checked to see if the uninitialized cell is due to be programmed into a SET or RESET state. As the second cell requires a logic "0" (that is, a RESET state), the uninitialized cell needs to be corrected using the DFEC method of the present disclosure.

To correct RESET error 1115a, programming step 1130a (analogous to operation 1030 in FIG. 10) activates the subsection's flag bit, and DPM programming step 1140a (analogous to operation 1040 in FIG. 10) inverts input data 1125a. Within this non-limiting example, the inverted data and activated flag bit are initially stored in a chip cache to facilitate BCH ECC processing in programming step 1150a. Within programming step 1160a (analogous to operation 1060 in FIG. 10), the inverted input data is programmed into the array. As shown in FIG. 11A, programming step 1160a adjusts the fourth cell of the subsection into SET state, according to the inverted input data. As the second cell within the subsection is already in a SET state (due to RESET error 1115a), within certain applications it may not be necessary to perform a SET operation on this cell within programming step 1160a. Within such operations, the uninitialized cell is already within a valid and stable SET state and no further adjustment to the cell is required. In other applications, a SET operation may be performed on the second cell within programming step 1160a to ensure the cell is fully adjusted into a SET state. In either case, the SET condition stored within the second cell of the subsection is now correctly programmed according to the inverted data, correcting RESET error 1115a.

In a next programming step 1170a, the programmed data is read back out of the subsection and processed through a BCH ECC decoding algorithm (analogous to operation 1070 in FIG. 10). Since there are no other errors within this example 1101, the data values within the subsection remain unchanged. As the flag bit is activated (that is, programmed to a logic "1" within this exemplary programming/read back operation 1101), in RDPM programming step 1180a (analogous to operations 1082 and 1084 in FIG. 10) all of the bits within the subsection are inverted. In this way, the RESET error 1115a introduced during the subsection initialization in programming step 1110a is corrected using a single parity bit.

Figure 11B:
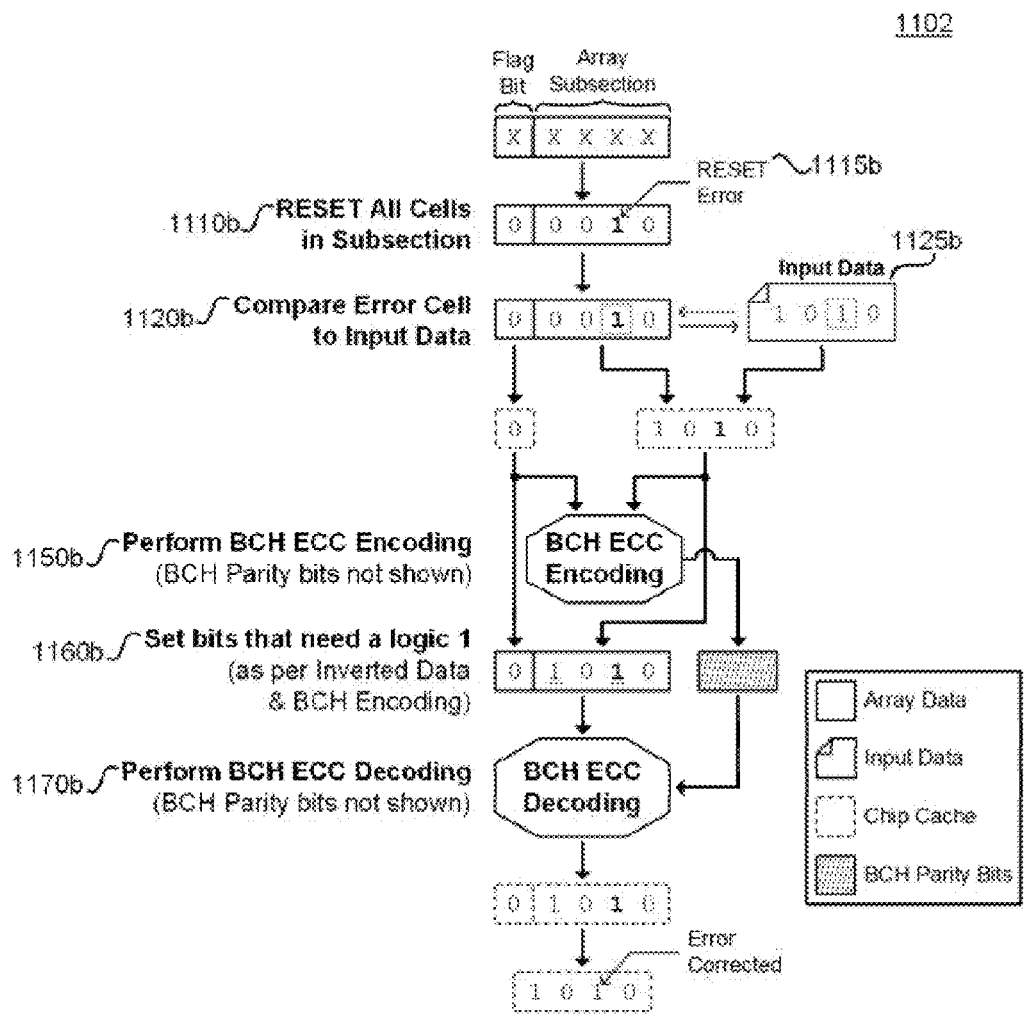
FIG. 11B is a diagram illustrating an exemplary error correction operation according to the RFEC method of the present disclosure used to correct a single RESET error on a cell intended to be written with a logic "1".

FIG. 11B demonstrates the single-flag DFEC method of the present disclosure when a single initialization error (RESET error) occurs on a data cell intended to be programmed into a SET state. At the start of exemplary programming operation 1102, a first programming step 1110b (analogous to operations 1012, 1014, and 1016 in FIG. 10) attempts to initialize all of the bits within the array subsection (all originally in unknown logic states represented by an "X") into a RESET state (logic "0"). However, within this example, the third cell within the array subsection fails to initialize, introducing a RESET error 1115b into the subsection. In a next programming step 1120b (analogous to operations 1022 and 1024 in FIG. 10), the input data 1125b (that is, the data due to be written into the subsection) is checked to see if the uninitialized cell is due to be programmed into a SET or RESET state. Since the third cell requires a logic "1" (that is, a SET state), the uninitialized cell does not require correction, as it is either already in a valid and stable SET state (as required by input data 1125b) or will be further adjusted into such a state within programming step 1050b. As such, there is no need to invert the input data 1125b as is done within the exemplary operation 1101 of FIG. 11A.

To this end, in this non-limiting example, the input data and inactivated flag bit are initially stored in a chip cache to facilitate BCH ECC encoding in process step 1150b. Within programming step 1160b (analogous to operation 1060 in FIG. 10), the BCH encoded input data is programmed into the array by adjusting the first cell and third cell of the subsection into a SET state, according to the input data 1125b. As previously discussed, since the third cell within the subsection is already in a SET state (due to RESET error 1115a), within certain applications it may not be necessary to perform a SET operation on this cell within programming step 1160b. Within such operations, the uninitialized cell is already within a valid and stable SET state and no further adjustment to the cell is required. In other applications, a SET operation may be performed on the third cell within programming step 1160b to ensure the cell is fully adjusted into a SET state. In either case, the SET condition stored within the third cell of the subsection is correctly programmed according to the input data 1125b despite RESET error 1115b being introduced during initialization.

In a next programming step 1170b, the programmed data is read back out of the subsection and processed through a BCH ECC decoding algorithm (analogous to operation 1070 in FIG. 10). Since there are no other errors within this example 1102, the data values within the subsection remain unchanged. The flag bit was never activated (that is, was never programmed to a logic "1" within this exemplary programming/read back operation 1102) and there is no need to invert the subsection data, as is done within exemplary RDPM programming operation 1101 in FIG. 11A. In this way, the RESET error 1115b introduced during the subsection initialization in programming step 1110b is corrected.

Figure 11C:
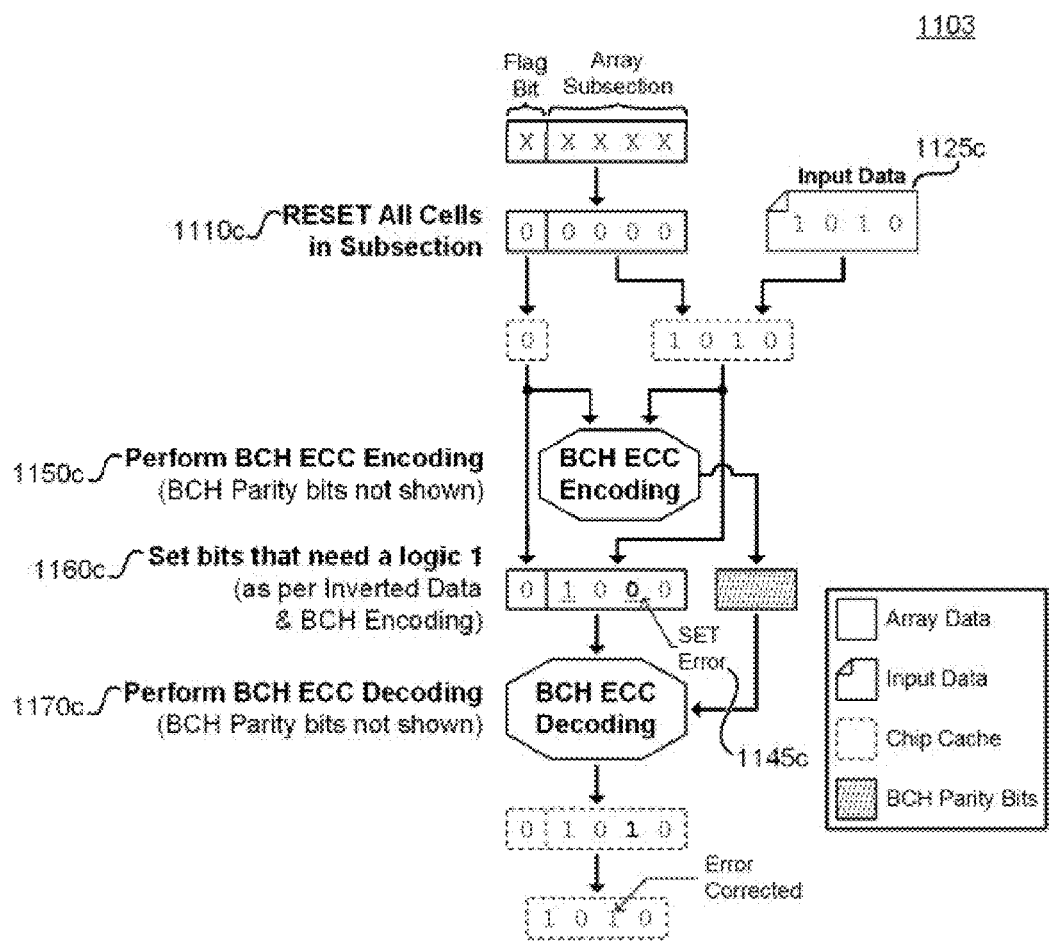
FIG. 11C is a diagram illustrating an exemplary error correction operation according to the RFEC method of the present disclosure used to correct a single SET error.

Looking now to FIG. 11C, the single-flag DFEC method of the present disclosure is used within an exemplary programming operation 1103 wherein a single programming error (SET error) is introduced on a data cell intended to be programmed into a SET state. At the start of exemplary programming operation 1103, a first programming step 1110c (analogous to operations 1012, 1014, and 1016 in FIG. 10) attempts to initialize all of the bits within the array subsection (all originally in unknown logic states represented by an "X") into a RESET state (logic "0"). Unlike the exemplary programming operations 1101 and 1102 (within FIGS. 11A and 11B, respectively), within this example all of the cells within the subsection initialize correctly and no RESET errors are introduced. As such, there is no need to employ the single-flag DFEC method of the present disclosure (that is, there is no need to activate the subsection's flag bit or invert the input data 1125c).

With the subsection initialized, within this non-limiting example, the input data and inactivated flag bit are initially stored in a chip cache to facilitate BCH ECC encoding in process step 1150c. Within programming step 1160c (analogous to operation 1060 in FIG. 10), the BCH encoded input data is programmed into the array. As shown in FIG. 11C, programming step 1160c adjusts the first cell and third cell of the subsection into SET state, according to input data 1125b. Within exemplary programming operation 1103, a SET error 1145c is introduced in the third cell of the subsection during programming step 1160c. That is, the programming operation performed on the third cell of the subsection—which should have adjusted the data cell from a RESET state into a SET state—fails during programming step 1160c, and the third data cell within the subsection remains in a RESET state. As previously discussed, the DFEC methods of the present disclosure are only able to correct initialization errors and, as such, cannot be used to correct SET error 1145c. However, such an error can be corrected, according to the methods of the present disclosure, by employing a second error correction method in concert with the DFEC methods.

To this end, in a next programming step 1170b, the programmed data is read back out of the subsection and processed through a BCH ECC decoding algorithm (analogous to operation 1070 in FIG. 10). As shown in FIG. 11C, this BCH ECC decoding corrects the SET error 1145c introduced within programming step 1160c, and the subsection is correctly programmed according to input data 1125c. Next, as the flag bit was never activated (that is, was never programmed to a logic "1" within this exemplary programming/read back operation 1103), there is no need to invert the subsection data as is done within exemplary RDPM programming operation 1101 in FIG. 11A. In this way, the SET error 1145c introduced within programming step 1160c is corrected.

Figure 11D:
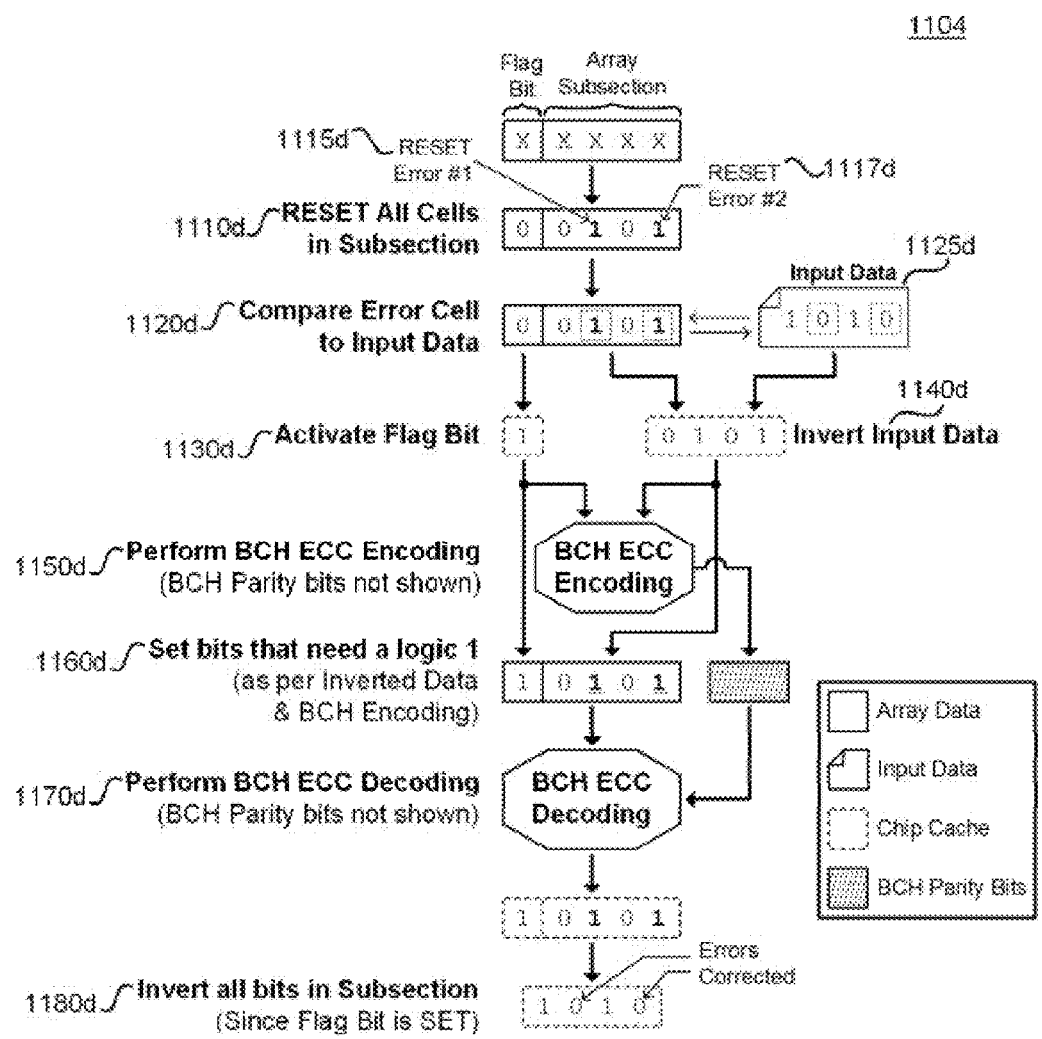
FIG. 11D is a diagram illustrating an exemplary error correction operation according to the RFEC method of the present disclosure used to correct two RESET errors on two cells intended to be written with a logic "0".

Looking now to FIG. 11D, the single-flag DFEC method of the present disclosure is used to correct two initialization errors (RESET errors) on two data cells, both intended to be programmed into a RESET state. At the start of exemplary programming operation 1104, a first programming step 1110d (analogous to operations 1012, 1014, and 1016 in FIG. 10) attempts to initialize all of the bits within the array subsection (all originally in unknown logic states represented by an "X") into a RESET state (logic "0"). However, within this example, the second cell and the fourth cell within the array subsection both fail to initialize, introducing a first RESET error 1115d and a second RESET error 1117d into the subsection. In a next programming step 1120d (analogous to operations 1022 and 1024 in FIG. 10), the input data 1125d (that is, the data due to be written into the subsection) is checked to see if the uninitialized cells are due to be programmed into SET or RESET states. As both cells require a logic "0" (that is, a RESET state), both uninitialized cells need to be corrected using the single-flag DFEC method of the present disclosure.

To correct RESET errors 1115d and 1117d, programming step 1130d (analogous to operation 1030 in FIG. 10) activates the subsection's flag bit, and DPM programming step 1140d (analogous to operation 1040 in FIG. 10) inverts input data 1125d. Within this non-limiting example, the inverted data and activated flag bit are initially stored in a chip cache to facilitate BCH ECC encoding in process step 1150d. Within programming step 1160d (analogous to operation 1060 in FIG. 10), the BCH encoded inverted data is programmed into the array. As shown in FIG. 11D, programming step 1160d adjusts both the second cell and fourth cell of the subsection into a SET state, according to the inverted input data. As both the second and fourth cells within the subsection are already in a SET state (due to RESET errors 1115d and 1117d), within certain applications it may not be necessary to perform a SET operation on these cells within programming step 1160d. Within such operations, the uninitialized cells are already within valid and stable SET states and no further adjustment to the cells is required. In other applications, however, a SET operation may be performed on the first and third cells within programming step 1160d to ensure both cells are fully adjusted into a SET state. In either case, the SET conditions stored within the first and third cells of the subsection are now correctly programmed according to the inverted data.

In a next programming step 1170d, the programmed data is read back out of the subsection and processed through a BCH ECC decoding algorithm (analogous to operation 1070 in FIG. 10). Since there are no other errors within this example 1104, the data values within the subsection remain unchanged. As the flag bit is activated (that is, programmed to a logic "1" within this exemplary programming/read back operation 1104), in RDPM programming step 1180d (analogous to operations 1082 and 1084 in FIG. 10) all of the bits within the subsection are inverted, correcting RESET errors 1115d and 1117d. In this way, the two RESET errors 1115d and 1117d introduced during the subsection initialization in programming step 1110d are both corrected using a single parity bit.

Figure 11E:
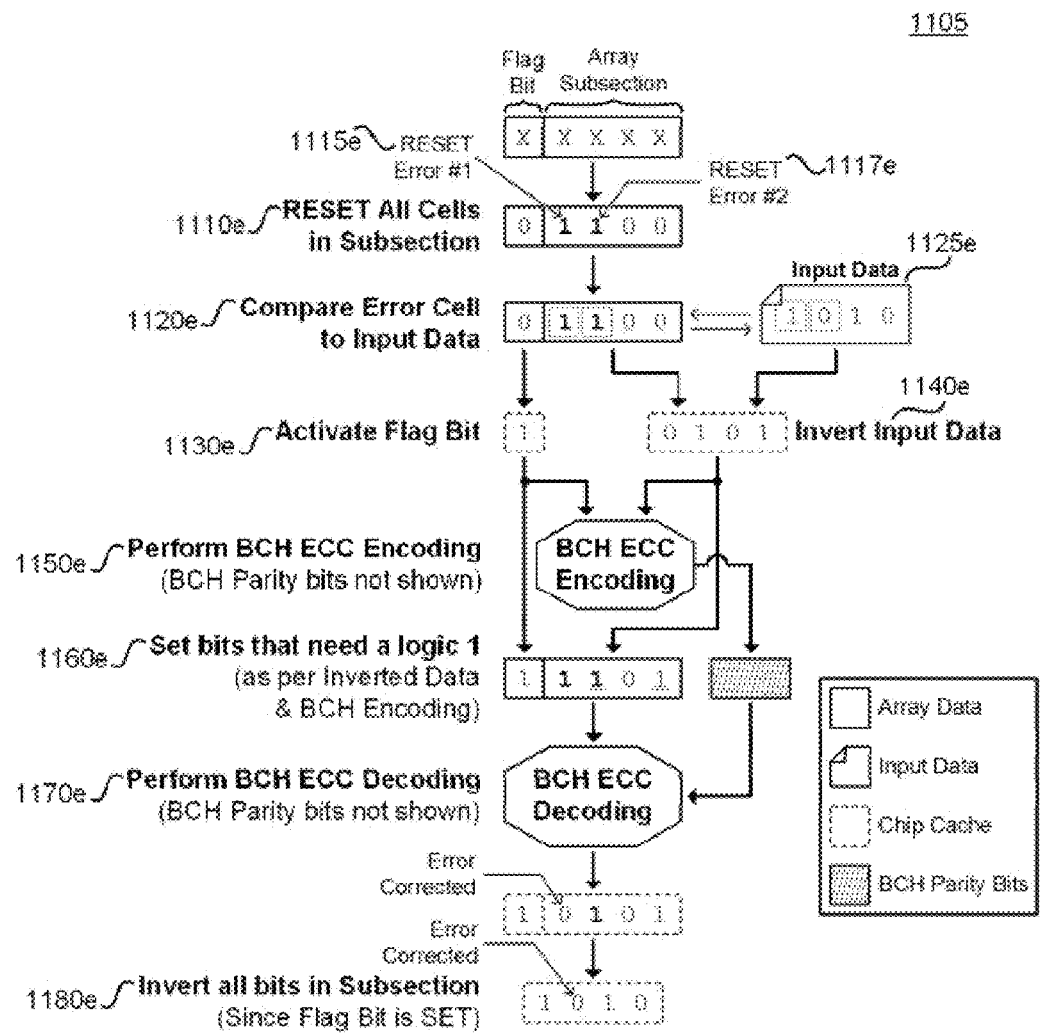
FIG. 11E is a diagram illustrating an exemplary error correction operation according to the RFEC method of the present disclosure used to correct two RESET errors on two cells wherein one is intended to be written with a logic "0" and the other is intended to be written with a logic "1".

Looking now to FIG. 11E, the single-flag DFEC method of the present disclosure is used to correct two initialization errors (RESET errors) on two data cells: a first error on a data cell intended to be programmed into a RESET state, and a second error on a data cell intended to be programmed into a SET state. At the start of exemplary programming operation 1105, a first programming step 1110e (analogous to operations 1012, 1014, and 1016 in FIG. 10) attempts to initialize all of the bits within the array subsection (all originally in unknown logic states represented by an "X") into a RESET state (logic "0"). However, within this example, the first cell and the second cell within the array subsection both fail to initialize, introducing a first RESET error 1115e and a second RESET error 1117e into the subsection. In a next programming step 1120e (analogous to operations 1022 and 1024 in FIG. 10), the input data 1125e (that is, the data due to be written into the subsection) is checked to see if the uninitialized cells are due to be programmed into SET or RESET states.

As shown in FIG. 11E, the second cell within the subsection is due to be programmed into a RESET state (according to input data 1125e) and the first cell within the subsection is due to be programmed into a SET state (according to input data 1125e). As will be shown within exemplary programming operation 1105, the single-flag DFEC method of the present disclosure will be used to correct the second cell of the subsection. However, this first operation will leave the first cell of the subsection in an erroneous state that will need to be corrected by a second error correction operation (programming steps 1150e and 1170e).

As at least one of the uninitialized data cells requires a logic "0" (that is, a RESET state), programming step 1130e (analogous to operation 1030 in FIG. 10) activates the subsection's flag bit, and DPM programming step 1140e (analogous to operation 1040 in FIG. 10) inverts input data 1125e. Within this non-limiting example, the inverted data and activated flag bit are initially stored in a chip cache to facilitate BCH ECC encoding in process step 1150e. Within programming step 1160e (analogous to operation 1060 in FIG. 10), the BCH encoded inverted data is programmed into the array. As shown in FIG. 11E, programming step 1160e adjusts both the second cell and fourth cell of the subsection into a SET state, according to the inverted input data. As the second cell within the subsection is already in a SET state (due to RESET error 1115e), within certain applications it may not be necessary to perform a SET operation on this cell within programming step 1160e. Within such operations, the uninitialized second data cell is already within a valid and stable SET state and no further adjustment to the cell is required. In other applications, however, a SET operation may be performed on the second cell within programming step 1160e to ensure the cell is fully adjusted into a SET state. In either case, the SET condition stored within the second cell of the subsection is now correctly programmed according to the inverted data 1145e.

In a next programming step 1170e, the programmed data is read back out of the subsection and processed through a BCH ECC decoding algorithm (analogous to operation 1070 in FIG. 10). As shown in FIG. 11E, this BCH ECC decoding corrects RESET error 1115e (introduced within programming step 1110e). Next, as the flag bit is activated (that is, programmed to a logic "1" within this exemplary programming/read back operation 1105), in RDPM programming step 1180e (analogous to operations 1082 and 1084 in FIG. 10) all of the bits within the subsection are inverted, correcting RESET error 1117e. In this way, the two RESET errors 1115e and 1117e introduced during the subsection initialization in programming step 1110e are both corrected using the single-flag DFEC method of the present disclosure in concert with a second error correction routine (the BCH error correction cycle of programming steps 1150e and 1170e).

Figure 12A:
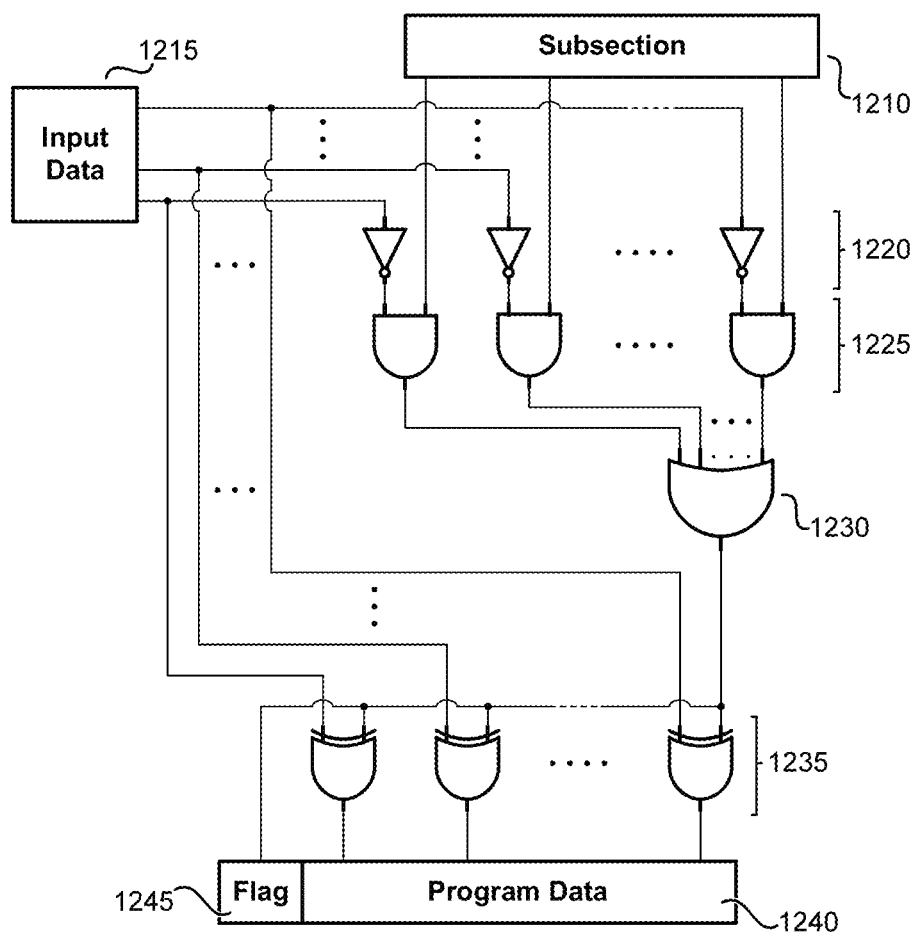
FIG. 12A is a simplified schematic illustrating an exemplary encoding circuit for use with the RFEC method of the present disclosure.

FIG. 12A is a simplified schematic diagram illustrating an exemplary encoding circuit 1201 suitable for use with the RFEC method of the present disclosure. As with other examples within the present disclosure, exemplary encoding circuit 1201 is arranged for use with a resistive change element array that uses RESET (that is, logic "0") as its initialization state. However, it should be noted that, as previously discussed, the methods of the present disclosure are not limited in this regard. The DFEC methods of the present disclosure can also be used within a resistive change element array that uses a SET state as an initialization condition, and exemplary encoding circuit 1201 is intended only as a non-limiting, illustrative example of a circuit capable of encoding programming data according to the single-flag DFEC method of the present disclosure.

Looking now to FIG. 12A, an array of AND gates 1225 ANDs together the data cells of a resistive change element array subsection 1210 with input data 1215 (analogous to input data 1025 in FIG. 10) which is inverted through an array of Inverter gates 1220. The outputs of AND gates 1225 are ORed together with OR gate 1230 to provide the flag bit for the subsection 1245. Such a configuration will activate (that is, set to a logic "1" within this exemplary encoding circuit 1201) flag bit 1245 if any data cell within subsection 1210 fails to initialize (that is, if any data cell is in a SET state) and is intended to be programmed into a RESET state. Such a logic function is analogous to operations 1014, 1016, 1022, 1024, and 1030 within FIG. 10, discussed in detail with respect to that figure above.

Next, an array of Exclusive OR gates 1235 selectively inverts the input data 1215 dependent on the state of flag bit 1245. The array of Exclusive OR gates 1235 then provides either the input data 1215 (if flag bit 1245 is not activated) or an inverted version of the input data 1215 (if flag bit 1245 is activated) to be programmed into the array (the program data represented by block 1240 in FIG. 12A). Such a logic function is analogous to operation 1040 within FIG. 10, discussed in detail above.

Figure 12B:
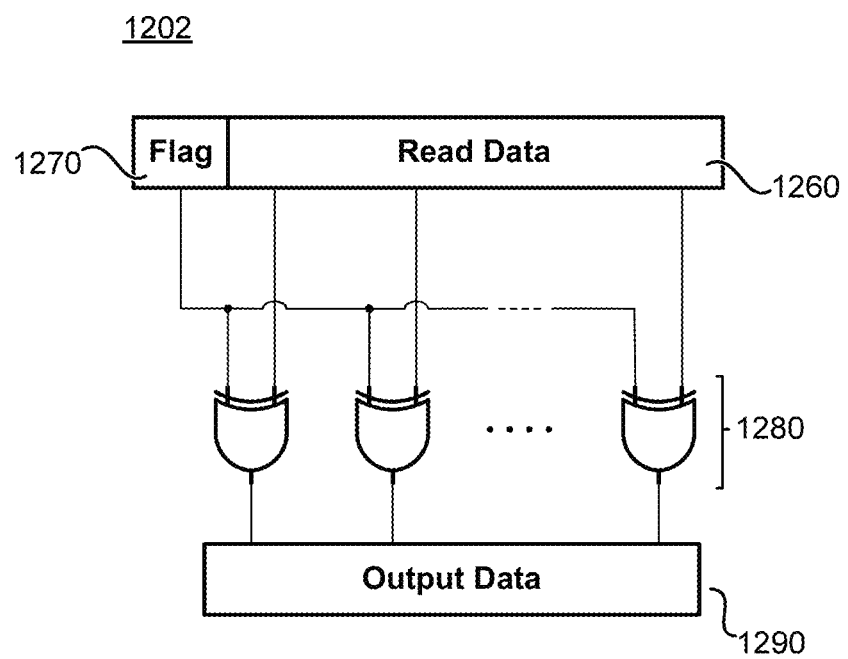
FIG. 12B is a simplified schematic illustrating an exemplary decoding circuit for use with the RFEC method of the present disclosure.

FIG. 12B is a simplified schematic diagram illustrating an exemplary decoding circuit 1202 suitable for use with the single-flag DFEC method of the present disclosure. As with encoding circuit 1201 within FIG. 12A as well as other examples within the present disclosure, exemplary decoding circuit 1202 is arranged for use with a resistive change element array that uses RESET (that is, logic "0") as its initialization state. Again, it should be noted that, as previously discussed, the methods of the present disclosure are not limited in this regard. The DFEC methods of the present disclosure can also be used within a resistive change element array that uses a SET state as an initialization condition, and exemplary decoding circuit 1202 is intended only as a non-limiting, illustrative example of a circuit capable of decoding program data according to the single-flag DFEC method of the present disclosure.

Looking now to FIG. 12B, an array of Exclusive OR gates 1280 selectively inverts read data 1260 (that is, data read out of an array subsection) dependent on the state of flag bit 1270. The array of Exclusive OR gates 1280 then provides either the read data 1260 (if flag bit 1270 is not activated) or an inverted version of the read data 1260 (if flag bit 1270 is activated) to the output of the resistive change element array 1290. Such a logic function is analogous to operations 1082 and 1084 within FIG. 10, discussed in detail with respect to that figure above.

As shown within exemplary programming operations 1101-1105 within FIGS. 11A-11E, the methods of the present disclosure employ the RFEC method of the present disclosure in concert with a second error correction routine to provide error correction within a resistive change element array at a desired correctable bit error rate (BER) with reduced parity overhead as compared to using a conventional error correction routine alone.

Statistical Analysis of the DFEC Methods

As previously discussed, flag bits distributed across a resistive change element array (or, block) can delimitate DFEC subsections, wherein the distributed flag bits may be used to correct at least one initialization error per subsection in a first operation, and thereby reduce the number of errors required to be corrected by a conventional error correction routine performed within a second operation to achieve a desired correctable BER. The number of flag bits employed may substantially affect the number of errors which may be corrected by the DFEC methods. Further, by selecting the size of the subsections within the resistive change element array, the overall parity overhead (that is, the total number of DFEC flag bits plus the reduced number of parity bits used for the conventional error correction routine) can be selectively reduced as befits the needs of a particular application. Thus, as will be discussed in FIGS. 13A-13D, 14A-14D, 15A-15D, and 16A-16C, for a given correctable BER (which may be determined experimentally for a particular resistive change element array design), the number of flags and the size of the subsections may be selected to optimize the performance and minimize the parity overhead of a resistive change element array, without reducing the effectiveness of the error correction routine.

In addition to the improvements in parity overhead (as discussed above), the reduced number of parity cells realized using the DFEC methods of the present disclosure can also reduce decoding latency with an error correction operation. For example, BCH ECC decoding latency, $t_{ECC}$, is given by:

$$t_{ECC} = (m*t/p + (t+1)f/2 + t - 1 + n/p)/F \qquad \text{EQ3}$$

Within EQ3, m is the number of required parity bits to recover one bit error (as given by EQ1), n is BCH ECC code length (that is, the number of data bits, plus the number of flag bits, plus the number of parity bits for secondary error correction scheme which equals to m*t when BCH is used), p is the number of decoding circuits to work in parallel, f is the circuit folding factor, F is circuit operating frequency in MHz, and t is the number of BCH ECC correctable bits. Using EQ3, an exemplary 512-byte resistive change element array wherein m=13 (as given by EQ1), t=8 (corresponding to a 0.2% correctable BER), p=32, f=12, F=200, and n=4200 (4096 data bits+104 parity bits) would have a BCH decoding latency of 0.98 µs. However, as discussed above, using the DFEC methods of the present disclosure, the number of BCH ECC correctable bits "t" can be significantly reduced for a required correctable BER. For example, if the single-flag DFEC method of the present disclosure can be expected to correct four errors within this exemplary array, "t" within EQ3 can be reduced to 4, resulting in a BCH ECC decoding latency of 0.82 µs. The decoding latency for the single-flag DFEC method of the present disclosure can be ignored because the method can be implemented using a relatively simple decoding circuit (as discussed with respect to FIG. 12B above). As such, within this example, the RFEC method of the present disclosure provides a 16% improvement in total ECC decoding latency. Such an improvement in performance can be highly desirable within certain applications such as, but not limited to, solid state hard drives and non-volatile memory applications.

To this end, FIGS. 13A-13D, 14A-14D, 15A-15D and 16A-16C illustrate the effects of subsection size selection and correctable BER on the parity overhead and ECC decoding latency within an exemplary resistive element change array for three DFEC methods. FIGS. 13A-13D are directed at the optimization of the single-flag DFEC (RFEC) method of the present disclosure by varying subsection size, while FIGS. 14A-14D and 15A-15D demonstrate this optimization with the dual reverse flag (DRFEC) and three-flag 2-bit advanced bit flip (ABF) methods, respectively. FIGS. 16A-16C provide a comparison of these three DFEC methods of the present disclosure for different correctable BERs and subsection sizes. It should be noted, however, that the statistical analysis presented in FIGS. 13A-13D, 14A-14D, 15A-15D and 16A-16C is for illustrative purposes only in order to highlight the ways in which optimization of the DFEC methods for specific applications may be accomplished. As such, the data presented in FIGS. 13A-13D, 14A-14D, 15A-15D and 16A-16C is exemplary and in no way should be taken to reflect experimental data. The conclusions drawn therefrom may differ according to the properties and performance of a particular resistive change element array and the engineering requirements of real applications.

Figure 16A:
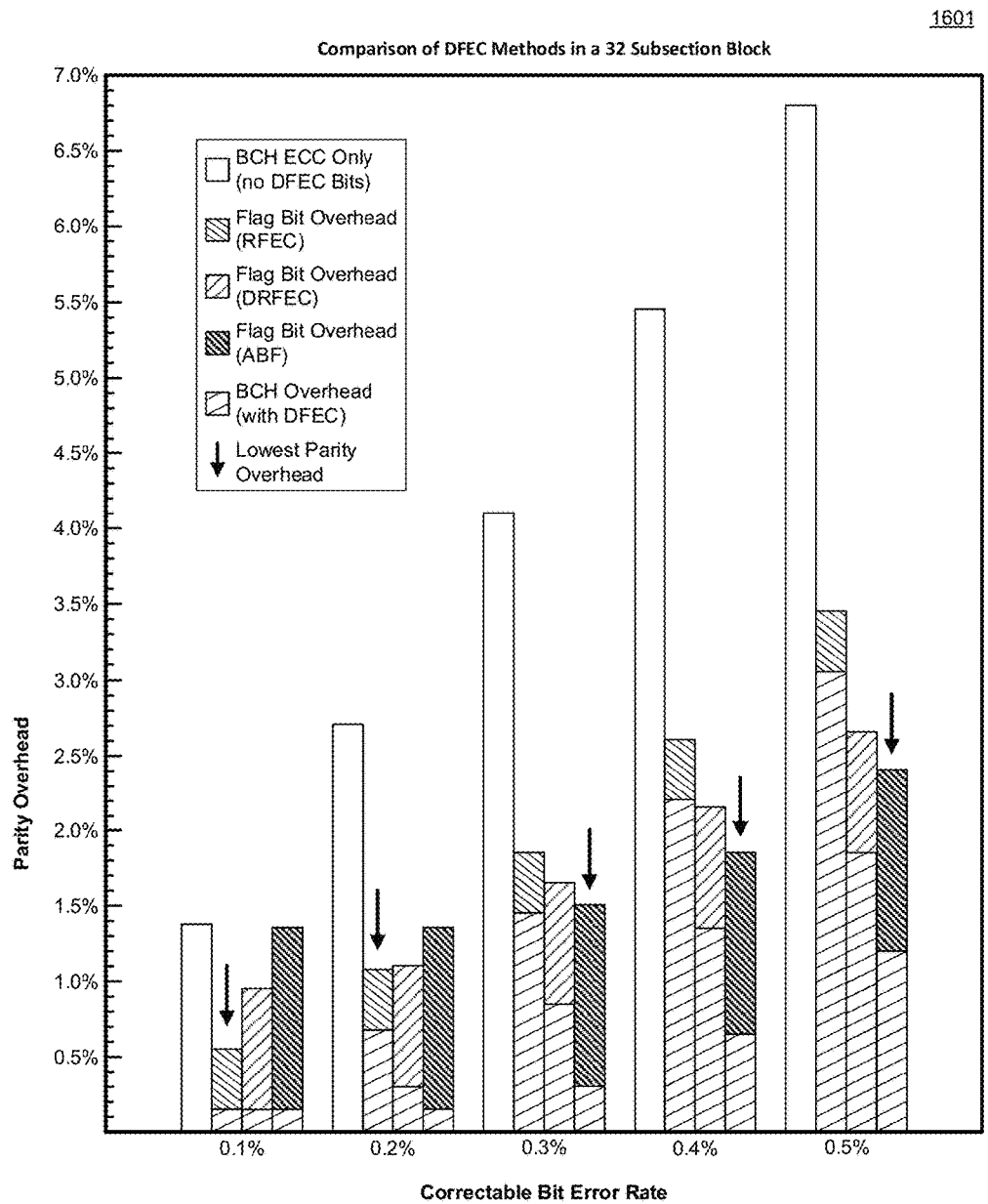
FIG. 16A is a bar graph comparing the parity overhead for an exemplary thirty-two subsection array configured for use with the RFEC, DRFEC, and ABF methods of the present disclosure with the parity overhead required for conventional BCH methods alone at five correctable bit error rates.
Figure 16B:
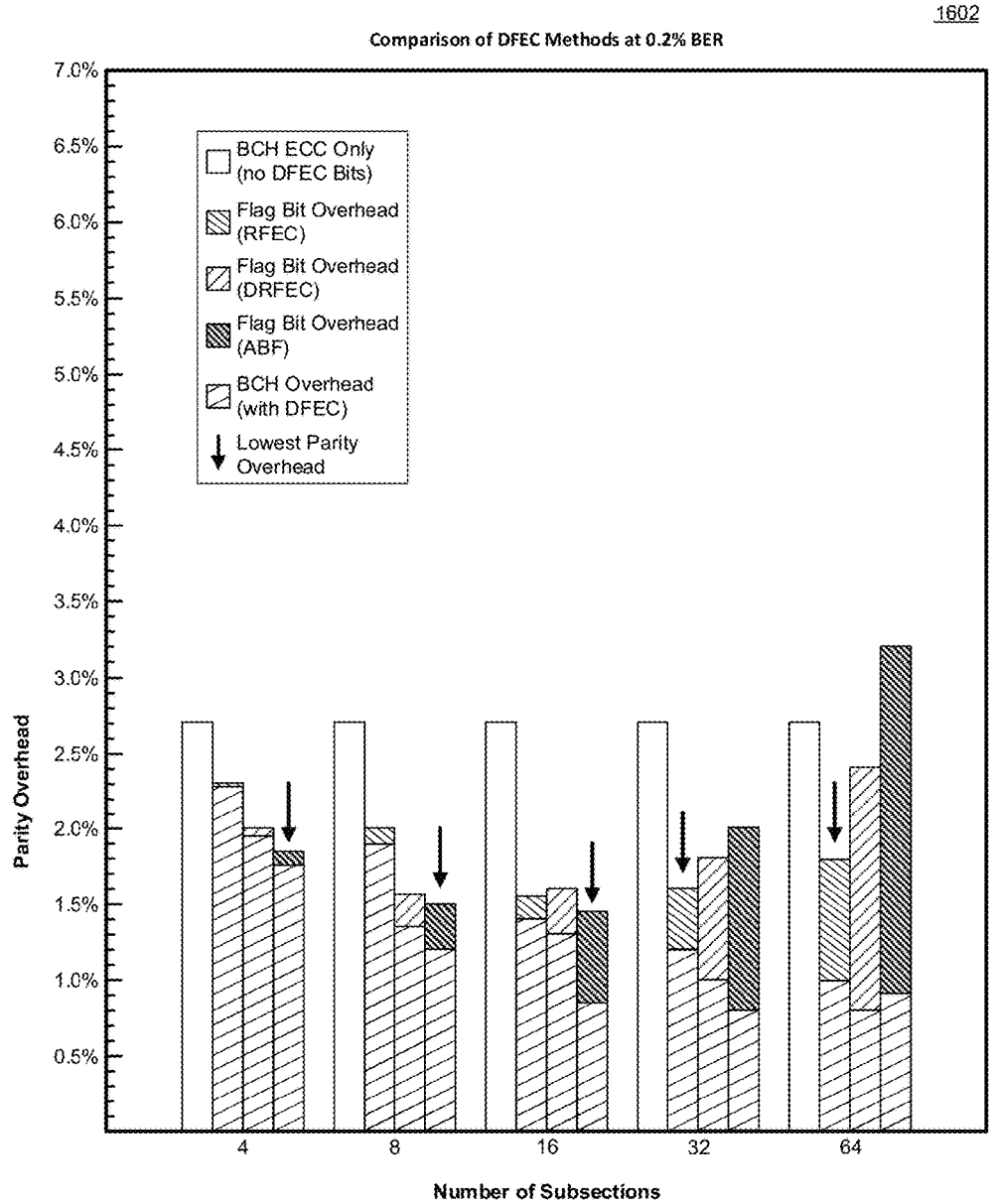
FIG. 16B is a bar graph comparing the parity overhead of the array configurations detailed in FIGS. 13A, 14A, and 15A (using the methods of the present disclosure) with the parity overhead required for conventional BCH methods alone to achieve a correctable BER of 0.2%.
Figure 16C:
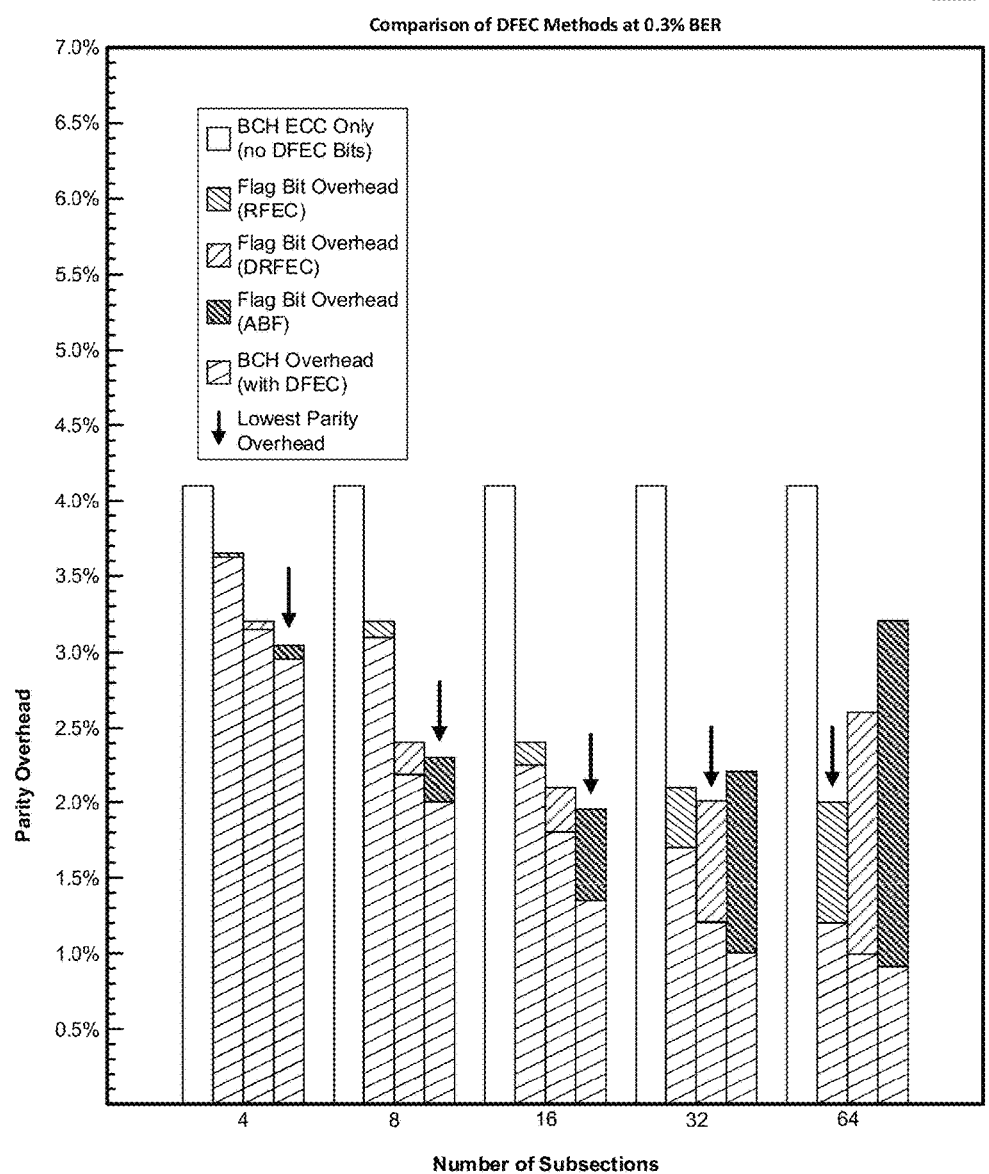
FIG. 16C is a bar graph comparing the parity overhead of the array configurations detailed in FIGS. 13A, 14A, and 15A (using the methods of the present disclosure) with the parity overhead required for conventional BCH methods alone to achieve a correctable BER of 0.3%.
Figure 17A:
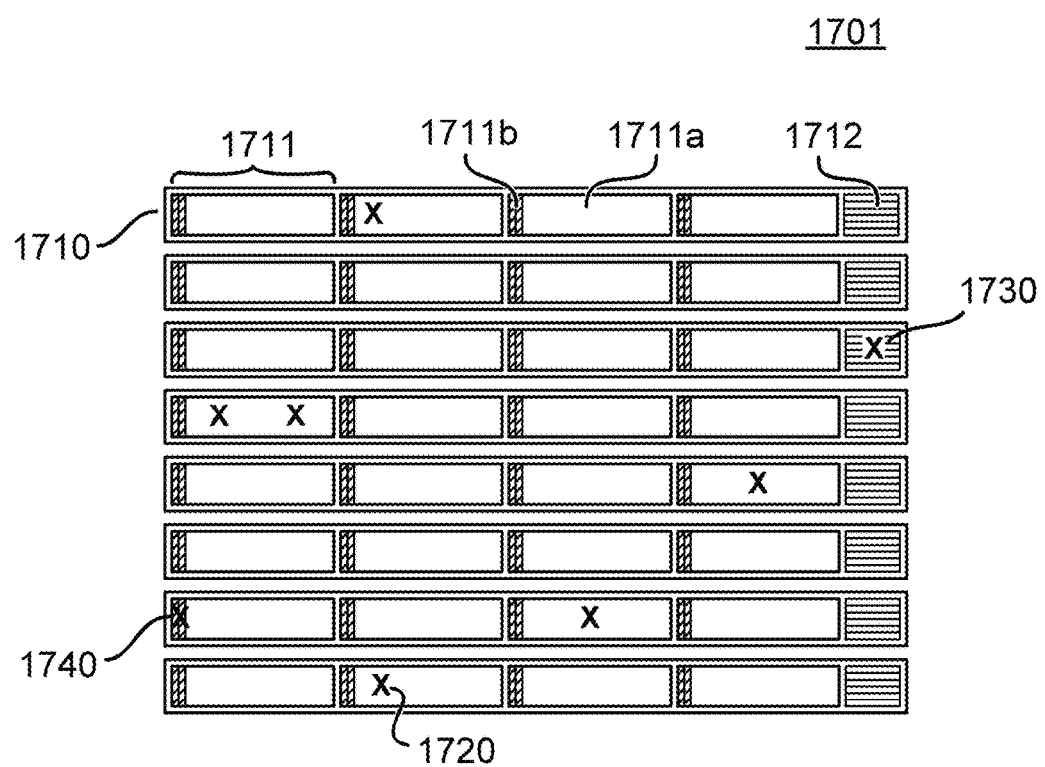
FIG. 17A is a diagram of an exemplary resistive element array with 8-kilobyte user data divided into eight blocks with 1-kilobyte user data, each block divided into four array subsections and using the dual reverse flag error correction (DRFEC) method of the present disclosure.
Figure 22A:
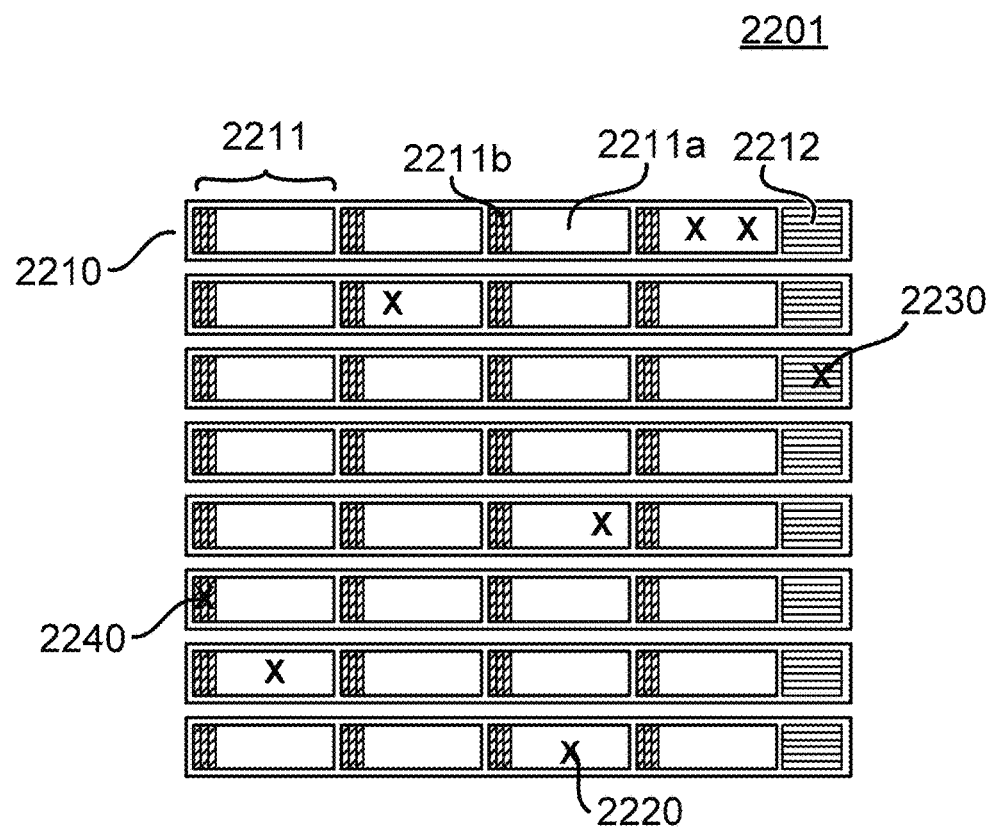
FIG. 22A is a diagram of an exemplary resistive element array with 8-kilobyte user data divided into eight blocks with 1-kilobyte user data, each block divided into four array subsections and using the three-flag advanced bit flip (ABF) method of the present disclosure.

The exemplary resistive change element array used in FIGS. 13A-3D, 14A-14D, 15A-15D and 16A-16C is an 8 kilobyte array arranged into eight 1 kilobyte blocks of user data, analogous to array 901 in FIG. 9A, array 1701 of FIG. 17A, or array 2201 of FIG. 22A, depending on the DFEC method employed. The error distribution within this exemplary resistive change element array is assumed to be 75% RESET and 25% SET, as described previously in FIGS. 7A-7D, unless otherwise noted. As such, the initialization state of the array is taken to be RESET according to the state which is expected to result in a higher proportion of errors, though the invention is not limited in the initialization state chosen.

FIG. 13A is a table 1301 detailing the parity overhead for the exemplary 8 kilobyte resistive change element array with five different subsection sizes, wherein a correctable BER of 0.2% is required. As such, a correctable BER of 0.2% would require an error correction routine to be capable of correcting 16 errors per block (16 errors divided by 8192 bits/block+parity bits/block yielding about 0.2%). Since the exemplary resistive change element array of FIG. 13A can be expected to yield 75% RESET errors and 25% SET errors, a suitable error correction routine for such an array will be required to correct 12 RESET errors and 4 SET errors within each one kilobyte (8192 bit) block of user data. Within the exemplary array of FIG. 13A, the RFEC method of the present disclosure is used in a first operation (requiring one flag bit per subsection), and a BCH error correction cycle (requiring parity bits according to EQ. 1 as described above) is used in a second operation (as is described within FIG. 10 and illustrated in FIGS. 11A-11E) to realize a correctable BER of 0.2%.

Looking again to FIG. 13A, each row of table 1301 demonstrates a single block of this exemplary resistive change element array with one kilobyte of user data divided into a different number of subsections (4, 8, 16, 32, and 64 subsections within the first through fifth rows of table 1301, respectively). For each subsection configuration, the flag bit parity overhead, the BCH parity bit overhead, and the total parity overhead are calculated using EQ1 and EQ2 as described in detail above.

Within the first row of table 1301, each one kilobyte data block within the exemplary resistive change element array is divided into four (4) subsections, with each subsection containing 256 bytes (1024/4=256) or 2048 bits. Ideally, the single-flag DFEC method of the present disclosure can be expected to correct at least one RESET error per subsection (RESET being the initialization condition within the exemplary array). However, as defined above, within the exemplary resistive change element array of FIG. 13A it is assumed that RESET errors will occur only 75% of the time. Further, due to the statistical distribution of these RESET errors (that is, some subsections may contain no errors, or multiple errors), the four distributed flag bits within each block (one flag bit per subsection) will be statistically capable of correcting only three (3) RESET errors per block, as indicated by the fourth column of table 1401, which is less than the ideal case wherein each flag bit corrects at least a single error. Thus, as can be seen in rows three through five, due to the error distribution the DFEC methods may not be expected to correct all of the errors in the array. With each of the subsections including one flag bit and 2048 data bits, this configuration yields a flag bit parity overhead of 0.05% (using EQ2: 1 flag bit/2048 data bits=0.05%).

Looking now to the sixth column of table 1301 (BCH Correctable Errors), as the single-flag DFEC method of the present disclosure can be expected to correct three (3) RESET errors within a first operation, a BCH error correction routine used in a second operation only needs to address the remaining nine (9) RESET errors and the four (4) SET errors to realize a 0.2% correctable BER, as described above. As such, the BCH error correction cycle only needs to correct 13 errors total. Using EQ1 as described above, it can be seen that a BCH error correction cycle requires 14 BCH parity bits to correct a single error within a 1 kilobyte block of user data. As such, correcting the remaining 13 errors with a BCH routine requires 182 BCH parity bits (14 BCH parity bits×13 errors), as listed in the seventh column of table 1301. Using EQ2, this yields a BCH parity overhead for the entire block of 2.2% (182 BCH parity bits/8192 data bits) and a total parity overhead for the block of 2.3% (186 total parity bits/8192 data bits), as shown in the eighth and ninth columns of table 1301, respectively. This parity overhead can be compared to an error correction scheme using BCH alone, wherein the BCH error correction cycle would be required to correct all 16 errors. Using EQ1, such a system using only BCH ECC would require 224 BCH parity bits (14 BCH parity bits×16 errors), yielding a total parity overhead (from EQ2) of 2.7% (224 BCH parity bits/8192 data bits). Looking to the tenth column of table 1301, the decoding latency for the 182 BCH parity bits (as given by EQ3, discussed in detail above) is 1.18 µs for this four subsection configuration. This can be compared to an ECC decoding latency of 1.30 µs for a BCH ECC only system, which would require 224 BCH parity bits, as described above. As such, the use of the RFEC method of the present disclosure provides a significant reduction in parity overhead and ECC decoding latency as compared with using a BCH error correction cycle alone.

The next four rows of table 1301 repeat the above calculations for array blocks that are divided into 8, 16, 32, and 64 subsections, respectively. As can be seen from the second row of table 1301, eight 128-byte subsections are capable of correcting 5 RESET errors in an 8-kilobyte block, leaving only 7 RESET errors and 4 SET errors for the BCH error correction cycle and yielding a total parity overhead of 2.0% and a decoding latency of 1.10 µs. Parity overhead is further improved, as shown in the third row of table 1301, by using sixteen 64 byte subsections. Within such a configuration, the DFEC flag bits can be expected to correct 8 RESET errors, leaving only 4 RESET and 4 SET errors for a BCH error correction cycle and yielding a total parity overhead of 1.6% and a decoding latency of 0.98 µs.

Looking to the fourth row of table 1301, using thirty-two 32-byte subsections provides 32 DFEC flag bits within each block, which are assumed to correct 9 RESET errors. However, despite this increase as compared with a sixteen subsection block, the reduction in BCH parity bits is compensated by an increased number of flag bits. As such, the parity overhead required to realize 0.2% correctable BER with such a configuration remains at 1.6%, nearly the same as for the sixteen subsection configuration, and the ECC decoding latency is slightly improved to 0.94 µs. Looking to the fifth row of table 1301, it is shown (using the same calculations) that a configuration of sixty-four 16-byte subsections further increases total parity overhead to 1.8%, with the ECC decoding latency reducing further to 0.9 µs.

Figure 13B:
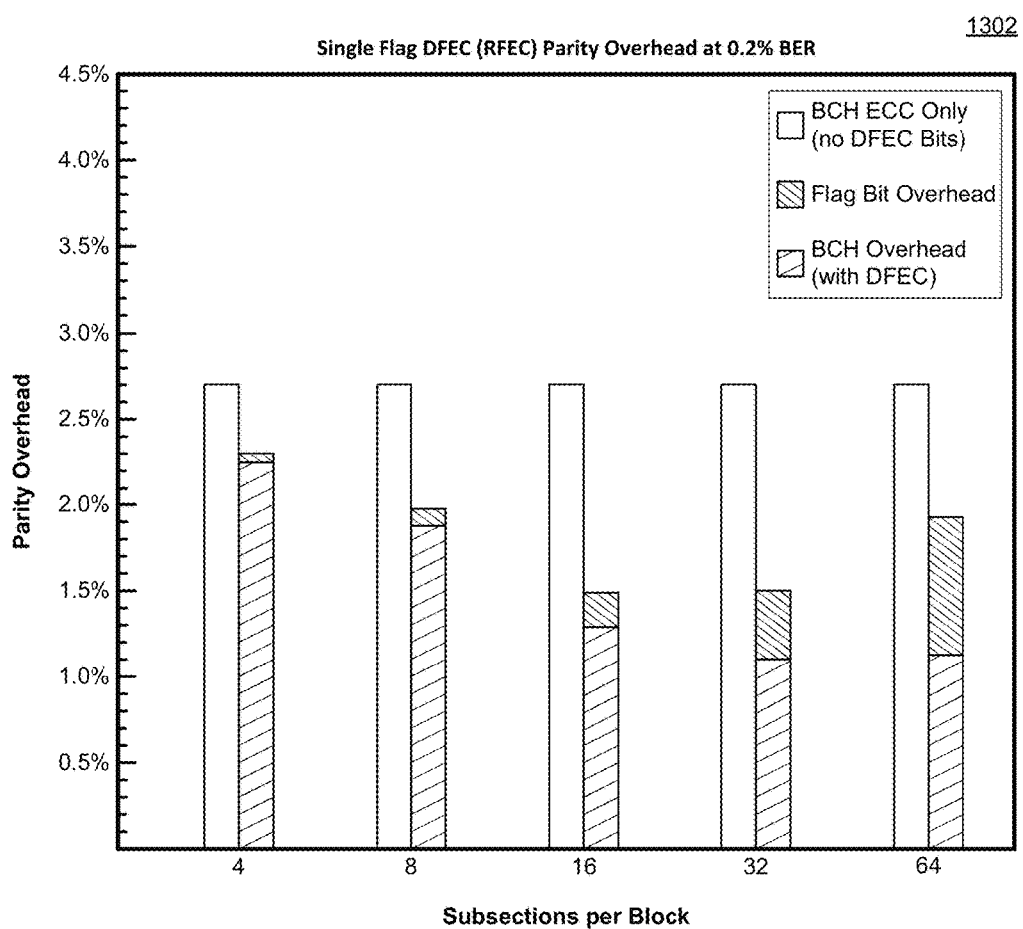
FIG. 13B is a bar graph comparing the parity overhead of the array configurations detailed in FIG. 13A (using the RFEC method of the present disclosure) with the parity overhead required for conventional BCH methods alone.

FIG. 13B is a bar graph 1302 plotting the parity overhead calculations for each configuration within FIG. 13A compared with the parity overhead of a BCH ECC only configuration (2.7%, as described in detail above). As shown within the bar graph plot 1302, for the exemplary resistive change element array of FIG. 13A (as defined in detail within the discussion of that figure), the DFEC configuration that provides the lowest overall parity overhead is a configuration using 16 flag bits to delimitate sixteen 64-byte subsections per block. As described above, such a configuration would use 16 flag bits (1 flag bit for each subsection) to correct 8 RESET errors and 112 BCH parity bits to correct 4 RESET and 4 SET errors, yielding a total parity overhead of 1.6%.

Similarly, FIG. 13C is a table 1303 detailing the parity overhead for an exemplary resistive change element array over five different subsection sizes wherein a correctable BER of 0.3% is required. The exemplary resistive change element array used within the calculations of table 1303 is identical to the array used within FIGS. 13A and 13B, however, in this case RESET errors are expected to occur 83% of the time (for 24 total errors, 20 are expected to be RESET and 4 are expected to be SET errors). For such a resistive change element array, a correctable BER of 0.3% requires an error correction routine capable of correcting 24 errors (20 RESET errors and 4 SET errors) within a 1-kilobyte block of user data.

Using the same calculations as discussed with respect to FIG. 13A, the first row of table 1303 shows that for an array configuration of four 256-byte subsections per 1 kilobyte block, the single-flag DFEC method of the present disclosure can be expected to provide a total parity overhead of 3.6% with a decoding latency of 1.33 µs for a correctable BER of 0.3% (as compared to a 4.1% parity overhead with a decoding latency of 1.61 µs for a BCH only system). Similar calculations for the next four rows show total parity overheads of 3.2%, 2.4%, 2.1%, and 2.0% and ECC decoding latencies of 1.14 µs, 0.98 µs, 0.90 µs, and 0.86 µs for configurations of 128 bytes per subsection, 64 bytes per subsection, 32 bytes per subsection, and 16 bytes per subsection, respectively. As with the exemplary configurations of FIGS. 13A and 13B, within the configurations of FIG. 13C, a suitable subsection size for a given application is determined by plotting the results of these calculations within the bar graph plot 1304 of FIG. 13D.

Figure 13D:
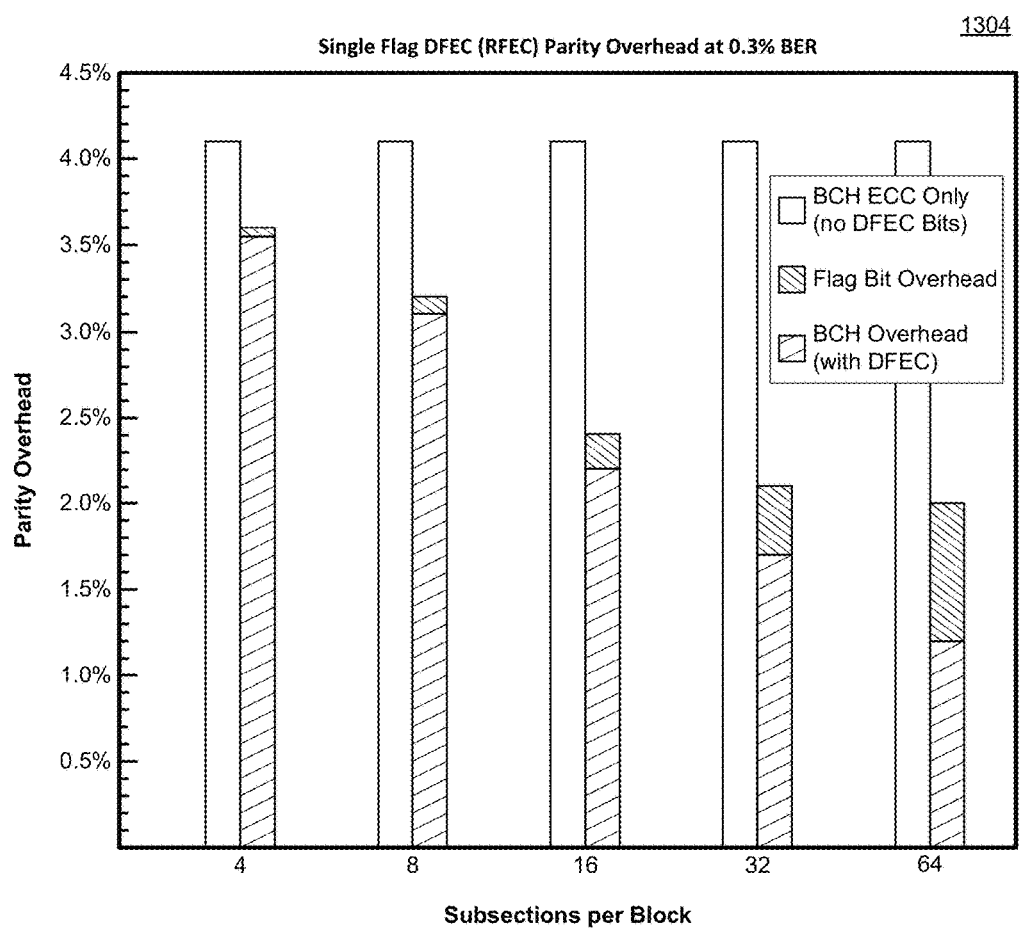
FIG. 13D is a bar graph comparing the parity overhead of the array configurations detailed in FIG. 13C (using the RFEC method of the present disclosure) with the parity overhead required for conventional BCH methods alone.

Looking now to FIG. 13D, it is shown that for a 0.3% correctable BER, the exemplary resistive change element array of FIG. 13C would use the lowest total parity overhead using a configuration of sixty-four 16-byte subsections per block. Such a configuration would use 64 flag bits (1 flag bit for each subsection) to correct 9 RESET errors and 98 BCH parity bits to correct 3 RESET and 4 SET errors, yielding a total parity overhead of 2.0%. As with the results of FIGS. 13A and 13B, this parity overhead can be compared to an error correction scheme using BCH alone, wherein the BCH error correction cycle would be required to correct all 24 errors. Using EQ1 again, such a system using BCH ECC alone would require 336 BCH parity bits (14 BCH parity bits×24 errors), yielding a total parity overhead (from EQ2) of 4.1% (336 BCH parity bits/8192 data bits). As such, the use of the single-flag DFEC method of the present disclosure provides a significant reduction in parity overhead as compared with using BCH error correction cycle alone.

It should again be noted that the selection of a subsection size as detailed in FIGS. 13A-13D and further examples below is dependent on the specific parameters of a resistive change element array such as are described in detail with respect to those figures above. Such parameters include, but are not limited to, the size of the resistive change element array, the required correctable BER, the expected error rate, the distribution and type of errors within the array, and the type and configuration of the secondary error correction routine used in conjunction with the DFEC methods of the present disclosure. The calculations described above and the results listed and plotted within FIGS. 13A-13D are intended as non-limiting, illustrative examples. For a given application, careful consideration of such parameters and the specific needs of the application can be used to select the most suitable array configuration (as described above) for use with the DFEC methods of the present disclosure.

It should also be noted that the combination of the DFEC methods of the present disclosure with a second error correction method (such as a BCH ECC method, as discussed throughout the present specification) can be useful as the second error correction method can be used to recover data retention errors as well as programming errors. As previously discussed, the DFEC methods of the present disclosure can only be used to correct initialization errors introduced during a programming operation. Within certain applications, other types of errors (such as, but not limited to, data retention errors) can also be present within a resistive change element array. As such, the use of the DFEC methods of the present disclosure in concert with a second error correction scheme can be highly desirable within such applications.

FIGS. 14A-14D repeat the above calculations for the dual reverse flag error correction (DRFEC) DFEC method, in which two flags are used to indicate the presence of errors on an even or an odd data bit. As discussed previously, the exemplary resistive change element array of FIGS. 14A-14D is identical to that of FIGS. 13A-13D, except that it has been configured to use two flag bits per subsection rather than one. The additional flag bit may allow a greater percentage of errors to be corrected by the DRFEC method, particularly continuous errors (errors occurring on two adjacent data bits).

FIG. 14A is a table 1401 detailing the necessary parity overhead to achieve a 0.2% correctable BER in a single resistive change element block at different subsection sizes, using the DRFEC method of the present disclosure. Theoretically, each DRFEC flag may be expected to correct at least one odd and at least one even error in a subsection, an improvement over the single-flag DFEC method described above. However, as shown in the third column of 1401 and discussed previously, a 0.2% BER on a 1-kilobyte block results in 16 errors per block—12 RESET and 4 SET errors—which occur randomly across the array. Larger subsections, such as the first two rows of table 1401, are therefore likely to contain multiple errors which cannot all be corrected, while small subsections may contain zero errors due to the statistical nature of error distribution. Thus, as can be seen in the fourth column of table 1401, the four subsection (8 flag) configuration may only be expected to correct 5 errors, the eight subsection (16 flag) configuration may only correct 8 errors, the sixteen subsection configuration may only be able to correct 9 errors, and so on for the smaller subsections.

The random nature of error occurrence, therefore, may require optimization of the subsection size to achieve a given correctable BER with greatest efficiency. The sixth column of table 1401 details the errors remaining after use of the DFEC methods which must be corrected by BCH ECC. As can be seen in the first row, for instance, BCH must correct 7 RESET and 4 SET errors. From EQ1 above, BCH requires 154 parity bits (14 parity bits/error×11 errors) to correct all remaining errors in the array, yielding a total parity overhead of 2.0%, as seen in the ninth column, which includes both BCH parity bits and eight (8) DFEC flag bits. This may be compared to the 224 BCH parity bits and 2.7% parity overhead required to correct all 16 errors using BCH ECC alone. Looking now at the eight and sixteen subsection configurations, it may be seen that smaller subsections result in fewer required BCH parity bits but also result in higher flag bit overhead. Thus, the overall parity overhead remains nearly constant between these two subsections despite reducing the number of BCH parity bits. Reducing the subsection size further continues to reduce the BCH parity overhead, but this reduction is outweighed by the increasing flag bit overhead. Indeed, at sixty-four subsections, the overall parity overhead of 2.4% nearly reaches the overhead required for BCH alone, 2.7%. That said, however, reducing the number of BCH parity bits may also improve decoding latency according to EQ3, as shown in the tenth column of 1401. Using four subsections, for instance, may reduce the decoding latency from 1.3 µs for BCH alone to 1.1 µs for the DRFEC method, while using thirty-two subsections may reduce the latency further to 0.9 µs. Thus, smaller subsections, such as those of the thirty-two subsection configuration, may reduce the decoding latency despite increasing the overall parity overhead. As will be shown in at least FIG. 14B, these tradeoffs may be used to optimize the DFEC configuration employed for a specific application. In this way, the DRFEC method of the present disclosure may be used to improve the efficiency of error correction in a resistive change element array.

Figure 14B:
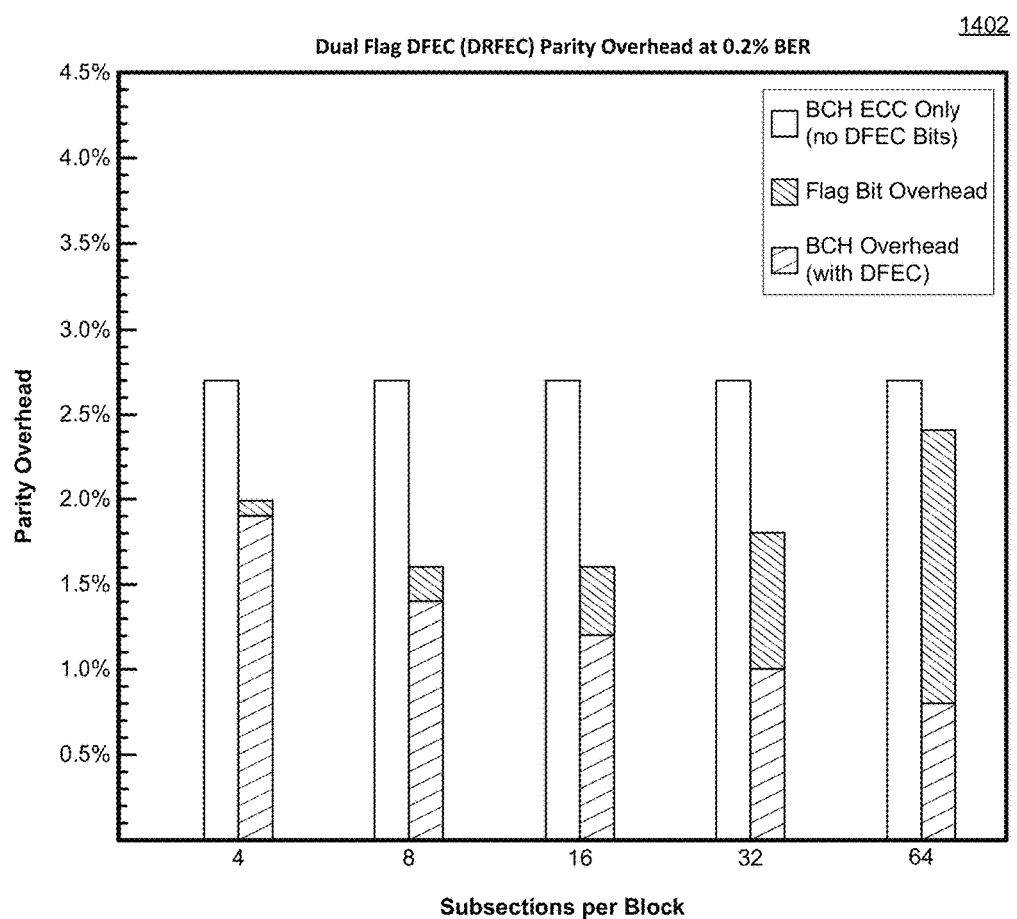
FIG. 14B is a bar graph comparing the parity overhead of the array configurations detailed in FIG. 14A (using the DRFEC method of the present disclosure) with the parity overhead required for conventional BCH methods alone.

FIG. 14B depicts the overall parity overhead data displayed in table 1401 graphically in chart 1402. As explained previously, using BCH ECC alone would require 224 parity bits (14 parity bits/error×16 errors) to correct all of the errors, yielding a parity overhead of 2.7%. As can be seen, all of the DRFEC subsection configurations provide reduced parity overhead compared to BCH ECC alone. The eight and sixteen subsection configurations, however, have nearly identical parity overhead, at 1.6%. In some applications, therefore, since 1.6% also happens to be the smallest parity overhead in these examples, the sixteen subsection configuration may be ideal over the eight subsection configuration, as it possesses lower decoding latency due to the smaller number of BCH parity bits. In this way, the DRFEC configuration may be selected according to the requirements of a specific application.

FIG. 14C is a table 1403 detailing the necessary parity overhead to achieve a 0.3% correctable BER in a single resistive change element block at different subsection sizes, using the DRFEC method of the present disclosure. In this case, however, the RESET error proportion in the array is slightly higher, at 83%. Thus, for 24 total errors (0.3% of 8192 data bits), 20 RESET and 4 SET errors may be expected. As described with respect to FIGS. 14A and 14B above, the DFEC flag bits may not be able to correct as many errors as their theoretical maximum due to the statistical nature of the error distribution. Even so, as can be seen in table 1403, the DRFEC method may be used to dramatically reduce the number of BCH parity bits. The sixteen subsection configuration, for instance, can be expected to correct 14 errors, thereby reducing the number of BCH parity bits from 336 (14 parity bits/error×24 errors) for BCH alone to 140, and the total parity overhead from 4.1% to 2.1%-nearly a 50% reduction.

Figure 14D:
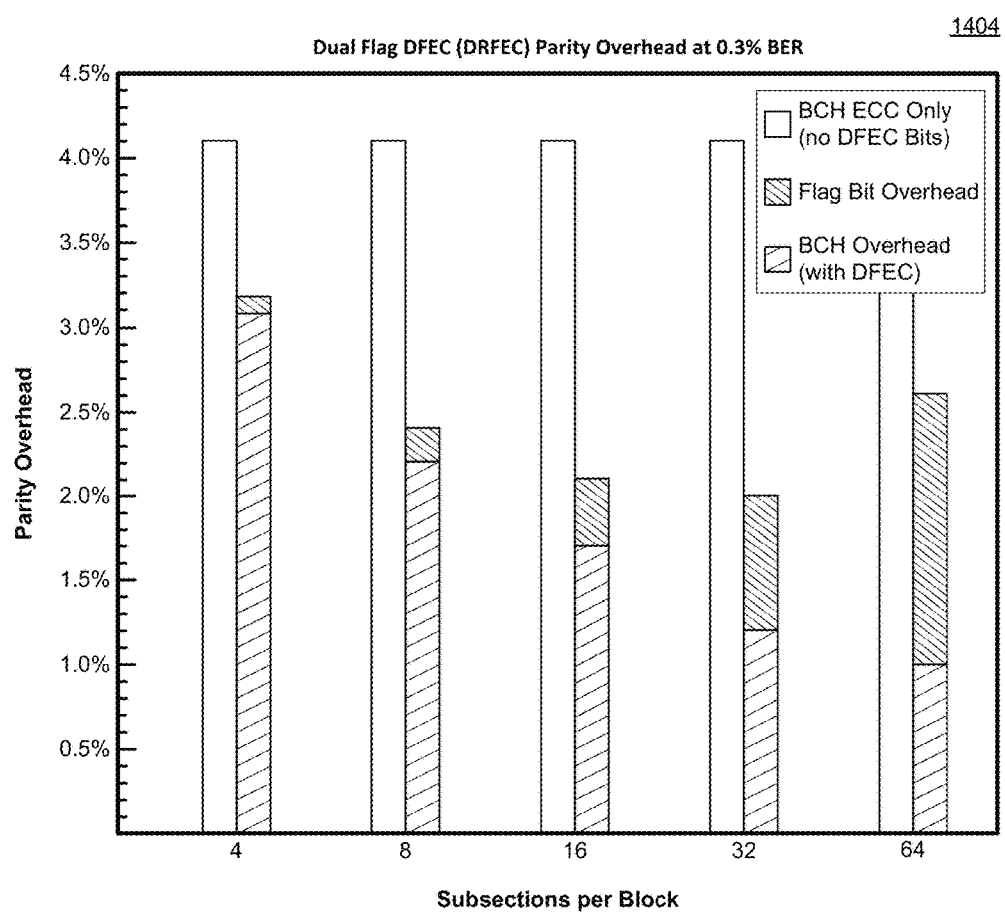
FIG. 14D is a bar graph comparing the parity overhead of the array configurations detailed in FIG. 14C (using the DRFEC method of the present disclosure) with the parity overhead required for conventional BCH methods alone.

In order to determine the optimal configuration for these conditions, FIG. 14D plots the data of table 1403 in chart 1404. Here, the DRFEC method may be seen to dramatically reduce the parity overhead compared to BCH alone. In this case, the thirty-two subsection configuration may be seen to have the smallest parity overhead—2.0%. Recalling the previous examples of FIG. 14A and 14B at 0.2% BER, in which the optimal configuration was a sixteen subsection block, it is clear that a higher BER requires smaller subsections to separate the errors into separate subsections. This demonstrates the ability to optimize the DFEC configuration based on the expected correctable BER and the requirements of specific applications.

FIGS. 15A-15D repeat the above exemplary statistical analysis for the three-flag 2-bit advanced bit flip (ABF) DFEC method of the present disclosure, wherein three flag bits are used to store a pattern reference code (PRC) corresponding to an encoding pattern which encodes a set of input data which has been divided into 2-bit subsets. As mentioned previously, the exemplary resistive change element array used in these examples is identical to those of FIGS. 13A-13D and 14A-14D above, except that it has been configured with three DFEC flag bits per subsection. Again, it should be noted that the statistical analysis presented in FIGS. 15A-15D, as well as FIGS. 13A-13D and 14A-14D above, is for illustrative purposes only, in order to highlight the ways in which optimization of the DFEC methods for specific applications may be accomplished. As such, the data presented in FIGS. 15A-15D, and in FIGS. 13A-13D and 14A-14D above, is exemplary and in no way should be taken to reflect experimental data. The conclusions drawn therefrom may differ according to the properties and performance of a particular resistive change element array and the engineering requirements of real applications.

Looking now to FIG. 15A, table 1501 details the required BCH parity bits and total parity overhead for five subsection sizes using the three-flag 2-bit ABF method of the present disclosure. As described previously and in more detail below, this ABF method is guaranteed to correct at least two initialization errors per subsection (if two errors in fact occur), leading to a substantially improved error correction rate. This may be seen in the fourth column, wherein the four subsection method may correct 6 RESET errors (compared to the RFEC and DRFEC methods, which may correct only 3 and 5 RESET errors, respectively). Hence, at sixteen subsections, the total parity overhead is reduced to 1.4%, compared to the 2.7% overhead required for BCH alone. It can be seen, however, that at sixteen subsections essentially all RESET errors are corrected by this ABF method alone—11 of the total 12 RESET errors—and that smaller subsections do not improve the number of errors corrected. Accordingly, the number of BCH parity bits reaches a minimum at 70 parity bits for the sixteen subsection configuration, and smaller subsections increase the number of flag bits substantially without affecting the BCH parity overhead, leading to an increase in overall parity overhead. Indeed, at sixty-four subsections the overall parity overhead is 3.1%, which is even larger than the parity overhead for BCH alone (2.7%).

Figure 15B:
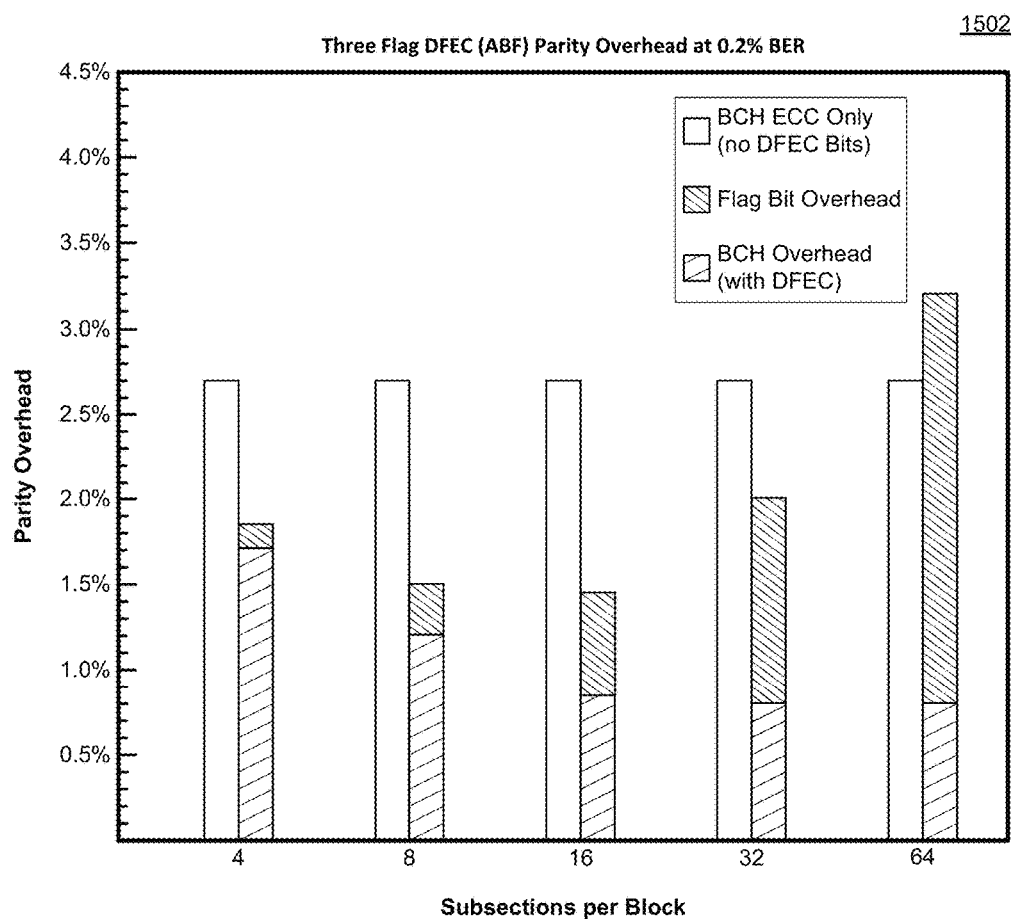
FIG. 15B is a bar graph comparing the parity overhead of the array configurations detailed in FIG. 15A (using the ABF method of the present disclosure) with the parity overhead required for conventional BCH methods alone.

Thus, as shown in chart 1502 of FIG. 15B, the three-flag ABF method is most efficient at sixteen subsections. Increasing the number of subsections further simply increases the flag bit overhead without reducing the number of BCH parity bits. This behavior is similar to that shown in FIGS. 13B and 14B, but is exacerbated by the larger number of flag bits per subsection. That said, as will be discussed in detail with respect to FIGS. 16A-16C, this ABF method is clearly the most effective of the DFEC methods considered at correcting errors, despite significantly reduced efficiency at smaller subsections. This highlights the ability to tailor the DFEC methods to specific applications, both in terms of the DFEC method employed (RFEC, DRFEC, or ABF), and in the specific configurations thereof.

FIG. 15C continues this analysis of the three-flag 2-bit ABF method for a correctable BER of 0.3%, detailed in table 1503. As with FIGS. 13C and 14C, the proportion of RESET errors in this case is taken to be 83% (20 RESET errors per 24 total errors) rather than 75%, as in FIG. 15A. The higher number of errors, and higher proportion of RESET errors, is expected to impact the optimization of this ABF method by increasing the likelihood of multiple errors in a single subsection. Thus, it may be seen that, unlike in FIG. 15A, the number of errors corrected by this ABF method does not reach a maximum in the examples provided. That said, however, the lowest total parity overhead still occurs at sixteen subsections—2.0%, compared to the 4.1% required for BCH alone—while the number of BCH parity bits and decoding latency continues to decrease with smaller subsections.

Figure 15D:
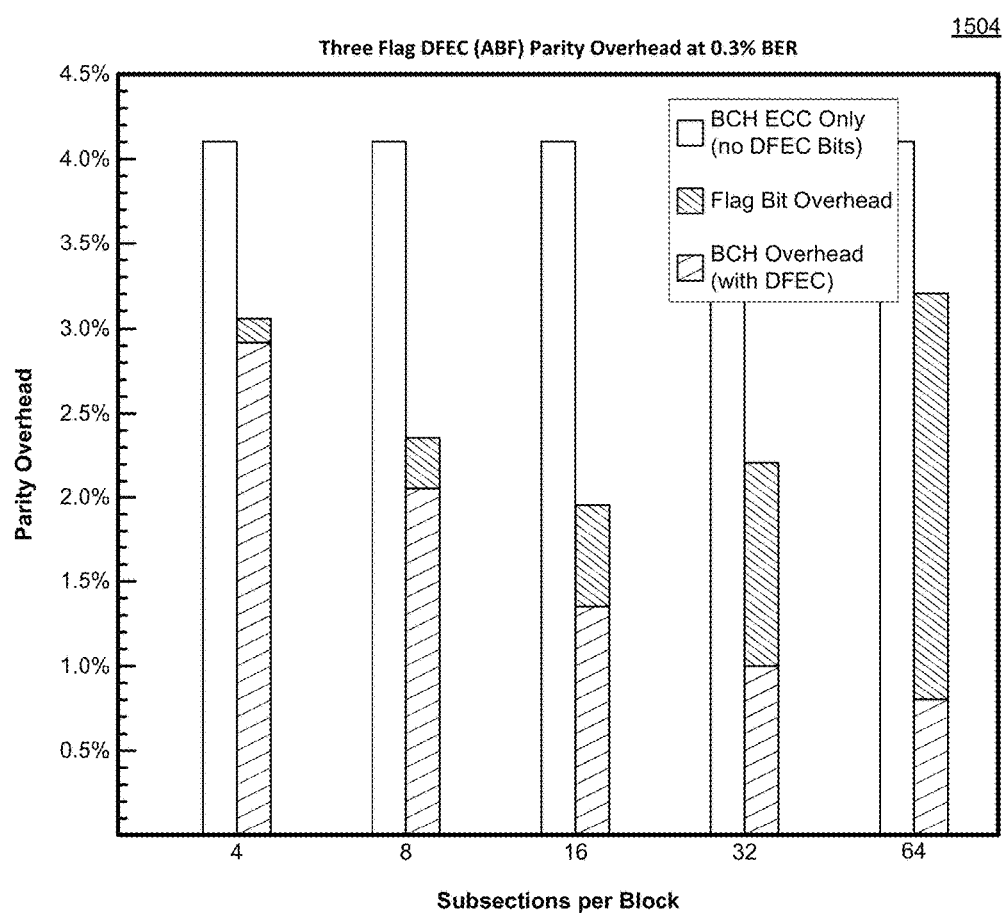
FIG. 15D is a bar graph comparing the parity overhead of the array configurations detailed in FIG. 15C (using the ABF method of the present disclosure) with the parity overhead required for conventional BCH methods alone.

FIG. 15D depicts these results graphically in chart 1504. Here it may be seen that between four and sixteen subsections the total parity overhead decreases rapidly. Beyond this, the increase in flag bit parity overhead outweighs the decrease in BCH parity overhead, but unlike FIG. 15B still provides a reduced parity overhead when compared to BCH alone. The sixteen subsection configuration may therefore be considered the ideal configuration in certain applications. In other applications, however, the reduced decoding latency at thirty-two subsections (as a result of the smaller number of BCH parity bits) may be more important than the small increase in parity overhead over the sixteen subsection configuration—2.2% compared to 2.0%. Thus, this ABF method may be more efficient at high correctable BER due to its higher effectiveness at error correction, and may be optimized according to the needs of a specific application.

These trends may be seen clearly in the comparison of these three DFEC methods depicted graphically in FIGS. 16A-16C. FIG. 16A is a chart 1601 comparing the total parity overhead for the RFEC (single-flag), DRFEC (dual-flag) and three-flag 2-bit ABF methods to BCH alone for different correctable bit error rates. In this example a thirty-two subsection configuration is used, giving a total of 32, 64 and 96 flag bits per block for the three DFEC methods, respectively. Further, in this example, the error distribution is taken to be 100% RESET. That is, for a 0.2% BER, a RESET error rate of 0.2% is expected, unlike the previous examples in which a 75% RESET error rate is assumed, wherein a BER of 0.2% would result in a RESET error rate of 0.15%. Thus, compared to previous examples at 0.2% BER, the total number of errors is the same but the number of RESET errors has increased. As indicated by the arrows, at the lowest BER of 0.1%, the RFEC method is most efficient, since few errors are expected and a single flag is sufficient. At 0.2% BER, both the RFEC and DRFEC methods provide comparable parity overhead (about 1.1%). In this case, although the RFEC method provides slightly lower overhead, the DRFEC method significantly reduces the number of BCH parity bits, resulting in lower decoding latency (0.78 μs compared to 0.82 μs). Depending on the needs of a particular application, either method may be considered advantageous.

At higher BER (above 0.2%), the three-flag ABF method proves more efficient in both parity overhead and decoding latency. As explained previously, this is a result of the higher effectiveness of this ABF method at correcting RESET errors despite requiring a larger number of flag bits. Indeed, at a correctable BER of 0.5%, this ABF method may require a parity overhead of only 2.4% compared to 6.8% for BCH alone. This implies a reduction of nearly 65%. In this way, the DFEC methods of the present disclosure may be used to dramatically reduce the number of BCH parity bits and overall parity overhead required to achieve a given correctable BER.

Next, FIG. 16B depicts a chart 1602 comparing the parity overhead required by the RFEC, DRFEC, and the three-flag 2-bit ABF methods of the present disclosure to achieve a correctable BER of 0.2% in five subsection configurations, using the data previously presented in FIGS. 13A, 14A, and 15A. As described previously, and indicated by the arrows in chart 1602, it may be seen that this ABF method is most effective for larger subsections due to its higher effectiveness at RESET error correction. For smaller subsections, such as the thirty-two and sixty-four subsection configurations, the RFEC method proves most efficient. Again, this is due to this ABF method requiring only sixteen subsections to correct substantially all of the RESET errors, and increasing the number of subsections further simply increases the flag bit overhead without affecting the number of BCH parity bits required. Indeed, for a sixty-four subsection configuration, the ABF method actually increases the overall parity overhead compared to BCH alone.

Accordingly, as demonstrated in FIG. 16C, the three-flag 2-bit ABF method may be more effective at higher correctable BER. Here, chart 1603 shows that this ABF methods is again the most efficient of the DFEC methods considered for large subsections, up to the sixteen subsection configuration. At thirty-two subsections, however, the DRFEC method provides the lowest parity overhead, and at sixty-four the RFEC method is most efficient. This demonstrates the ability to tailor the DFEC methods to address the needs of a specific application by optimizing the DFEC method employed, and the specific configuration thereof. Further, FIGS. 13A-13D, 14A-14D, 15A-15D, and 16A-16C show how the DFEC methods of the present disclosure may be used to substantially reduce the total parity overhead and decoding latency required to achieve a given correctable BER for a resistive change element array.

Dual Reverse Flag Error Correction

As described previously with respect to FIGS. 9A-9C, 10, 11A-11E, 12A-12B and 13A-13B, the single-flag DFEC method may be used to correct at least a single initialization error per subsection in a resistive change element array. This method, however, provides only a 50% chance of correcting two initialization errors per subsection. Thus, in certain applications wherein the error distribution is expected to result in multiple errors per subsection, or a large degree of continuous errors (that is, errors occurring on two adjacent data bits), the single-flag DFEC method may be insufficient. In these circumstances, two flag bits per subsection may be employed to increase the error correction rate.

FIGS. 17A-17B, 18, and 19A-19F teach a second DFEC method using dual flag bits. In this dual reverse flag error correction (DRFEC) DFEC method, two flag bits per subsection are distributed across a resistive change element array to delimitate each subsection. Similarly to the RFEC method, these two flag bits are used to indicate the presence of initialization errors within the subsection and to invert the input data accordingly. However, in this case, one flag bit indicates errors on even data bits while the other indicates errors in the odd data bits. Thus, the input data may be matched to the error pattern in four ways—no effective errors (neither flag bit is activated), at least one odd error with no effective even errors (only the odd flag bit is activated), at least one even error with no effective odd errors (only the even flag bit is activated), or at least one even and at least one odd error (both flag bits are activated), as will be described in more detail during discussion of FIGS. 18 and 19A-19F. In this way, the dual-flag DFEC method may be guaranteed to correct at least one even and one odd error per subsection.

FIG. 17A depicts an exemplary resistive change element array 1701 configured for use with the DRFEC method of the present disclosure in concert with a secondary error correction method, in this case BCH. Resistive change element array 1701 comprises multiple, in this example, eight, BCH ECC memory blocks 1710, which are illustrated in more detail in FIG. 17B. Each memory block 1710 is divided into several, in this example, four, DFEC subsections 1711, which comprise data bits 1711a and two DFEC flag bits 1711b. Each memory block 1710 additionally comprises BCH parity bits 1712. Initialization errors may occur throughout resistive change element array 1701, including data bit errors 1720 which occur in data subsections 1711a, BCH parity errors 1730 which occur in the BCH parity bits 1712, and DFEC flag errors 1740 which occur in DFEC flag bits 1711b. As described previously with respect to FIGS. 9A-9C, each of the DFEC flag bits 1711b in subsections 1711 are capable of correcting at least one data bit initialization error 1720 per subsection 1711. DFEC flag bit initialization errors 1740, BCH parity bit errors 1730, and all other errors must be corrected by a secondary error correction method. The use of the dual-flag DFEC method, however, may substantially reduce the number of errors required to be corrected by this secondary error correction method for a given BER. Since the secondary error correction methods require many parity bits 1712 to correct a single error (BCH ECC requires 14 parity bits/error for an 8 kilobyte block, for instance), compared to DFEC methods of the present disclosure which require only a single flag bit to correct a single data bit initialization error 1720, the use of the DFEC methods of the present disclosure may substantially reduce the parity overhead for a given correctable BER.

Figure 17B:
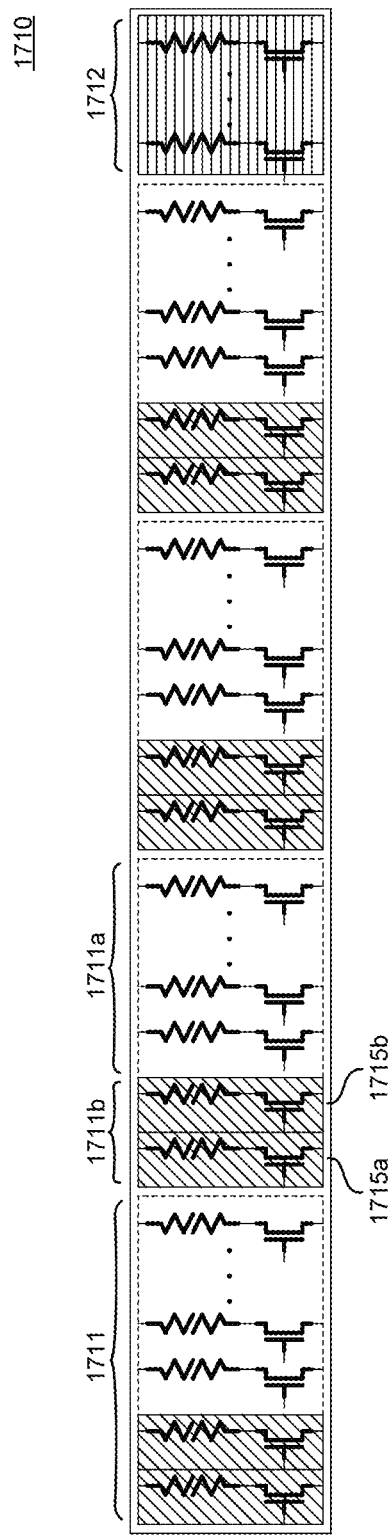
FIG. 17B is a diagram showing a 1-kilobyte block of FIG. 17A in more detail.

FIG. 17B depicts the exemplary memory block 1710 of FIG. 17A in more detail. As can be seen, memory block 1710 comprises multiple, in this case, four, subsections 1711, as well as parity bits 1712 for use with a selected secondary error correction method (such as, but not limited to, BCH). Subsections 1711 comprise data bits 1711a and DFEC flag bits 1711b. In this example, memory block 1710 is configured for the DRFEC method and hence DFEC flag bits 1711b comprise two flag bits 1715a and 1715b, which may be designated even or odd according to the needs of a certain application. Thus, flag bit 1715a may indicate even errors within data section 1711b while flag bit 1715b indicates the odd errors, or flag bit 1715a may indicate odd errors while flag bit 1715b indicates the even errors, the invention is not limited in this regard.

It should be noted that in the present disclosure bits are designated even or odd according to their position within the array in an alternating pattern. Thus, if the first bit in a data section is considered even, the second will be odd, the third even, and so on in an alternating pattern to the end of the data section. Alternatively, if the first bit in a data section is considered odd, the second will be even, the third odd, and so on in an alternating pattern to the end of the data section. For ease of explanation, the present disclosure refers to the first data bit in a data section as even, but the invention is not limited in this regard.

Figure 18:
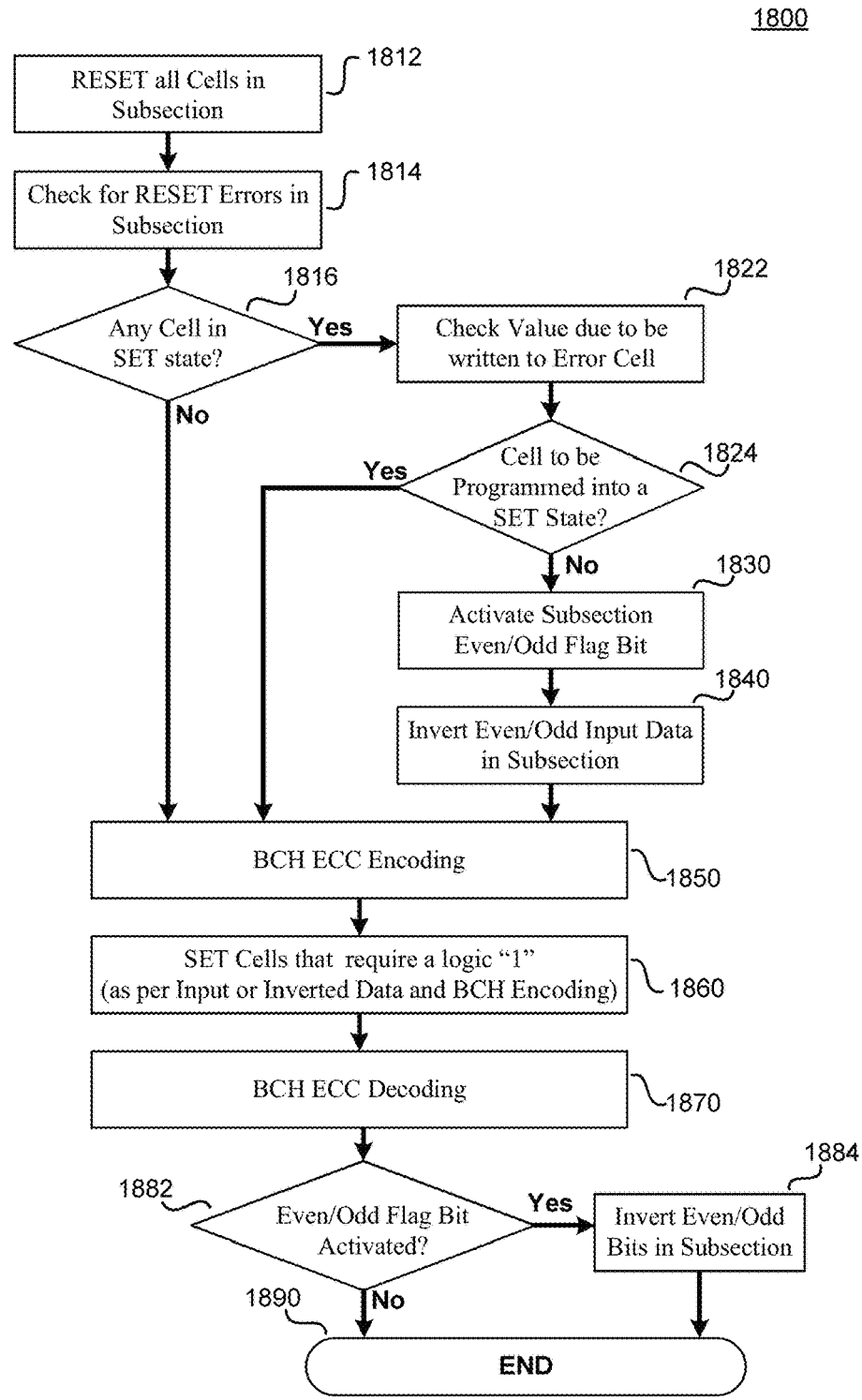
FIG. 18 is a flow chart detailing an exemplary programming/read back operation that uses the DRFEC method of the present disclosure.

FIG. 18 is a flowchart depicting the use of the dual-flag DFEC method of the present disclosure during a programming/read operation 1800 on a single subsection of a resistive change element array, such as that depicted in FIG. 17A. In this example, the initialization state of the array is taken to be RESET (or, logic "0"), but the invention is not limited in this regard. In a first process step 1812 the subsection is initialized, wherein all cells (including both DFEC flags and data cells) are placed into a RESET state. In a second process step 1814, the subsection is checked for initialization errors (that is, a cell which has not been placed into a RESET state and instead remains in a SET state) and the process advances to step 1816. In step 1816, if there were no initialization errors detected in step 1814, the process advances to step 1850 without employing the DFEC pattern encoding methods. Otherwise the process proceeds to step 1822, wherein the input data (that is, the data due to be written to the subsection) is compared to the error cells. If all of the error cells detected in step 1814 are due to be programmed into a SET state there is effectively no error, as the cells are already in the desired final state. In this case the process advances to step 1850 without employing the DFEC pattern encoding methods. If, however, at least one of the error cells (currently SET) are due to be programmed into a RESET state, then the DFEC methods may be used to correct at least one of the errors and the process proceeds to data pattern matching (DPM) step 1830. Here, the DFEC flag bits are activated according to the position of the error(s) in the block. Thus, if there is at least one even error, the even flag bit is activated, and if there is at least one odd error the odd flag bit is activated. If there are both even and odd errors present in the subsection, then both flag bits will be activated. In some cases, however, wherein the number of effective errors is less than half of the number of total errors, the corresponding flag bit will remain un-activated. Thus, for example, if four total even errors occur but only one is an effective error, the even flag bit may remain un-activated. In these situations, inverting the input data may increase the number of errors.

In step 1840, the input data is encoded according to the pattern indicated by the pattern reference code (PRC). If only the even flag is activated then only the even input data bits are inverted, and if only the odd flag bit is activated then only the odd input data bits are inverted. If both even and odd flag bits are activated then all of the input data will be inverted, similarly to the single-flag DFEC method discussed previously. In this way, the input data is encoded to match the error pattern present in the array.

During process step 1850, the original input data (if there were no effective errors), or the DFEC encoded input data, is further encoded using a secondary error correction method (in this case, BCH ECC), including the DFEC flag cells. Next, the encoded input data is written to the subsection in step 1860, as well as the BCH parity bits, wherein cells requiring a logic "1" according to the encoded input data are SET. At this point, the array has been programmed with the input data and may remain in this state until overwritten.

Next, in order to retrieve the input data, the process proceeds to step 1870, wherein a READ operation is performed on the subsection and the READ data is subsequently decoded using the secondary error correction method (in this case, BCH ECC). In step 1870, any errors which occurred during the SET operation of step 1860, or were not corrected by DFEC in step 1840, are corrected by the secondary error correction method. Following decoding, the DFEC flag bits are checked in step 1882. If neither flag bit is activated, then the process proceeds to step 1890 and is complete. If at least one flag bit is active, however, the process advances to reverse data pattern matching (RDPM) step 1884. In RDPM step 1884, the output data is inverted according to the active DFEC flags, or, the pattern reference code (PRC). Thus, if only the even flag bit is activated then only the even output bits are inverted, and if only the odd flag bit is activated then only the odd output data bits are inverted. If both even and odd DFEC flag bits are activated, then all of the output data bits are inverted. In this way, the original input data may be recovered and any errors corrected.

As discussed previously, the DRFEC method of the present disclosure may be capable of correcting at least one odd and one even initialization error per subsection. If the subsection contains multiple even or multiple odd initialization errors, however, the dual-flag method may not be able to correct all of the errors in the subsection. Further, the DFEC methods of the present disclosure are only capable of correcting initialization errors. Therefore, a secondary error correction method, such as BCH, is required to correct programming errors, DFEC flag errors, data retention errors, and any initialization errors that are not corrected by the DFEC methods.

FIGS. 19A-19F illustrate the use of the dual-flag DFEC method of the present disclosure to correct various error patterns in an exemplary resistive change element array subsection. It should be noted that the subsection used in the examples of FIGS. 19A-19F is for illustrative purposes only, and in real applications a subsection may contain a far greater number of data bits than the four depicted. Further, as in previous examples, the initialization state of the subsection is taken to be RESET (logic "0"), but the invention is not limited in this regard.

Figure 19A:
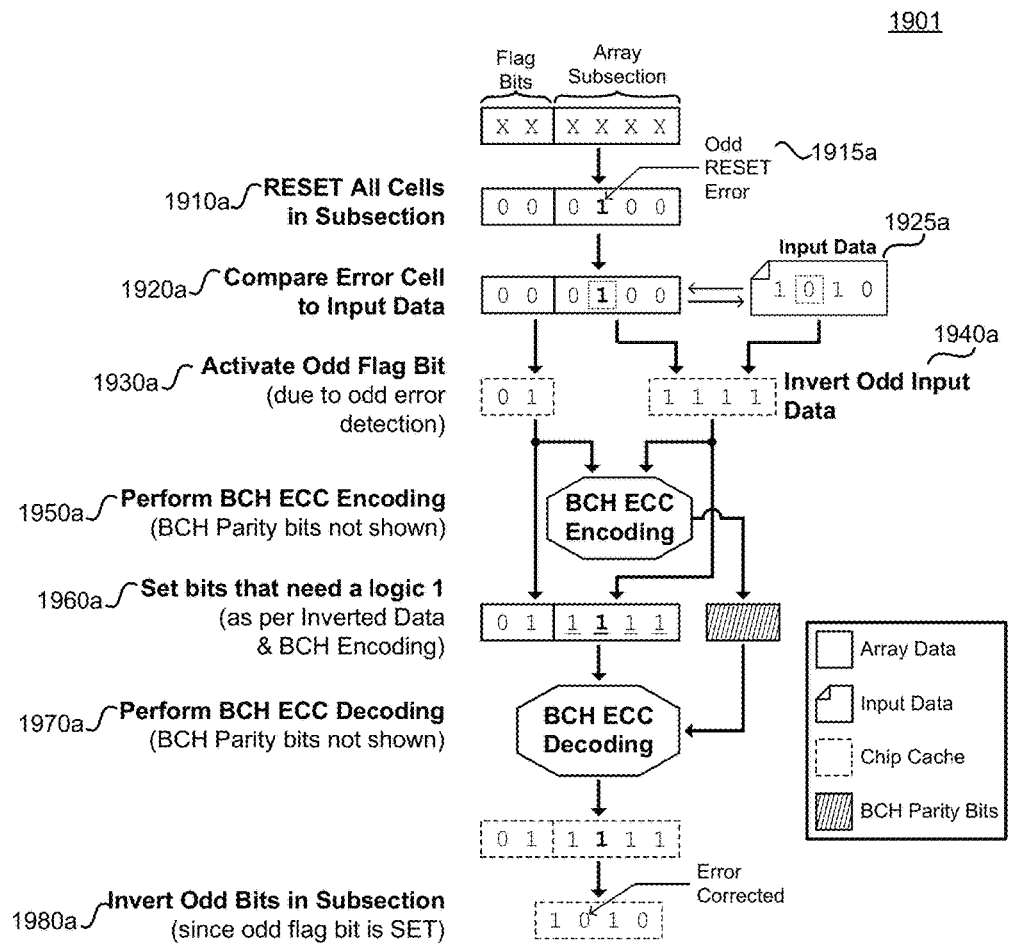
FIG. 19A is a diagram illustrating an exemplary error correction operation according to the DRFEC method of the present disclosure used to correct a single RESET error on an odd cell intended to be written with a logic "0".

FIG. 19A depicts an exemplary programming/read operation 1901 in which the DRFEC method of the present disclosure is used to correct a single odd error in a subsection. In a first operation 1910a, analogous to operations 1812, 1814, and 1816, all of the bits in the subsection (including both data and flag bits) are initialized to a RESET state. Data bit 1915a, however, failed to initialize and remains in a SET state. Since an error has been detected, the operation moves to step 1920a, wherein error cell 1915a is compared to the input data 1925a. As can be seen, data cell 1915a needs to be in a RESET state. Thus, the operation proceeds to data pattern matching (DPM) step 1930a. In this step, the error cell is identified as an odd bit and the odd flag bit is activated to indicate the presence of an odd error. Next, the input data is encoded according to the data pattern indicated by the activated flags in step 1940a. Since the odd flag bit is activated, all of the odd bits in the input data are inverted. The DFEC encoded input data and flag bits is then further encoded using a secondary error correction method, such as BCH, in step 1950a. The encoded input data is then written to the subsection in step 1960a. The subsection, aside from error cell 1915a, is already in a RESET state, and thus only those bits which require a logic "1", as per the encoded input data, need to be set. Error cell 1915a is already in a SET state, however, and may not require programming, but in certain applications error cell 1915a may be set again to ensure it is fully in a SET state. At this stage, the encoded input data has been written to the subsection and the programming operation ends.

To retrieve the input data, a READ operation is performed, beginning at step 1970a. In step 1970a, the memory block is read and the READ data subsequently decoded using the secondary error correction method. During this decoding process, any errors which occurred during the SET operation of step 1960a, as well as initialization errors not corrected by DFEC encoding, may be corrected by the secondary error correction method. In this example, however, no such errors occurred, and the process proceeds to reverse data pattern matching (RDPM) step 1980a. Here, the DFEC encoded output data is decoded according to the PRC indicated by the DFEC flags. In this case, the odd flag bit is active and therefore all odd bits in the output data are inverted. At this point, since input data 1925a has been recovered and odd initialization error 1915a has been corrected, programming/read operation 1901 concludes. In this way, the dual-flag DFEC method of the present disclosure may be used to correct an odd initialization error.

Figure 19B:
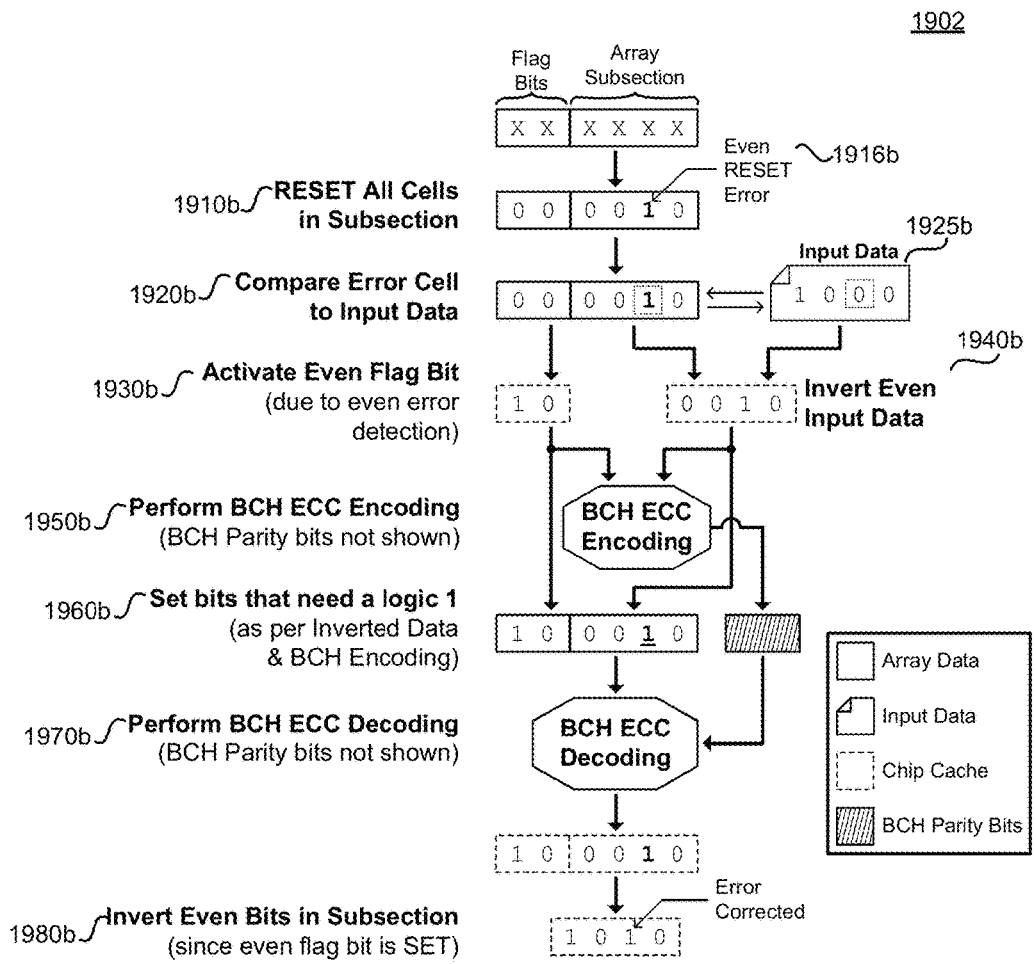
FIG. 19B is a diagram illustrating an exemplary error correction operation according to the DRFEC method of the present disclosure used to correct a single RESET error on an even cell intended to be written with a logic "0".

Looking now to FIG. 19B, in an exemplary programming/read operation 1902, the DRFEC method of the present disclosure is used to correct an even error in a subsection. In a first operation 1910b, analogous to operations 1812, 1814, and 1816, all of the bits in the subsection (including both data and flag bits) are initialized to a RESET state. Even data bit 1916b, however, failed to initialize and remains in a SET state. Since an error has been detected, the operation moves to step 1920b, wherein error cell 1916b is compared to the input data 1925b. As can be seen, data cell 1916b needs to be in a RESET state. Thus, the operation proceeds to data pattern matching (DPM) step 1930b. In this step, the error cell is identified as an even bit and the even flag bit is activated to indicate the presence of an even error. Next, the input data is encoded according to the PRC indicated by the activated flags in step 1940b. Since the even flag bit is activated, all of the even bits in the input data are inverted. The DFEC encoded input data and flag bits is then further encoded using a secondary error correction method, such as BCH, in step 1950b. The encoded input data is then written to the subsection in step 1960b. The subsection, aside from error cell 1916b, is already in a RESET state, and thus only those bits which require a logic "1", as per the encoded input data, are set. Error cell 1915b is already in a SET state, however, and may not require programming, but in certain applications error cell 1916b may be set again to ensure it is fully in a SET state. At this stage, the encoded input data has been written to the subsection and the programming operation ends.

To retrieve the input data, a READ operation is performed, beginning at step 1970b. In step 1970b, the memory block is read and the READ data subsequently decoded using the secondary error correction method. During this decoding process, any errors which occurred during the SET operation of step 1960b, as well as initialization errors not corrected by DFEC encoding, may be corrected by the secondary error correction method. In this example, however, no such errors occurred, and the process proceeds to reverse data pattern matching (RDPM) step 1980b. Here, the DFEC encoded output data is decoded according to the PRC indicated by the DFEC flags. In this case, the even flag bit is active and therefore all even bits in the output data are inverted. At this point, since input data 1925b has been recovered and even initialization error 1916b has been corrected, programming/read operation 1902 concludes. In this way, the dual-flag DFEC method of the present disclosure may be used to correct an even initialization error.

Figure 19C:
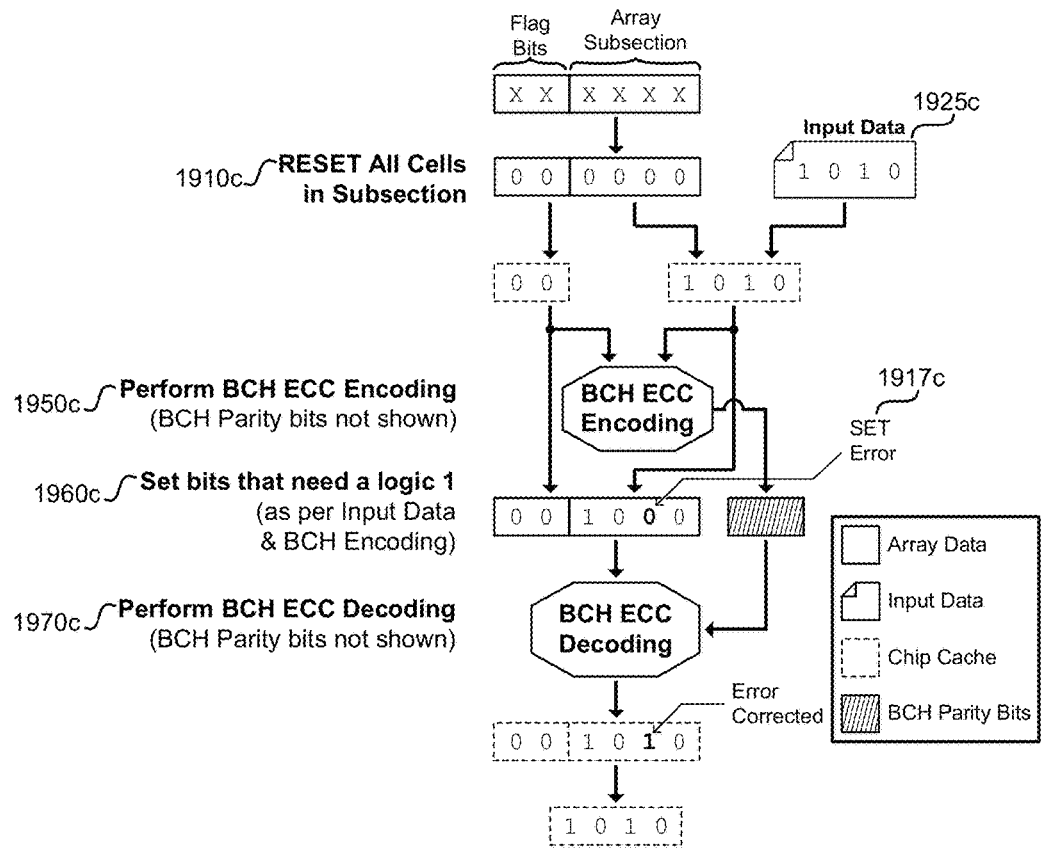
FIG. 19C is a diagram illustrating an exemplary error correction operation according to the DRFEC method of the present disclosure used to correct a single SET error.

FIG. 19C illustrates the necessity of a secondary error correction method to ensure that all errors in a subsection can be corrected during a programming/read operation 1903. First, in step 1910c, all cells in the subsection are initialized to a RESET state. As can be seen, unlike the examples of FIGS. 19A and 19B, no errors occurred in the subsection during the initialization process. Hence, input data 1925c remains unchanged, and the DFEC flag bits remain unactivated. Next, in step 1950c, the input data is encoded using a secondary error correction method, in this case BCH ECC, and then written to the subsection in step 1960c. Since the subsection has been initialized to a RESET state, only those cells which require a SET state need to be written. As can be seen, however, during set process 1960c, cell 1917c failed to set and remains in a RESET state. At this point, input data 1925c has been programmed to the subsection with one error, and will remain in this state until overwritten.

In order to retrieve input data 1925c, a READ operation is performed on the subsection. The read data is then decoded using the secondary error correction method, in this case BCH, in step 1970c. During the decoding process, error 1917c is detected in the read data using the parity bits and subsequently corrected by the secondary error correction method. In this way, input data 1925c is recovered despite SET error 1917c, which could not be corrected by the DFEC methods of the present disclosure, as these methods may only correct errors occurring during initialization.

Figure 19D:
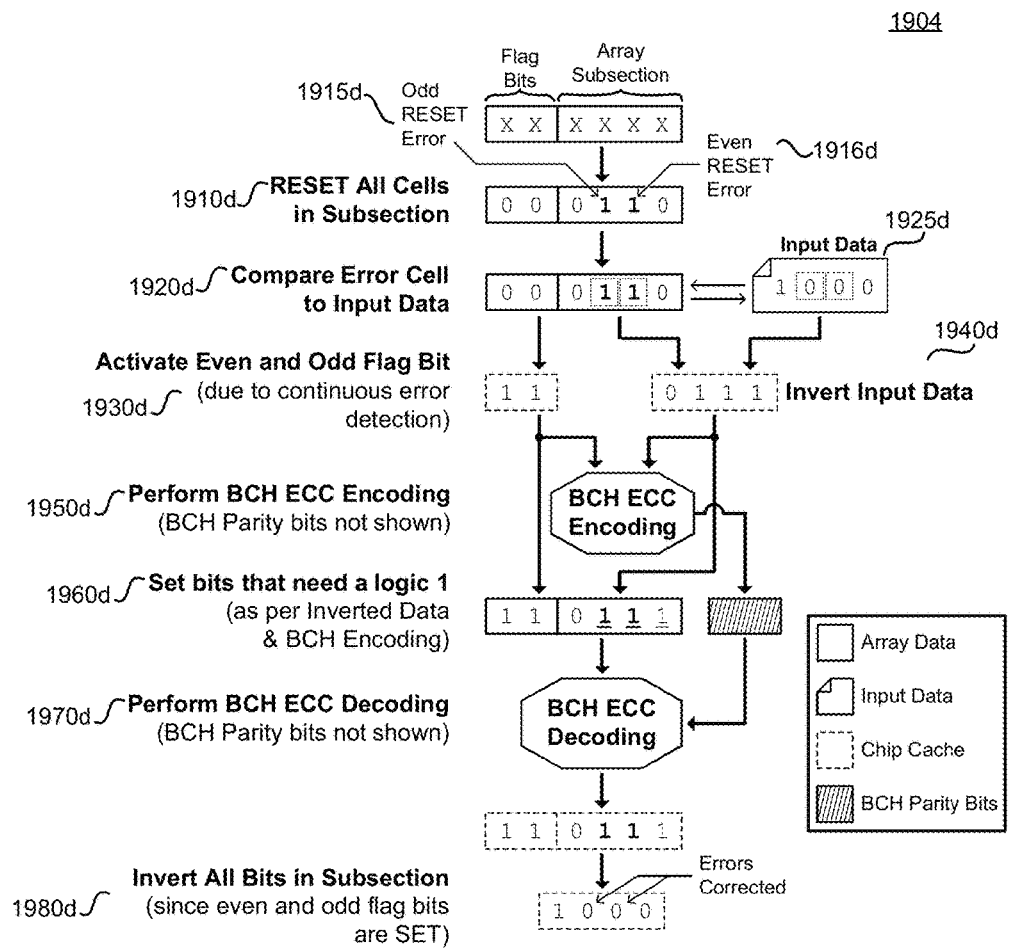
FIG. 19D is a diagram illustrating an exemplary error correction operation according to the DRFEC method of the present disclosure used to correct two RESET errors on one even and one odd cell intended to be written with a logic "0".

That said, however, the DFEC methods may be highly efficient at correcting initialization errors. FIG. 19D demonstrates the correction of a continuous error (that is, two errors occurring on adjacent data bits) using the dual-flag DFEC method of the present disclosure during programming/read operation 1904. In a first step 1910d, all the cells in the subsection are initialized to a RESET state. During initialization, however, a continuous error occurs, wherein two data bits, 1915d and 1916d, fail to initialize and remain in a SET state. In step 1920d, these errors are detected and subsequently compared to input data 1925d to check the desired final state of the error bits. As can be seen, error bits 1915d and 1916d need to be in a RESET state and must be corrected.

Since initialization errors have been detected, the process proceeds to DPM step 1930d. In this step, error 1915d is determined to be an odd error, and error 1916d is identified as an even error. Thus, both even and odd DFEC flag bits are activated to indicate the presence of both even and odd errors. Accordingly, in step 1940d, both even and odd bits in input data 1925d are inverted according to the PRC indicated by the activated flag bits. In this case, since both even and odd flag bits are activated, all of the input data is inverted. Next, the DFEC encoded input data, as well as the DFEC flag bits, are encoded using a secondary error correction method (in this case BCH ECC) in step 1950d. The encoded input data and DFEC flag bits are then written to the subsection in step 1960d. Since the subsection has been initialized to a RESET state (aside from error cells 1915d and 1916d), only those cells requiring a SET state need to be written. Following the write process 1960d, the subsection has been programmed with the encoded input data and may remain in this state until overwritten.

In order to retrieve input data 1925d, a READ operation is performed on the subsection. The read data is then decoded using the secondary error correction method in step 1970d. Since at least one DFEC flag bit is activated, the read data is further decoded according to the PRC indicated by the active flag bits in reverse data pattern matching (RDPM) step 1980d. Both even and odd flag bits are active, and thus all of the data bits in the read data are inverted to recover the original input data 1925d, and the operation concludes. In this way, the dual-flag DFEC method of the present disclosure may be guaranteed to correct at least one odd and one even error per subsection using two flag bits.

Figure 19E:
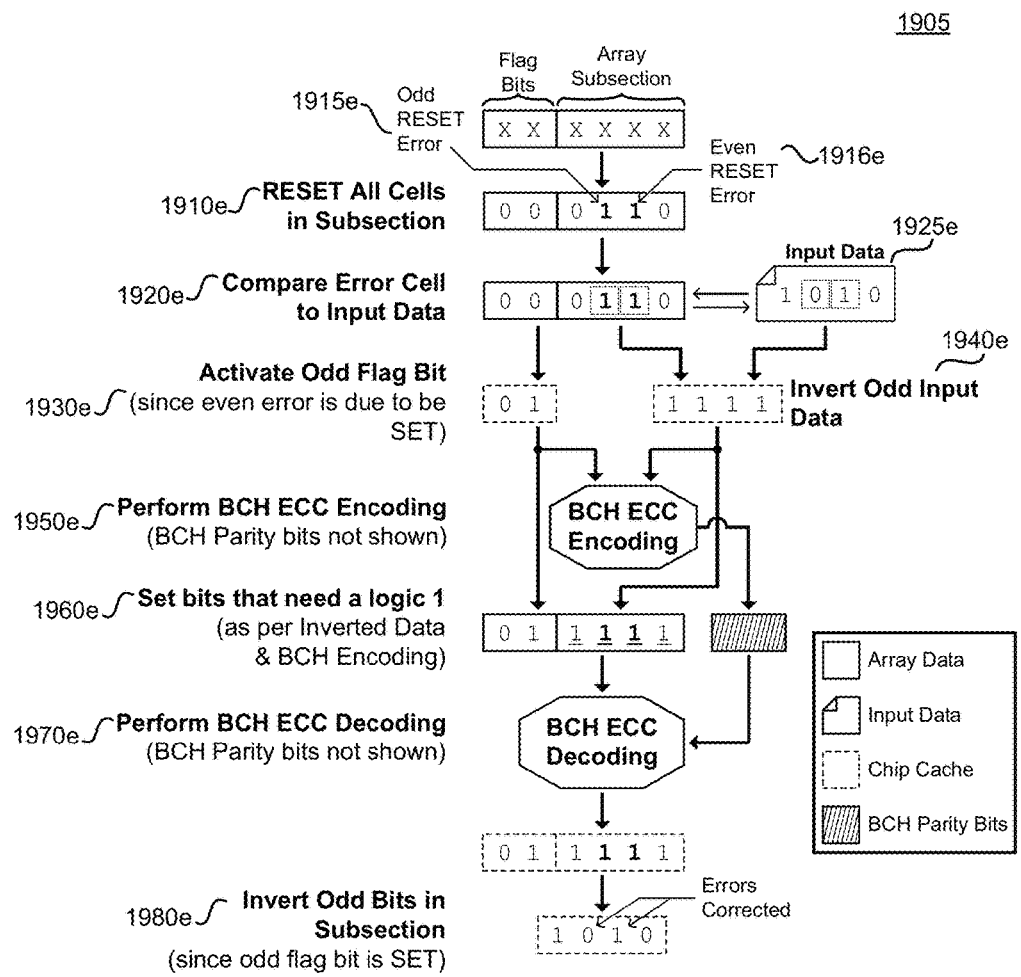
FIG. 19E is a diagram illustrating an exemplary error correction operation according to the DRFEC method of the present disclosure used to correct two RESET errors on one even and one odd cell wherein one is intended to be written with a logic "0" and the other is intended to be written with a logic "1".

Looking now to FIG. 19E, the dual-flag DFEC method of the present disclosure is again employed to correct a continuous initialization error. First, all of the bits in the subsection, including both data and flag bits, are initialized to a RESET state in step 1910e. Two cells 1915e and 1916e fail to initialize, however, and remain in a SET state. In step 1920e, error cells 1915e and 1916e are compared to input data 1925e to determine whether they are due to be in a SET or RESET state. As can be seen, error cell 1915e needs to be in a RESET state, while error cell 1916e needs to be SET. Since error cell 1916e is already in a SET state, there is effectively no error in this cell. Next, DPM step 1930e activates the DFEC flag bits according to the detected error pattern. Error cell 1915e occurred on an odd bit while even error 1916e does not need to be corrected, thus the odd flag bit is activated to indicate the presence of an odd error while the even flag bit remains unactivated.

Input data 1925e is then DFEC encoded according to the PRC indicated by the activated flag bits. Only the odd flag bit is activated, and thus only the odd bits in input data 1925e are inverted. Once encoded according to the PRC, the DFEC encoded input data is further encoded using a secondary error correction method (in this case BCH ECC) in step 1950e. The encoded input data is then written to the subsection in programming step 1960e. Since the subsection has been initialized to a RESET state (aside from error bits 1915e and 1916e), only those cells requiring a SET state need to be written. Error bit 1916e is already in a SET state, however, and may not need to be programmed, but in certain applications error bit 1916e may be programmed to ensure it is fully in a SET state. Following programming step 1960e, the flag bits and input data 1925e have been written to the subsection, and it may remain in this state until overwritten.

In order to retrieve input data 1925e, a READ operation is performed on the subsection. The read data is then decoded using the secondary error correction method (in this case, BCH ECC) in step 1970e. Next, since at least one DFEC flag bit is activated, the process proceeds to RDPM step 1980e, wherein the encoded read data is further decoded according to the PRC indicated by the activated flags. Only the odd flag bit is active, therefore all of the odd bits in the read data are inverted to recover the original input data 1925e. At this point, input data 1925e has been recovered and the operation concludes. In this way, the dual-flag DFEC method of the present disclosure may correct at least one initialization error and determine whether an error must be corrected.

Figure 19F:
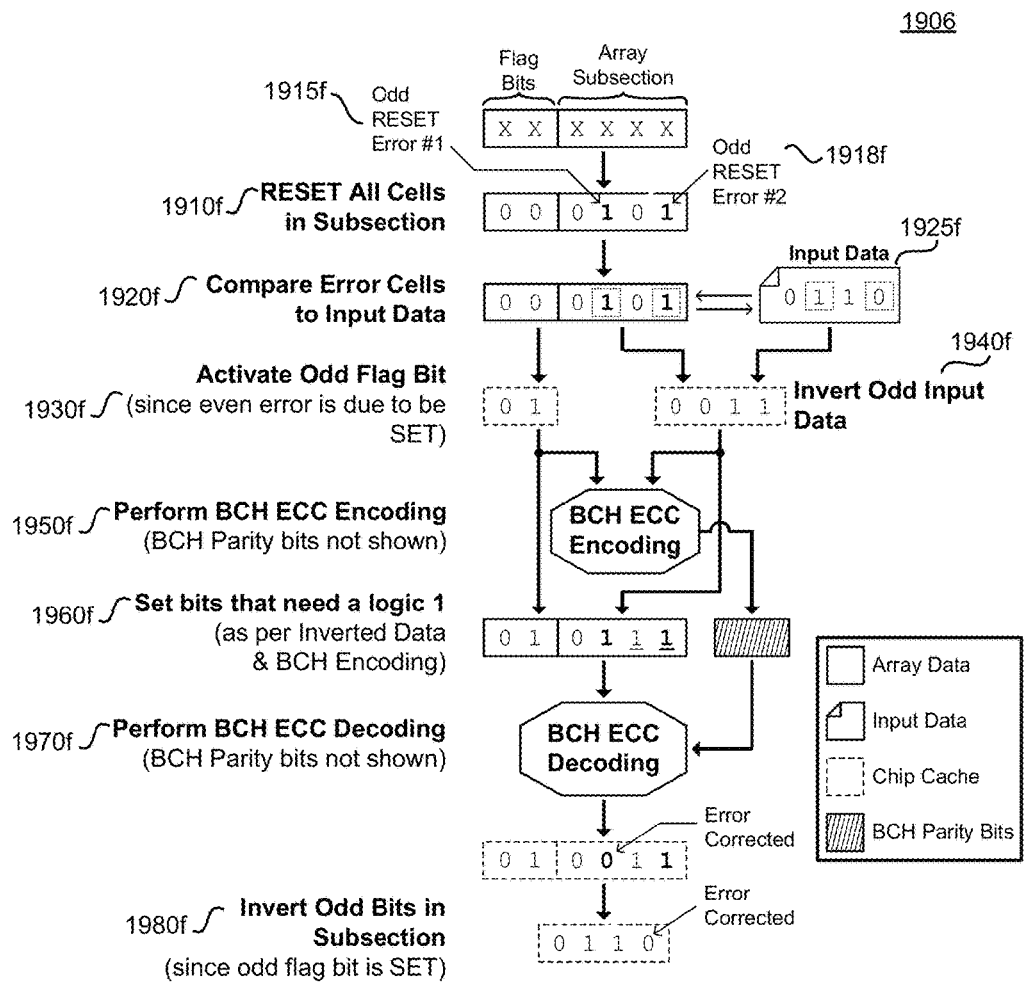
FIG. 19F is a diagram illustrating an exemplary error correction operation according to the DRFEC method of the present disclosure used to correct two RESET errors on two odd cells wherein one is intended to be written with a logic "0" and the other is intended to be written with a logic "1".

FIG. 19F demonstrates the use of the dual-flag DFEC method working in concert with a secondary error correction method to correct multiple even or odd errors in programming/read operation 1906. First, in step 1910f, the subsection is initialized to a RESET state. Data cells 1915f and 1918f, however, fail to initialize and remain in a SET state. Next, in step 1920f, error cells 1915f and 1918f are compared to input data 1925f to determine whether the errors need to be corrected. As can be seen, error cell 1915f is due to be SET and does not need to be corrected. Error cell 1918f, however, needs to be in a RESET state. Since a correctable error has been detected, the process proceeds to DPM step 1930f, wherein the DFEC flag bits are activated according to the error pattern detected. Correctable error 1918f occurred on an odd data bit, therefore only the odd flag bit is activated.

Input data 1925f is then encoded according to the PRC indicated by the activated flag bits in step 1940f. Since the odd flag bit is activated, all of the odd bits in input data 1925f are inverted. As can be seen, although this process corrects error 1918f, error cell 1915f is now effectively an error, as it now needs to be in a RESET state rather than a SET state according to the DFEC encoded input data. As discussed previously, however, the DFEC methods of the present disclosure are only capable of correcting initialization errors, and thus cannot correct error cell 1915f.

Now that the input data has been DFEC encoded, input data 1925f is then further encoded using a secondary error correction method (in this case, BCH ECC) in step 1950f. The encoded input data is then written to the subsection in step 1960f. The subsection has been initialized to a RESET state (aside from error cells 1915f and 19180, however, and thus only those cells requiring a SET state need to be written. As can be seen, although error cell 1918f has been corrected, error cell 1915f remains in a SET state despite needing to be in a RESET state, and is now effectively an error. This demonstrates how the dual-flag DFEC method may be unable to correct certain error patterns in a subsection, and, as will be described later, a more advanced DFEC method may be required in applications where these patterns are expected to occur frequently. At this point, input data 1925f has been written to the subsection with an error, and will remain in this state until overwritten.

In order to retrieve input data 1925f, a READ operation is performed on the subsection. The read data is first decoded using the secondary error correction method (in this case, BCH ECC) in step 1970f. During this process, error 1915f, which could not be corrected by the dual-flag DFEC method, is corrected by the secondary error correction method. Next, since at least one flag bit is activated, the read data is further decoded in RDPM step 1980f. Here, the read data is decoded according to the PRC indicated by the activated flags. Only the odd flag bit is activated, therefore all of the odd bits in the read data are inverted to recover the original input data 1925f. In this way, the dual-flag DFEC method may be used in concert with a secondary error correction method to correct multiple odd or even initialization errors in a subsection.

Figure 20A:
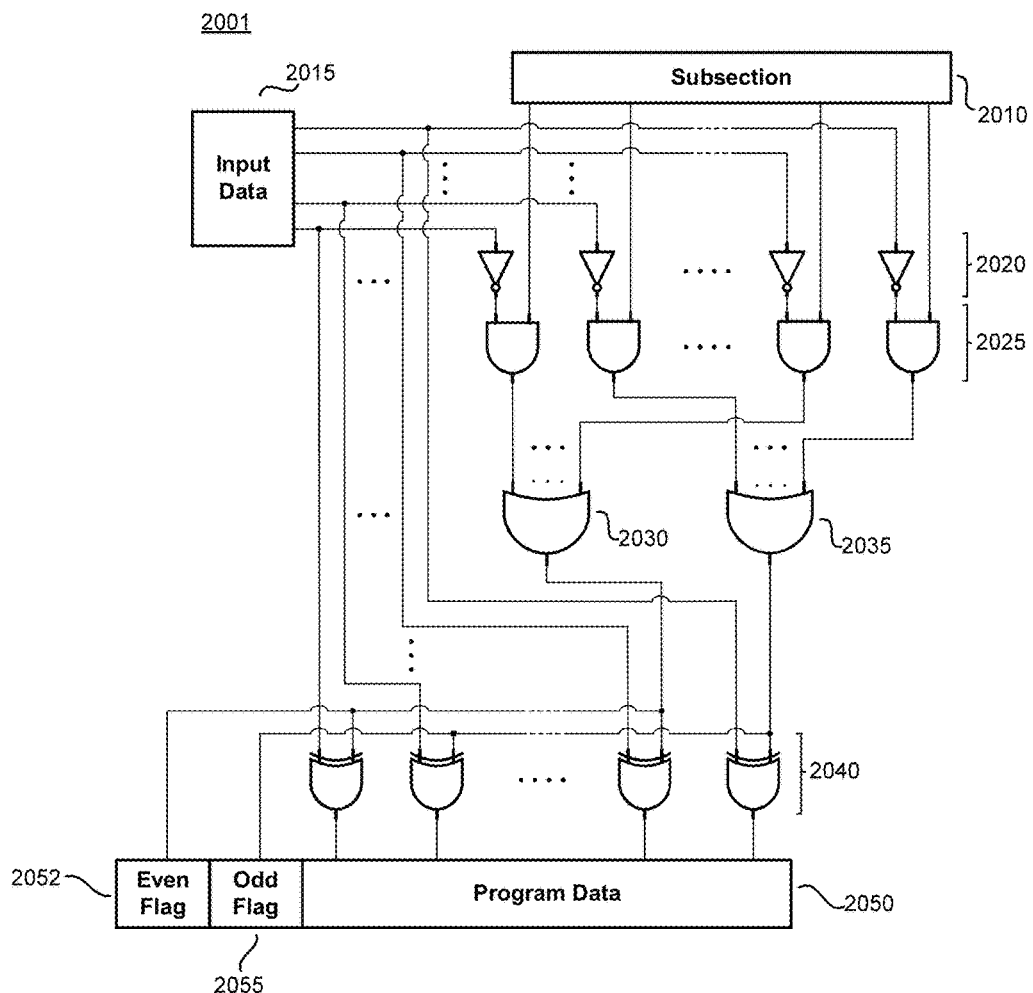
FIG. 20A is a simplified schematic illustrating an exemplary encoding circuit for use with the DFREC method of the present disclosure.

FIG. 20A is a simplified schematic diagram illustrating an exemplary encoding circuit 2001 suitable for use with the dual-flag DFEC method of the present disclosure, which handles the error detection, data pattern matching (DPM) and encoding steps described above. As with other examples within the present disclosure, exemplary encoding circuit 2001 is arranged for use with a resistive change element array that uses RESET (that is, logic "0") as its initialization state. However, it should be noted that, as previously discussed, the methods of the present disclosure are not limited in this regard. The DFEC methods of the present disclosure can also be used within a resistive change element array that uses a SET state as an initialization condition, and exemplary encoding circuit 2001 is intended only as a non-limiting, illustrative example of a circuit capable of encoding programming data according to the DRFEC method of the present disclosure.

Looking now to FIG. 20A, an array of AND gates 2025 ANDs together the data cells of a resistive change element array subsection 2010 with input data 2015 (analogous to input data 1925a-f in FIGS. 19A-19F) which is inverted through an array of Inverter gates 2020. Unlike the exemplary circuit of FIG. 12A, the outputs of AND gates 2025 are divided between odd and even bits, depending on the position of the attached cell in the subsection. The even bits are then ORed together with OR gate 2030 to provide even flag bit 2052 for the subsection 2010, while the odd bits are then ORed together with OR gate 2035 to provide odd flag bit 2055. Such a configuration will activate (that is, set to a logic "1" within this exemplary encoding circuit 2001) the appropriate flag bit(s) 2052 or 2055 if any data cell within subsection 2010 fails to initialize (that is, if any data cell is in a SET state) and is intended to be programmed into a RESET state, referred to as an effective error. Thus, if at least one effective initialization error occurs on an even bit, even flag bit 2052 will be activated, while if at least one effective initialization error occurs on an odd bit then odd flag bit 2055 will be activated. Such a logic function is analogous to operations 1814, 1816, 1822, 1824, and 1830 within FIG. 18, discussed in detail with respect to that figure above.

Finally, an array of Exclusive OR gates 2040 selectively inverts the even and odd input data 2015 dependent on the state of flag bits 2052 and 2055. For each bit, the array of Exclusive OR gates 2040 then provides either the input data 2015 (if the corresponding flag bit 2052 or 2055 is not activated) or an inverted version of the input data 2015 (if the corresponding flag bit 2052 or 2055 is activated) to form the program data 2050, which will be programmed into the array in a programming operation. Such a logic function is analogous to operation 1840 within FIG. 18, discussed in detail above.

Figure 20B:
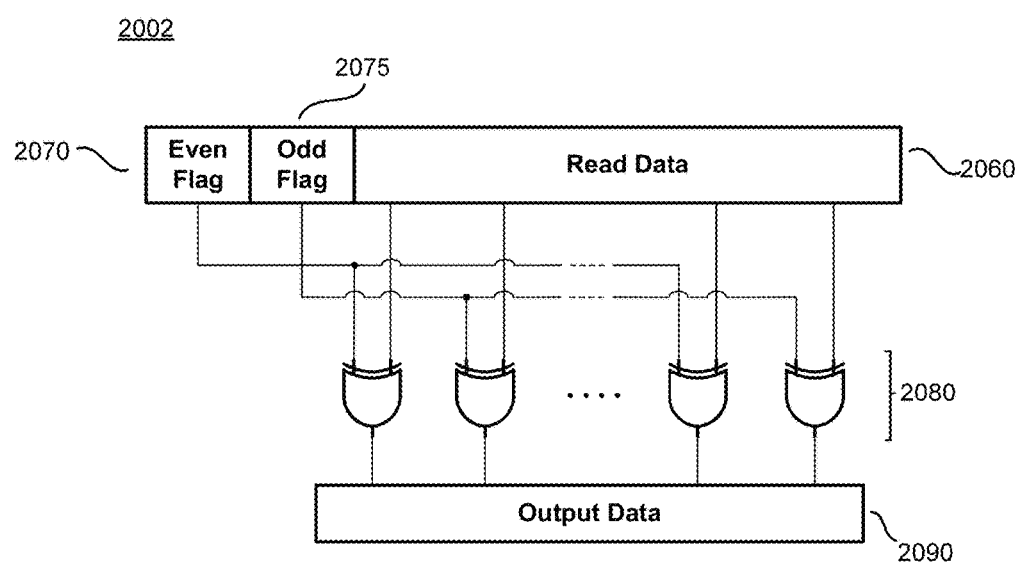
FIG. 20B is a simplified schematic illustrating an exemplary decoding circuit for use with the DFREC method of the present disclosure.

FIG. 20B is a simplified schematic diagram illustrating an exemplary decoding circuit 2002 suitable for use with the dual-flag DFEC method of the present disclosure, which handles the reverse data pattern matching (RDPM) and DFEC decoding steps described above. As with encoding circuit 2001 within FIG. 20A as well as other examples within the present disclosure, exemplary decoding circuit 2002 is arranged for use with a resistive change element array that uses RESET (that is, logic "0") as its initialization state. Again, it should be noted that, as previously discussed, the methods of the present disclosure are not limited in this regard. The DFEC methods of the present disclosure can also be used within a resistive change element array that uses a SET state as an initialization condition, and exemplary decoding circuit 2002 is intended only as a non-limiting, illustrative example of a circuit capable of decoding program data according to the dual-flag DFEC method of the present disclosure.

Looking now to FIG. 20B, an array of Exclusive OR gates 2080 selectively inverts read data 2060 (that is, data read out of an array subsection) dependent on the position of each bit and the state of the corresponding flag bit 2072 or 2075. Thus, each even bit in read data 2060 will be inverted if even flag bit 2072 is active, while each odd bit in read data 2060 will be inverted if odd flag bit 2075 is active. The array of Exclusive OR gates 2080 then provides either the read data 2060 (if the flag bit 2072 or 2075 corresponding to the data bit is not activated) or an inverted version of the read data 2060 (if the flag bit 2072 or 2075 corresponding to the data bit is activated) to form the output data 2090 of the resistive change element array. Such a logic function is analogous to operations 1882 and 1884 within FIG. 18, discussed in detail with respect to that figure above.

Advanced Bit Flip Error Correction

As described previously with respect to FIGS. 17A-17B, 18, and 19A-19F, the dual-flag DFEC method may be used to correct at least one odd and one even initialization error per subsection in a resistive change element array. This method, however, provides only a 75% chance of correcting two initialization errors per subsection, due to the statistical distribution of errors. Thus, in certain applications wherein the error distribution is expected to result in multiple even or odd errors per subsection, the dual-flag DFEC method may be insufficient. In these circumstances, a more advanced form of error pattern matching using two or more flag bits per subsection may be employed to increase the error correction rate.

To this end, the present disclosure teaches a third DFEC method using two or more flag bits, referred to as advanced bit flip (ABF). Similarly to the previously presented methods, ABF uses distributed flag bits to delimitate subsections within a resistive change element array. Following initialization, these distributed flags may be used to store a pattern reference code (PRC) which identifies an encoding pattern selected during a data pattern matching (DPM) step, wherein the pattern of initialization errors within the subsection is matched to the input data pattern to select an encoding pattern capable of correcting the maximum number of initialization errors. The input data is then encoded so that at least some of the initialization errors may be corrected, as has been described similarly with respect to the single-flag and dual-flag DFEC methods.

Unlike the RFEC or DRFEC methods, however, the ABF method divides the subsections within a resistive change element array and the set of input data into equivalent data subsets comprising at least two data bits. For example, the 2-bit ABF method groups pairs of data bits in the array and the input data into subsets of two bits, so that a set of input data having the pattern (00101110) would be divided into subsets of two bits (00|10|11|10). A 3-bit ABF method would divide a set of data into subsets of three bits, while a 4-bit ABF method would divide a set of data into subsets of four bits. Thus, the same input pattern previously divided into four subsets (00|10|11|10) for the 2-bit method would thus be divided into two subsets (0010|1110) for the 4-bit method.

As will be described in more detail later, encoding patterns may be identified to translate one data pattern to a second data pattern. A subset of input data having the data pattern 10, for instance, could be translated to 00, 01, 10 or 11 before being written to the array. If a 2-bit subset of data from an initialized array contains a single error, for instance, it may have a data pattern of either 10 or 01, and its corresponding subset in the input data may have a data pattern of either 00, 01, 10 or 11. It may be apparent that if the error pattern matches the input pattern there is effectively no error. Thus, an error pattern of 10 having a corresponding input pattern of 10 or 11 may not be considered an effective error. From this, if an effective error does occur (error pattern 10 with input 00 or 01, for instance), the input pattern may be translated according to a reversible encoding pattern to correct the error. For example, if an even error occurs (10) with an input pattern of 00, 00 may be translated to 10 or 11 in order to correct the error. In this way, the ABF method of the present disclosure may be used to correct initialization errors in a resistive change element array by employing a set of encoding patterns.

The ABF method therefore provides a much higher error correction rate by allowing more advanced data patterns to be identified. As described previously, the number of flags employed for the DFEC methods determines the number of pattern codes which may be stored. Thus, a single flag bit provides two patterns, two flag bits provides four patterns, three flag bits provides eight patterns, and n flag bits provide $2^n$ patterns. Further, encoding patterns may be identified for subsets comprising any number of data bits. For ease of explanation, however, the present disclosure describes the ABF method using subsets of two data bits, but it will be apparent to those skilled in the art that subsets comprising any number of data bits may be employed.

It should be noted that, in the present disclosure, a "data subset" or "subset" may be used interchangeable to refer to two or more data bits which have been grouped together for the purposes of encoding and decoding. As mentioned throughout, although described using two bits for ease of explanation, a data subset may comprise any number of data bits according to the requirements of a certain application. Further, a data subset may be defined within the design of the resistive change element array itself, or may be defined by a processing element, encoding circuit, decoding circuit, or whatever means best befits a particular application. That is, so long as a means to divide a set of input data and a set of read data into subsets suitable for encoding and decoding is provided, the invention is not limited in the specific method employed nor in the number of bits grouped into a data subset.

Figure 21A:
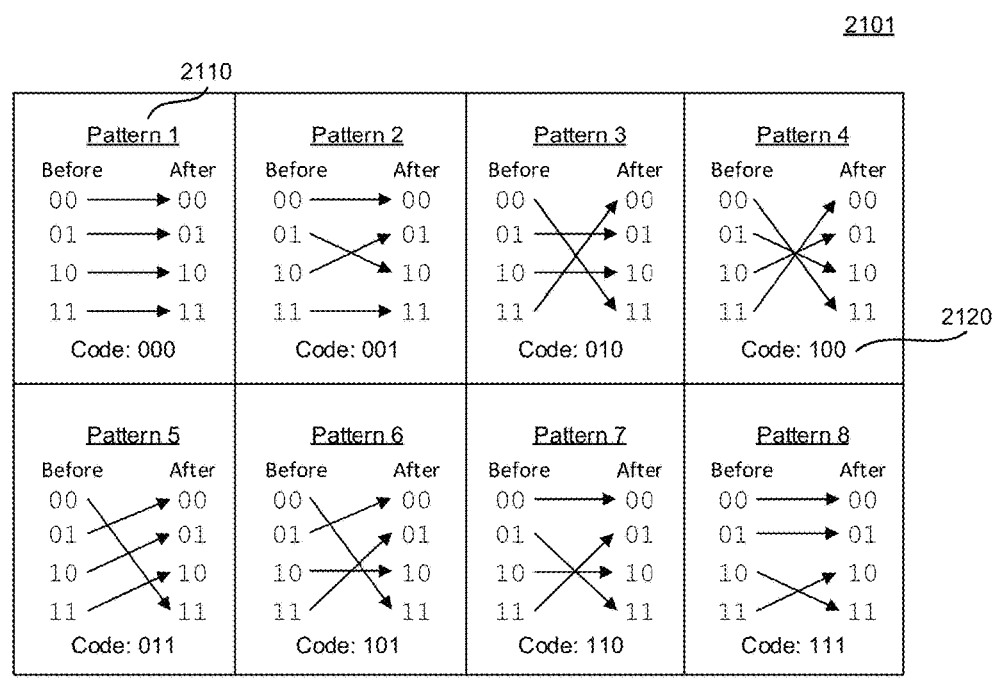
FIG. 21A is a diagram showing eight exemplary data encoding patterns and corresponding pattern reference codes (PRCs) for use with the three-flag 2-bit advanced bit flip (ABF) method of the present disclosure.

Looking now to FIG. 21A, eight exemplary reversible data patterns 2110 used in the 2-bit ABF method are displayed. Each pattern 2110 has an associated pattern reference code (PRC) 2120 which, when stored in the DFEC flags, indicate which pattern must be employed for DFEC encoding of the input data and decoding of the read data. As can be seen, the encoding process is achieved by selectively inverting bits in a data subset, while the decoding process simply reverses the pattern. Specifically, the "before" columns correspond to the possible patterns for each data subset in the input data, while the "after" columns represent the corresponding encoded pattern for each input data subset. For example, according to pattern 4, a pair of bits 00 in the input data will be encoded as 11 when written to the subsection, while a pair of bits 01 in the input data will be encoded as 10. In this way, the input data may be encoded and decoded according to an encoding pattern in order to match the pattern of errors to the input data.

In this way, the ABF method utilizes reversible translation patterns to encode input data for the purposes of error correction. Specifically, these encoding patterns provide a reversible means to translate every possible logical configuration of bits in a data subset to a separate logical configuration without overlap. Mathematically, the number of possible configurations for a given number of bits in a data subset can be calculated as $2^n$, where n is the number of bits. Thus, a single bit can have two configurations (1 or 0), two bits can have four combinations (00, 10, 01 and 11), three bits can have eight combinations, and four bits can have sixteen configurations. Since each configuration must be matched with only a single encoded configuration without overlap to ensure reversibility (for example, an input 11 cannot be translated as both 01 and 10, and input patterns 00 and 10 cannot both translate to 01), the total number of possible encoding patterns may be calculated as $2^n!$, where n is the number of bits in a subset. Thus, for two bits there are 24 ($2^2!=4!=4*3*2*1=24$) total encoding patterns, for three bits there are 40,320 (8!) total patterns, and for four bits there are nearly 21 trillion (16!) total patterns.

As will be discussed in more depth later, the number of bits chosen to form a subset may substantially affect the error correction rate. The number of possible encoding patterns increases quickly, however, and each pattern must be provided with a pattern reference code (PRC). Since a given number of flag bits n can store $2^n$ pattern reference codes, in order to utilize all possible encoding patterns for the 2-bit method, for instance, requires 5 flags (log 2(24)=5) to reference all 24 patterns. The 3-bit ABF method, which has 40,320 encoding patterns, requires 16 flags (log 2(40,320)), and the 4-bit ABF method requires 45. Increasing the number of bits in a subset may therefore increase the flag bit overhead, but may also improve the error correction rate by allowing a greater percentage of errors to be corrected. Further, while the total set of encoding patterns guarantees the ability to translate each input pattern to any output pattern, not all of these patterns may be necessary for certain applications. Therefore, in certain applications it may be advantageous to select a smaller set of the total set of encoding patterns (such as the eight patterns depicted in FIG. 21A) to simplify the encoding and decoding process.

In these cases, a smaller set of encoding patterns may be selected from the total mathematically possible set of encoding patterns according to certain criteria. To guarantee the correction of at least two initialization errors per subsection using 2-bit data subsets, for instance, requires at least eight encoding patterns selected according to the following conditions from the set of 24 patterns shown in FIG. 21B. First, it must be possible to translate all possible input data patterns (00, 10, 01, and 11) to data pattern 'XX', where X is the selected initialization state, in order to correct a data subset containing a continuous error (a data subset with two initialization errors). Second, any combination of two input data patterns within all possible data patterns (00, 10, 01, and 11) must be capable of being encoded to all four possible combinations of two errors in two data subsets (10 and 10, 01 and 01, 10 and 01, and 01 and 10). A set of encoding patterns meeting these requirements may be guaranteed to correct up to two errors per subsection, such as the set of 8 patterns depicted in FIG. 21A. If more than two errors occur, however, these patterns may still be able to correct all the errors (as shown in FIG. 24F below) dependent on the error and input data patterns. It will be apparent that using a larger number of flag bits allows a greater number of encoding patterns to be selected. These additional patterns may provide a greater ability to address more than two errors, should they occur, as will be discussed in more detail below. Additionally, the criteria by which the encoding patterns are selected may vary. For instance, a set of six encoding patterns could be defined to guarantee all input data subsets with a pattern 00 are translated to 11, or all input subsets with 01 are translated to 10. The selection of the eight patterns shown in FIG. 21A is therefore provided only as an example, and such a set of encoding patterns can be defined by whatever criteria may provide a desired encoding result.

Further, although demonstrated using 2-bit ABF for ease of explanation, the number of bits grouped together for the purposes of data pattern matching and DFEC encoding may be selected according to the needs of a specific application. Indeed, it will be apparent to those skilled in the art that encoding patterns may be identified for groups of three data bits, or even larger groups of four or more bits. The subset size, set of encoding patterns, and number of flags employed for the ABF method must be optimized for a given application and are not limited to the examples herein.

FIG. 22A depicts an exemplary resistive change element array 2201 configured for use with the three-flag ABF method of the present disclosure in concert with a secondary error correction method, in this case BCH ECC. Resistive change element array 2201 comprises multiple, in this example, eight, BCH ECC memory blocks 2210, which are illustrated in more detail in FIG. 22B. Each memory block 2210 is divided into several, in this example, four, DFEC subsections 2211, which comprise data bits 2211a and three DFEC flag bits 2211b. Each memory block 2210 additionally comprises BCH parity bits 2212. Unlike the previous examples discussed in FIGS. 9A-9B and 17A-17B, data bits 2211*b* may be divided into data subsets in order to employ the patterns depicted in FIG. 21 above. These data subsets may be defined by hardware or may be defined during the encoding process, the invention is not limited in this regard. Further, it will be apparent to those skilled in the art that the number of data bits and data subsets per subsection is arbitrary and may be substantially large in real applications. Initialization errors may occur throughout resistive change element array 2201, including data bit errors 2220 which occur in data subsections 2211*a*, BCH parity errors 2230 which occur in the BCH parity bits 2212, and DFEC flag errors 2240 which occur in DFEC flag bits 2211*b*. As described previously, the three DFEC flag bits 2211*b* in subsections 2211 are capable of correcting at least two data bit initialization errors 2220 per subsection 2211. DFEC flag bit initialization errors 2240, BCH parity bit errors 2230, and all other errors must be corrected by a secondary error correction method. The use of the ABF method, however, may substantially reduce the number of errors required to be corrected by this secondary error correction method for a given BER. Since the secondary error correction methods require many parity bits 2212 to correct a single error (BCH ECC requires 14 parity bits/error, for instance), compared to three-flag 2-bit ABF method of the present disclosure which requires three flag bits to correct two or more data bit initialization errors 2220, the use of the ABF methods of the present disclosure may substantially reduce the parity overhead for a given correctable BER.

Figure 22B:
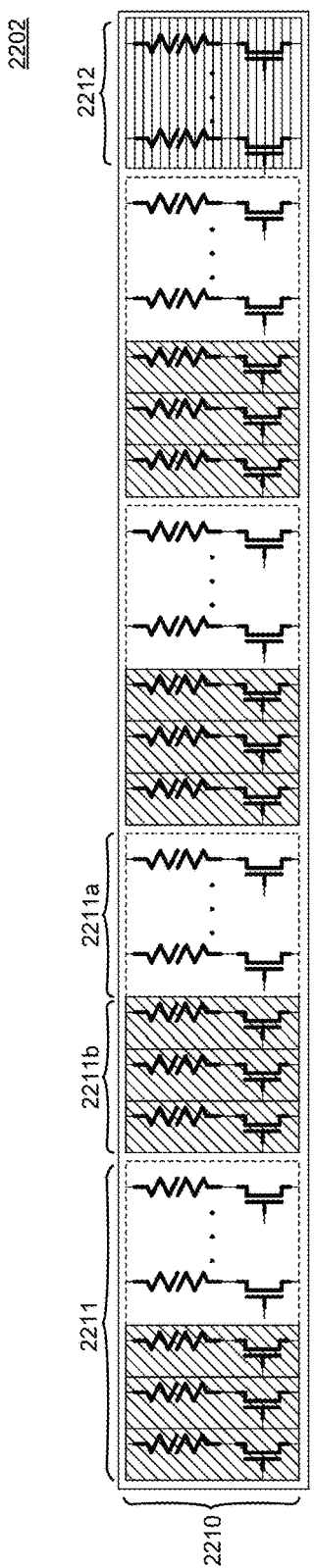
FIG. 22B is a diagram showing a 1-kilobyte block of FIG. 22A in more detail.

FIG. 22B depicts the exemplary memory block 2210 of FIG. 22A in more detail. As can be seen, memory block 2210 comprises multiple, in this case, four, subsections 2211, as well as parity bits 2212 for use with a selected secondary error correction method (such as, but not limited to, BCH). Subsections 2211 comprise data bits 2211*a* and DFEC flag bits 2211*b*. In this example, memory block 2210 is configured for the three-flag ABF method and hence DFEC flag bits 2211*b* comprise three flag bits per subsection. As described previously, however, a greater number of flag bits may be employed in certain applications in order to store a larger number of pattern reference codes. Further, to facilitate ABF pattern encoding, data bits 2211*a* are divided into data subsets, which may comprise two or more data bits.

Figure 23:
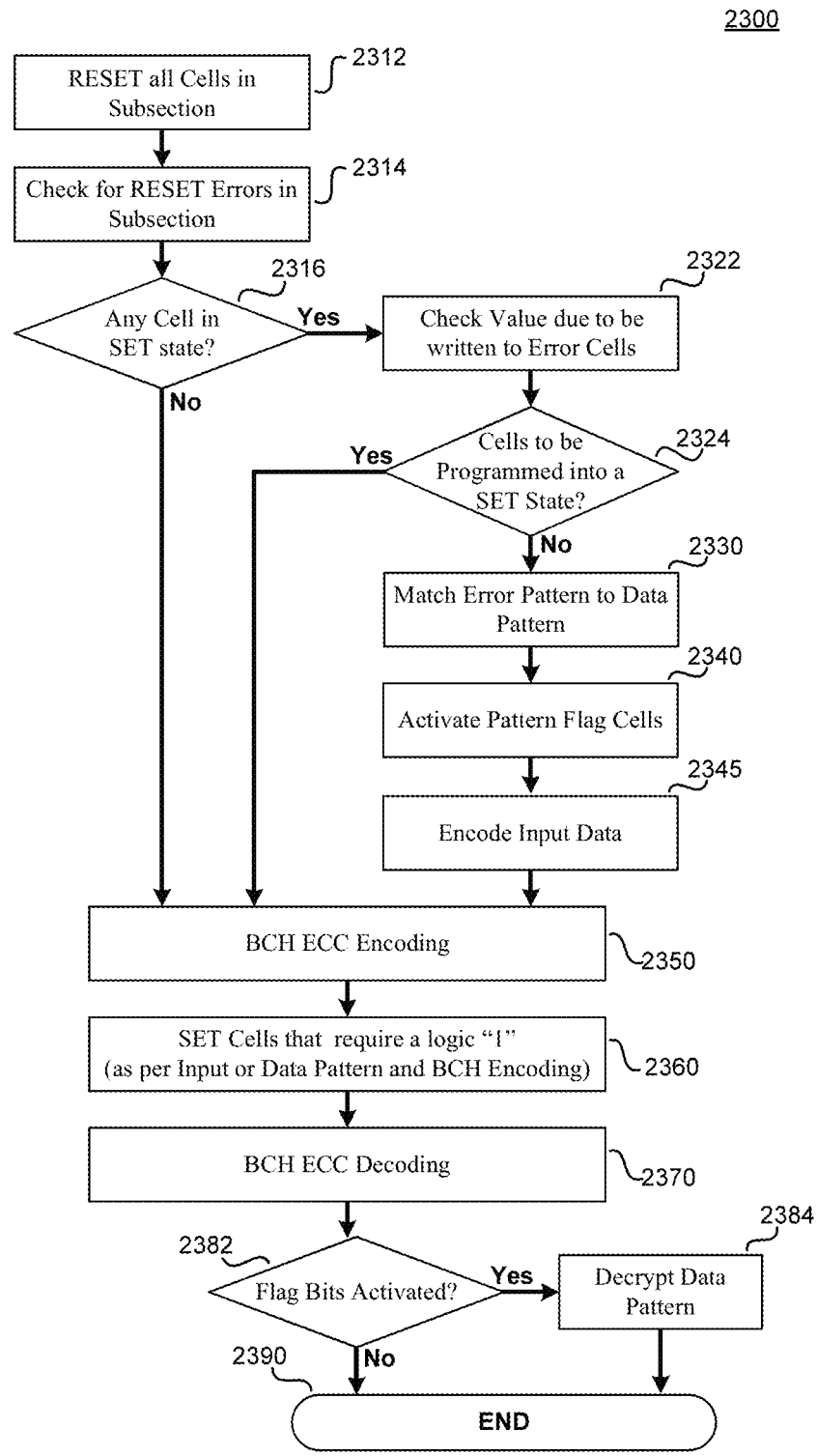
FIG. 23 is a flow chart detailing an exemplary programming/read back operation that uses the ABF methods of the present disclosure.

FIG. 23 is a flowchart depicting the use of the advanced bit flip (ABF) methods of the present disclosure during a programming/read operation 2300 on a single subsection of a resistive change element array, such as that depicted in FIG. 22A. In this example, the initialization state of the array is taken to be RESET (or, logic "0"), but as described previously the invention is not limited in this regard. In a first process step 2312 the subsection is initialized, wherein all cells (including both DFEC flags and data cells) are placed into a RESET state. In a second process step 2314, the subsection is checked for initialization errors (that is, a cell which has not been placed into a RESET state and instead remains in a SET state) and the process advances to step 2316. In step 2316, if there were no initialization errors detected in step 2314, the process advances to step 2350 without employing the DFEC pattern encoding methods. Otherwise the process proceeds to step 2322, wherein the input data (that is, the data due to be written to the subsection) is compared to the error cells. If all of the error cells detected in step 2314 are due to be programmed into a SET state there is effectively no error, as the cells are already in the desired final state. In this case the process advances to step 2350 without employing the DFEC pattern encoding methods. If, however, at least one of the error cells (currently SET) are due to be programmed into a RESET state, then the DFEC methods may be used to correct at least one of the errors, and the process proceeds to data pattern matching (DPM) step 2330. Here, the error pattern present in the array is compared to the input data pattern. An appropriate encoding pattern, such as those depicted in FIG. 21, is selected to match the input data to the initialization errors in order to correct the errors. The flag cells are then activated according to the pattern reference code (PRC) corresponding to the matched data pattern in step 2340.

Next, in step 2345, the input data is encoded according to the pattern indicated by the pattern reference code (PRC) indicated by the DFEC flag cells. For example, if the flag cells are activated in the 101 pattern, corresponding to pattern 6 (as shown in FIG. 21), then all data subsets in the input data with the pattern 10 are encoded as 01, and all data subsets in the input data with the pattern 10 are encoded as 01, while data subsets with the pattern 00 or 11 remain unchanged, as will be illustrated in FIGS. 24A-24F. In this way, the input data is encoded to match the error pattern present in the array.

During process step 2350, the original input data (if there were no effective errors), or the DFEC encoded input data, is further encoded using a secondary error correction method (in this case, BCH ECC), including the DFEC flag cells. Next, the encoded input data, as well as the BCH parity bits, are written to the subsection in step 2360, wherein cells requiring a logic "1" according to the DFEC encoded input data are SET. At this point, the array has been programmed with the input data and may remain in this state until overwritten.

Next, in order to retrieve the input data, the process proceeds to step 2370, wherein a READ operation is performed on the subsection and the READ data is subsequently decoded using the secondary error correction method (in this case, BCH ECC). In step 2370, any errors which occurred during the SET operation of step 2360, errors which were not corrected by DFEC in step 2345, as well as data retention errors, are corrected by the secondary error correction method. Following BCH decoding, the DFEC flag bits are checked in step 2382. If no flag bits are activated (corresponding to pattern 1), then the process proceeds to step 2390 and is complete. If at least one flag bit is active, however, the process advances to reverse data pattern matching (RDPM) step 2384. In RDPM step 2384, the output data is decoded according to the pattern reference code (PRC) indicated by the active DFEC flags. Thus, if the DFEC flags indicate pattern 6 encoding, then all data subsets in the read data with the pattern 01 are decoded as 10, and all data subsets in the read data with the pattern 10 are decoded as 01, while all data subsets with the pattern 00 or 11 remain unchanged, as will be illustrated in FIGS. 24A-24F. In this way, the original input data may be recovered and any errors corrected.

Three-Flag 2-Bit Advanced Bit Flip

As discussed previously, a set of eight encoding patterns (such as the eight patterns depicted in FIG. 21A) for the ABF methods of the present disclosure may be selected to guarantee the correction of at least two initialization errors per subsection. If the subsection contains more than two initialization errors, however, this set of ABF encoding patterns may not be able to correct all of the errors in the subsection. Further, all of the DFEC methods of the present disclosure, including the ABF methods, are only capable of correcting initialization errors. Therefore, a secondary error correction method, such as BCH, is required to correct programming errors, DFEC flag errors, and any initialization errors that are not corrected by the DFEC methods.

The following examples of FIGS. 24A-24F discuss the use of the three-flag 2-bit ABF method of the present disclosure. That is, these examples divide a subsection and its corresponding input data into subsets of two bits while employing three flag bits per subsection to store a pattern reference code (PRC) to indicate one of eight encoding patterns. As discussed previously, this set of eight patterns may be pre-selected from the total set of encoding patterns for a given subset size (see FIG. 21B for the possible encoding patterns for the 2-bit method) according to the needs of a particular application. For ease of explanation, the examples of FIGS. 24A-24F employ the eight patterns shown in FIG. 21A, which are selected to ensure the correction of at least two initialization errors per subsection and assume an initialization state of logic '1'. The set of eight patterns shown in FIG. 21A, however, are provided only as a demonstration of the ability to select a subset of encoding patterns according to a particular set of requirements, and the invention is not limited to the set of eight patterns shown in FIG. 21A or in the selection criteria employed to choose the set of encoding patterns. Further examples for a five-flag 2-bit ABF method utilizing the total set of encoding patterns (see FIG. 21B) may be found below in FIGS. 25A-25D.

It should be noted that the subsection used in the examples of FIGS. 24A-24F is for illustrative purposes only, and in real applications such a subsection may contain a far greater number of data bits than the sixteen depicted. Further, although the data cells have been assigned into subsets of two bits for ease of explanation, the data cells may not necessarily be grouped in the hardware of the array layout, and may be grouped by whatever means or in whatever number or pattern befits a particular application. As in previous examples, the initialization state of the subsection is taken to be RESET (logic "0"), but the invention is not limited in this regard.

Figure 24A:
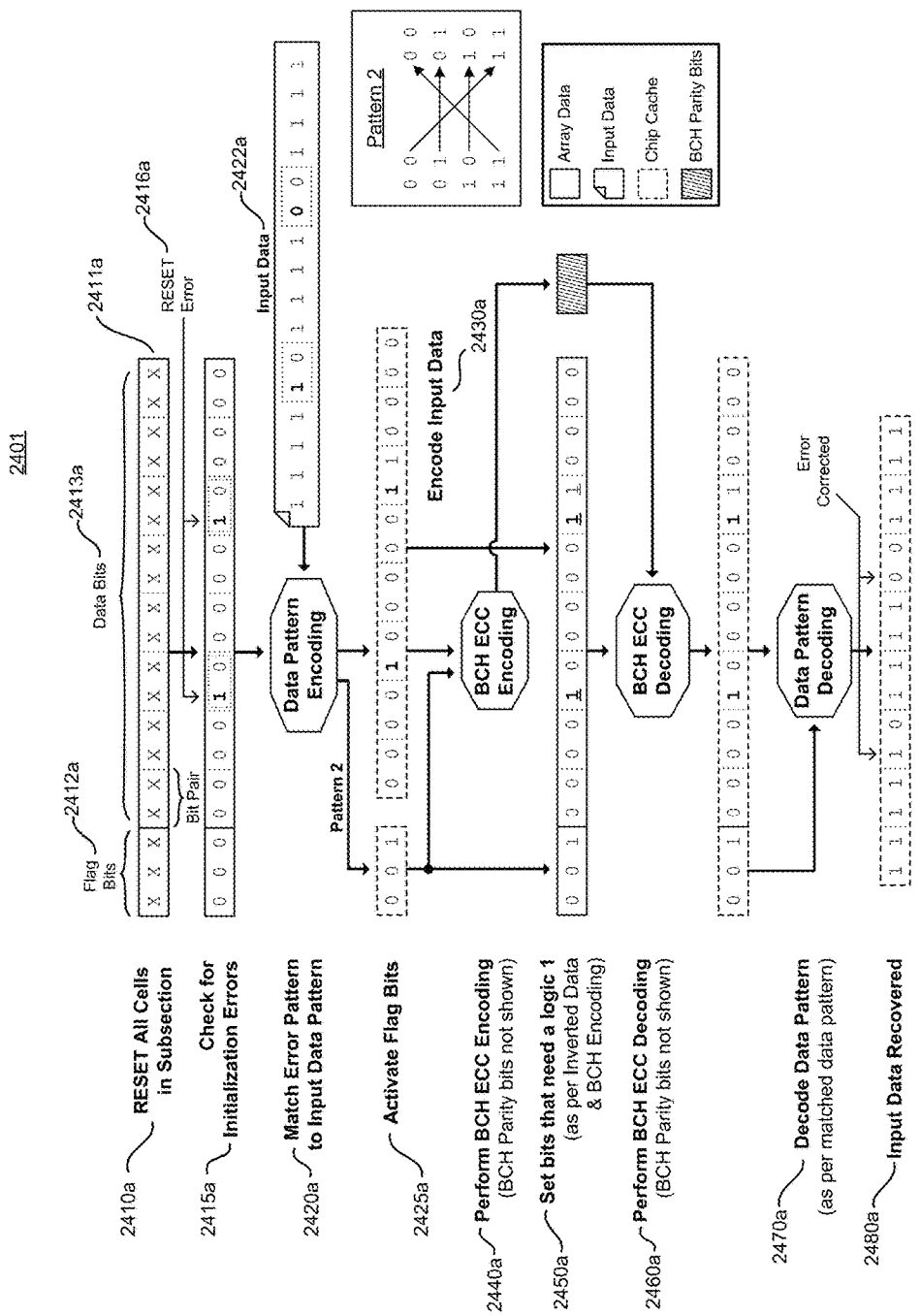
FIG. 24A is a diagram illustrating an exemplary error correction operation according to the three-flag 2-bit ABF method of the present disclosure used to correct two RESET errors on two even cells wherein one is intended to be written with a logic "0" and the other is intended to be written with a logic "1".

FIG. 24A depicts an exemplary programming/read operation 2401 using the three-flag 2-bit ABF method of the present disclosure to correct two even initialization errors in subsection 2411a. In a first process step 2410a, all of the cells in subsection 2411a, including flag bits 2412a and data bits 2413a, are initialized into a RESET state, analogous to operation 2312. Next, the subsection is checked for initialization errors in step 2415a. As can be seen, two even cells 2416a have failed to RESET and remain in a SET state, and the process proceeds to step 2420a. Here, analogous to data pattern matching (DPM) step 2330, the error pattern is compared to input data 2422a. As can be seen, the first error pair 10 already corresponds to the input data subset 10 and should not be changed. The second error pair 10, however, needs to correspond to 00 in the input data. Thus, pattern 3 is selected to match the input data to the error pattern so as to translate 00 to 11 (thus correcting error 10) and translating 10 as 10 (correcting error 10).

Once the appropriate pattern has been identified, the DFEC flags are activated in step 2425a (analogous to operation 2340) according to the pattern reference code (PRC), which is 010 for pattern 3. Next, in step 2430a (analogous to operation 2345), the input data is encoded with the selected pattern, wherein each input data subset is selectively inverted according to the encoding pattern. The DFEC encoded input data and flag cells are then further encoded using BCH ECC in step 2440a.

The encoded input data is then written to the subsection in step 2450a. Since the subsection has already been initialized into a RESET state (aside from error cells 2416a), only those cells requiring a logic 1 according to the encoded input data need to be SET. In some applications, error cells 2416a do not need to be programmed, as they are already in the correct state, however, in other applications the error cells may be fully programmed to ensure they are fully in a SET state. Following this operation, the encoded input data has been written to the subsection and RESET errors 2416a have been corrected.

In order to retrieve input data 2422a, a READ operation is performed on the subsection. The read data is then decoded using BCH ECC in step 2460a. Since the read data has been encoded using the ABF method, the read data must be further decoded in reverse data pattern matching (RDPM) step 2470a. Here, the PRC indicated by the activated flag bits is used to identify which ABF pattern is required to decode the read data. The data subsets within the read data are then selectively inverted according to the ABF pattern, which in this case is pattern 3. Once decoded, the read data matches the input data and the operation concludes in step 2480a. In this way, the three-flag 2-bit ABF method of the present disclosure may be used to correct two even initialization errors in a subsection.

Figure 24B:
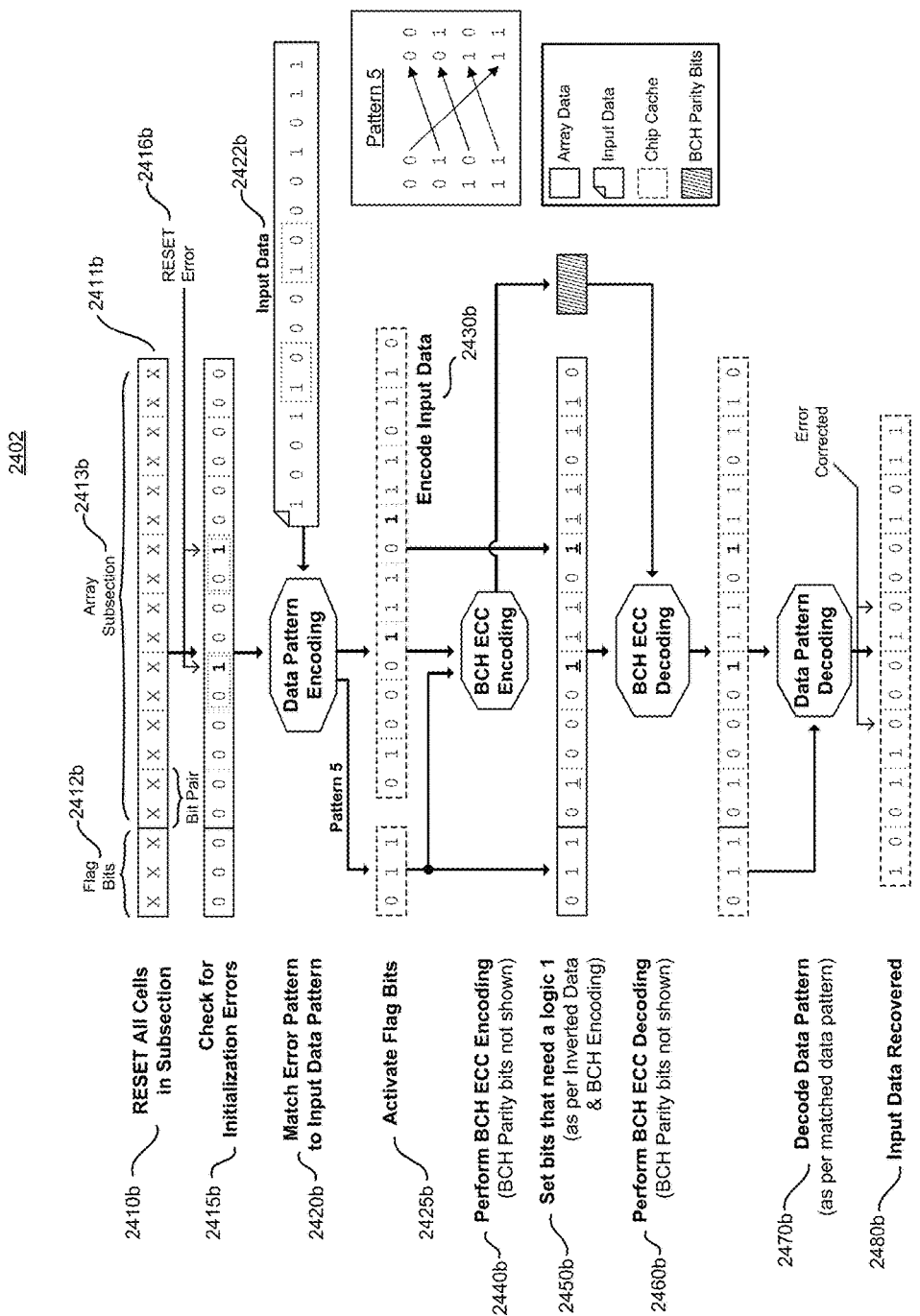
FIG. 24B is a diagram illustrating an exemplary error correction operation according to the three-flag 2-bit ABF method of the present disclosure used to correct two RESET errors on two odd cells intended to be written with a logic "0".

Similarly, FIG. 24B depicts an exemplary programming/read operation 2402 which demonstrates the use of the three-flag 2-bit ABF method of the present disclosure to correct two odd initialization errors in a subsection. In a first process step 2410a, all of the cells in subsection 2411b, including flag bits 2412b and data bits 2413b, are initialized into a RESET state, analogous to operation 2312. Next, the subsection is checked for initialization errors in step 2415b. As can be seen, two odd cells 2416b have failed to RESET and remain in a SET state, and the process proceeds to step 2420b. Here, analogous to data pattern matching (DPM) step 2330, the error pattern is compared to input data 2422b. As can be seen, both error pairs have the pattern 01, while both corresponding input data pairs require the pattern 10. Thus, pattern 5 is selected to match the input data 2422b to the error pattern by translating 10 to 01.

Once the appropriate pattern has been identified, the DFEC flags are activated in step 2425b (analogous to operation 2340) according to the pattern reference code (PRC), which is 011 for pattern 5. Next, in step 2430b (analogous to operation 2345), the input data is encoded with the selected pattern, wherein each input data subset is selectively inverted according to the encoding pattern. The DFEC encoded input data and flag cells are then further encoded using BCH ECC in step 2440b.

The encoded input data is then written to the subsection in step 2450b. Since the subsection has already been initialized into a RESET state (aside from error cells 2416b), only those cells requiring a logic 1 according to the encoded input data need to be SET. In some applications, error cells 2416b do not need to be programmed, as they are already in the correct state, however, in other applications the error cells may be programmed to ensure they are fully in a SET state. Following this operation, the encoded input data has been written to the subsection and RESET errors 2416b have been corrected.

In order to retrieve input data 2422b, a READ operation is performed on the subsection. The read data is then decoded using BCH ECC in step 2460b. Since the read data has been encoded using the ABF method, the read data must be further decoded in reverse data pattern matching (RDPM) step 2470b. Here, the PRC indicated by the activated flag bits is used to identify which ABF pattern is required to decode the read data. The data subsets within the read data are then selectively inverted according to the ABF pattern, which in this case is pattern 5. Once decoded, the read data matches the input data and the operation concludes in step 2480b. In this way, the three-flag 2-bit ABF method of the present disclosure may be used to correct two odd initialization errors in a subsection.

Figure 24C:
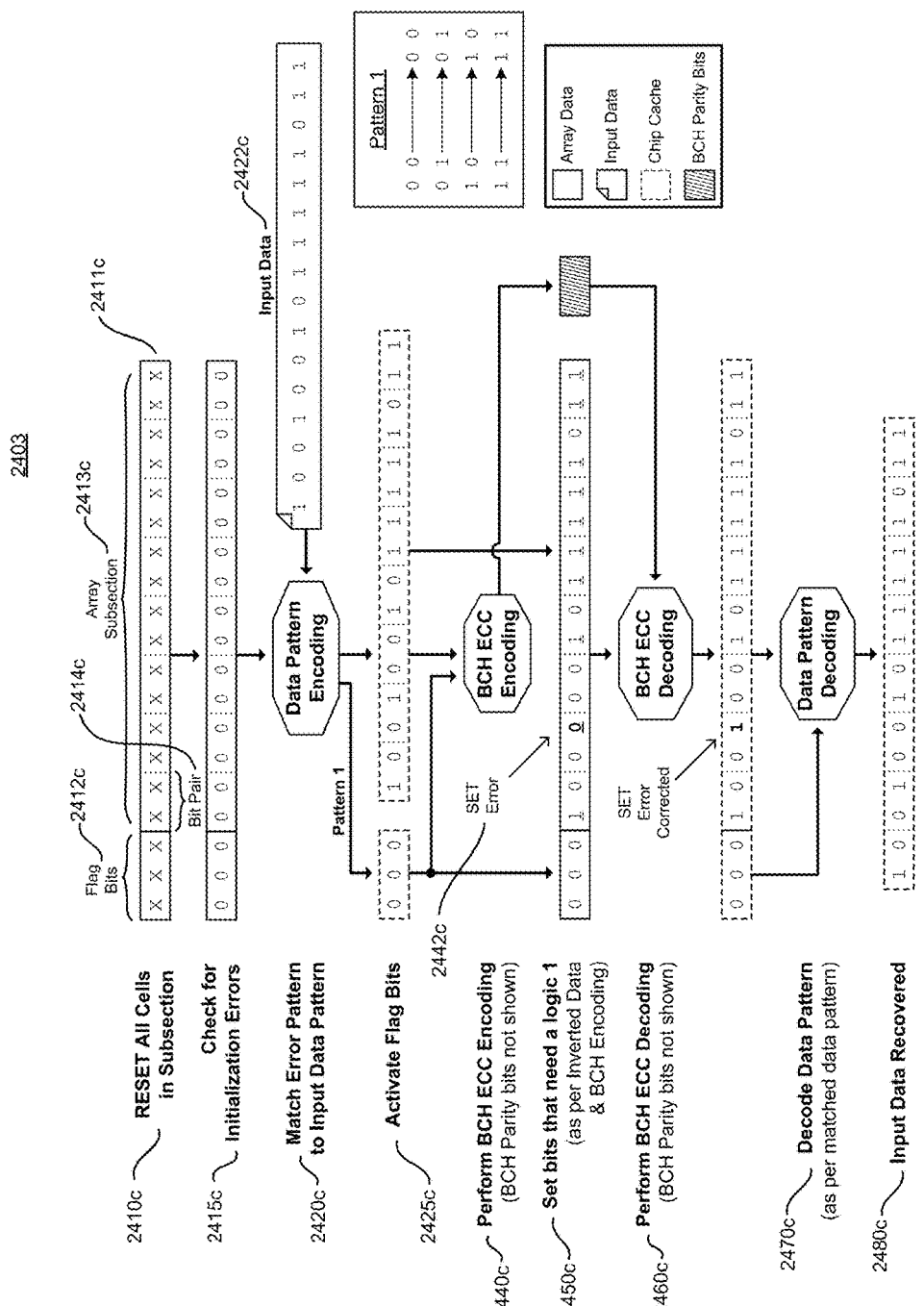
FIG. 24C is a diagram illustrating an exemplary error correction operation according to the three-flag 2-bit ABF method of the present disclosure used to correct a single SET error.

Looking now to FIG. 24C, as discussed previously, the DFEC methods of the present disclosure are only capable of correcting initialization errors. Here, the necessity of a secondary error correction method is demonstrated through exemplary programming/read operation 2403. In a first process step 2410c, all of the cells in subsection 2411c, including flag bits 2412c and data bits 2413c, are initialized into a RESET state, analogous to operation 2312. Next, the subsection is checked for initialization errors in step 2415c. As can be seen, no initialization errors have occurred. In some applications, the process continues to step 2440c without employing the DFEC methods. Alternatively, data pattern matching may be performed in step 2420c to compare the error pattern to input data 2422c. In this case, since there are no effective errors, pattern 1 is selected and the flag bits 2412c are activated according to the PRC, which is 000.

In either case, the unchanged input data 2422c is encoded using BCH ECC in step 2440c. The encoded input data is then written to the subsection in step 2450c. Since the subsection has already been initialized into a RESET state, only those cells requiring a logic 1 according to the encoded input data need to be SET. During the writing process, however, SET error 2442c occurs, and cell 2442c remains in a RESET state. Following this operation, the encoded input data has been written to the subsection with error 2442c and may remain in this state until overwritten.

In order to retrieve input data 2422c, a READ operation is performed on subsection 2411c. The read data is then decoded using BCH ECC in step 2460c. During this decoding process, the read data is compared to the BCH ECC parity bits to identify and correct error 2442c. At this point, since there were no initialization errors, and programming error 2442c has been corrected, the original input data 2422c is recovered and the operation may conclude in step 2480c with no further actions taken. In some applications, however, the BCH ECC decoded read data may be further decoded using the ABF method in RDPM step 2470c according to the PRC indicated by the activated flags. Since PRC encoded in the flags is 000, pattern 1 is identified and no changes need to be made to the BCH ECC decoded read data. The input data is now recovered, and the operation concludes in step 2480c. In this way, the three-flag 2-bit ABF method of the present disclosure may be used in concert with a secondary error correction method to correct all types of errors.

Figure 24D:
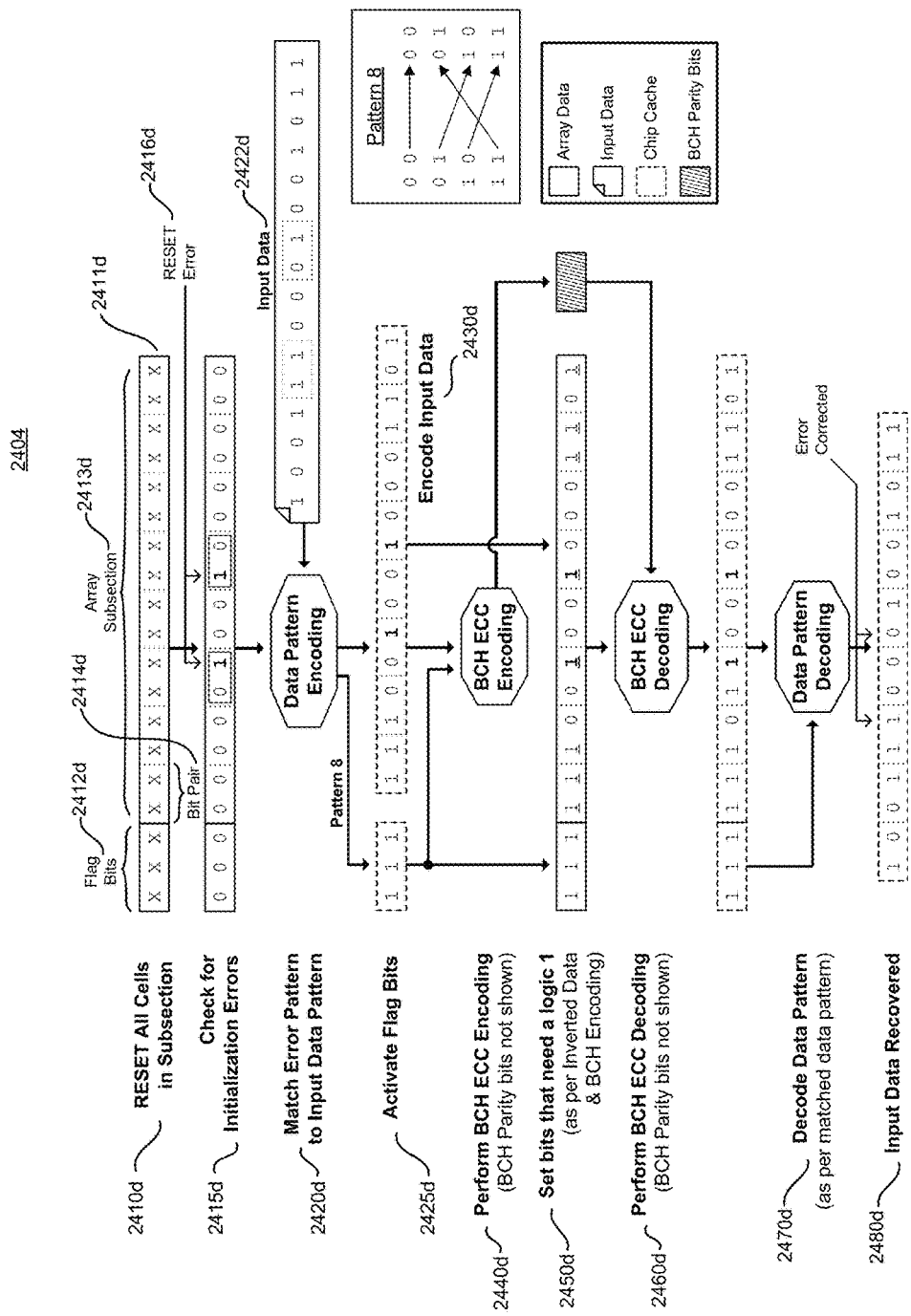
FIG. 24D is a diagram illustrating an exemplary error correction operation according to the three-flag 2-bit ABF method of the present disclosure used to correct two RESET errors on one even and one odd cell wherein the even cell is intended to be written with a logic "0" and the odd cell is intended to be written with a logic "1".

FIG. 24D provides another example of the use of the three-flag 2-bit ABF method of the present disclosure to correct multiple errors in a subsection. In a first process step 2410d, all of the cells in subsection 2411d, including flag bits 2412d and data bits 2413d, are initialized into a RESET state, analogous to operation 2312. Next, the subsection is checked for initialization errors in step 2415d. As can be seen, two initialization errors 2416d have occurred on one even and one odd cell, which remain in a SET state. In DPM step 2420d, analogous to data pattern matching (DPM) step 2330, the error pattern is compared to input data 2422d. As can be seen, the first error pair has the pattern 01 and needs to be in the final state 11, so there is effectively no error. The second error pair, however, has the pattern 10 and needs to be in the final state 01. Thus, pattern 7 is selected to match the input data 2422d to the error pattern by translating 01 to 11 and 11 to 01.

Once the appropriate pattern has been identified, the DFEC flags are activated in step 2425d (analogous to operation 2340) according to the pattern reference code (PRC), which is 110 for pattern 7. Next, in step 2430d (analogous to operation 2345), the input data is encoded with the selected pattern, wherein each input data subset is selectively inverted according to the encoding pattern. The DFEC encoded input data and flag cells are then further encoded using BCH ECC in step 2440d.

The encoded input data is then written to the subsection in step 2450d. Since the subsection has already been initialized into a RESET state (aside from error cells 2416d), only those cells requiring a logic 1 according to the encoded input data need to be SET. In some applications, error cells 2416d do not need to be programmed, as they are already in the correct state, however, in other applications the error cells may be programmed to ensure they are fully in a SET state. Following this operation, the encoded input data has been written to the subsection and RESET errors 2416d have been corrected.

In order to retrieve input data 2422d, a READ operation is performed on the subsection. The read data is then decoded using BCH ECC in step 2460d. Since the read data has been encoded using the ABF method, the read data must be further decoded in reverse data pattern matching (RDPM) step 2470d. Here, the PRC indicated by the activated flag bits is used to identify which ABF pattern is required to decode the read data. The data subsets within the read data are then selectively inverted according to the ABF pattern, which in this case is pattern 7. Once decoded, the read data matches the input data and the operation concludes in step 2480d. In this way, the three-flag 2-bit ABF method of the present disclosure may be used to correct one odd and one even initialization error in a subsection.

Figure 24E:
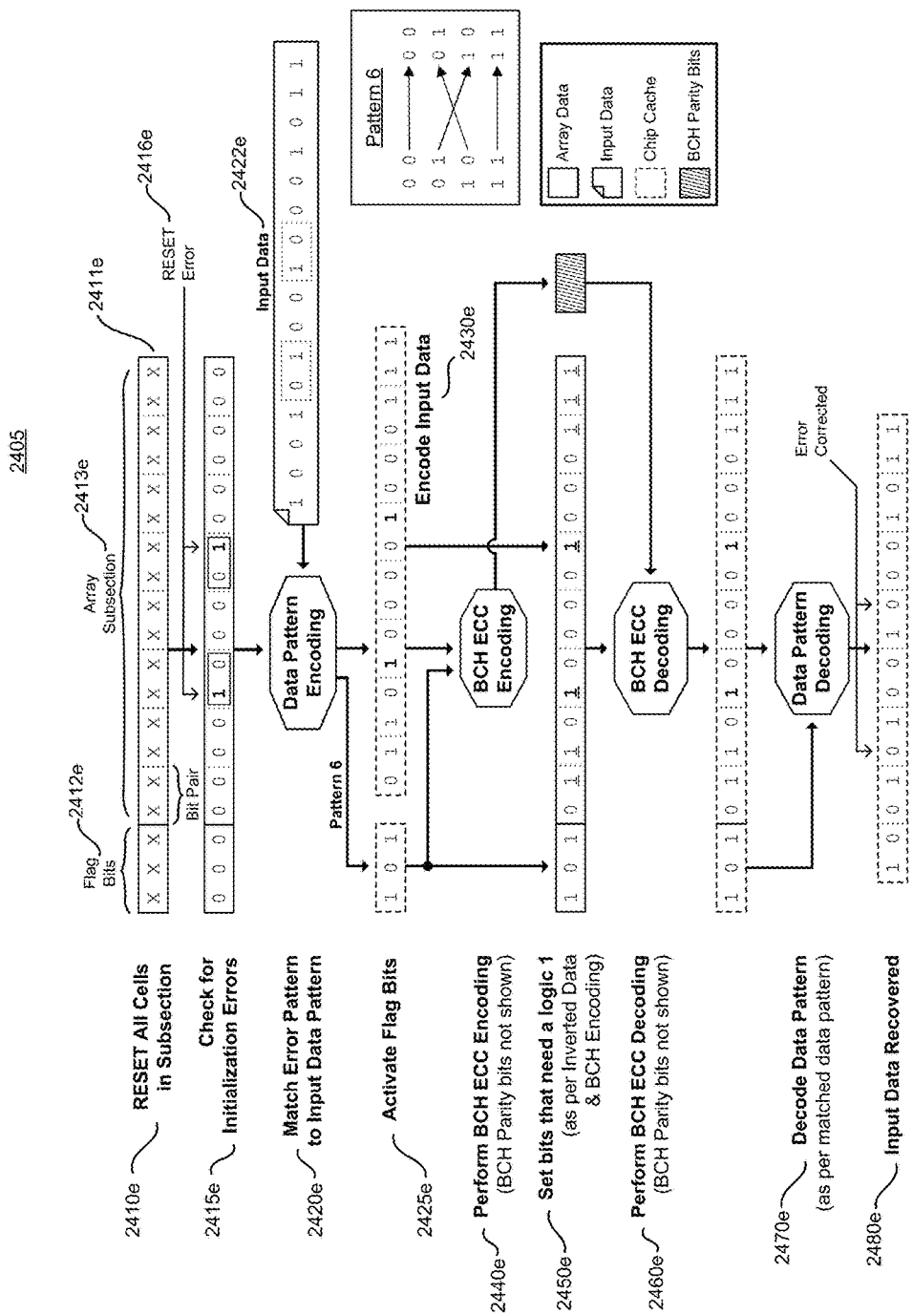
FIG. 24E is a diagram illustrating an exemplary error correction operation according to the three-flag 2-bit ABF method of the present disclosure used to correct two RESET errors on one even and one odd cell intended to be written with a logic "0".
Figure 24F:
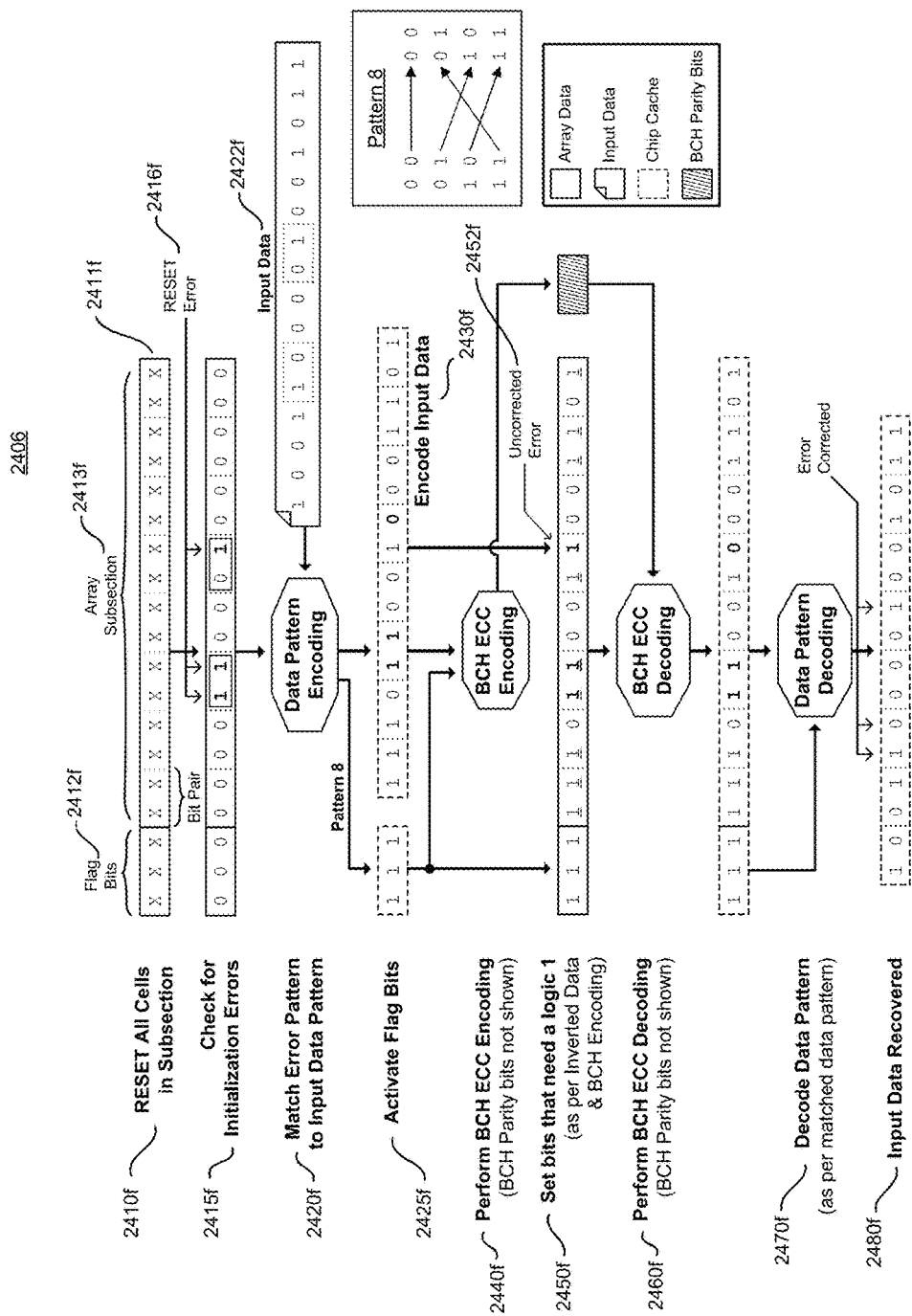
FIG. 24F is a diagram illustrating an exemplary error correction operation according to the three-flag 2-bit ABF method of the present disclosure used to correct three RESET errors on one even and two odd cells wherein one odd cell is intended to be written with a logic "0" and the others are intended to be written with a logic "1".

Similarly, FIG. 24E depicts an exemplary programming/read operation 2405 which again demonstrates the use of the three-flag 2-bit ABF method of the present disclosure to correct one odd and one even error in a subsection. In a first process step 2410e, all of the cells in subsection 2411e, including flag bits 2412e and data bits 2413e, are initialized into a RESET state, analogous to operation 2312. Next, the subsection is checked for initialization errors in step 2415e. As can be seen, one odd and one even cell 2416e have failed to RESET and remain in a SET state, and the process proceeds to step 2420e. Here, analogous to data pattern matching (DPM) step 2330, the error pattern is compared to input data 2422e. As can be seen, the first error pair has the pattern 10 and must be corrected to 01. The second error pair, however, has the pattern 01 and must be corrected to 10. Thus, pattern 2 is selected to match the input data 2422e to the error pattern by translating 01 to 10 and 10 to 01.

Once the appropriate pattern has been identified, the DFEC flags are activated in step 2425e (analogous to operation 2340) according to the pattern reference code (PRC), which is 001 for pattern 2. Next, in step 2430e (analogous to operation 2345), the input data is encoded with the selected pattern, wherein each input data subset is selectively inverted according to the encoding pattern. The DFEC encoded input data and flag cells are then further encoded using BCH ECC in step 2440e.

The encoded input data is then written to the subsection in step 2450e. Since the subsection has already been initialized into a RESET state (aside from error cells 2416e), only those cells requiring a logic 1 according to the encoded input data need to be SET. In some applications, error cells 2416e do not need to be programmed, as they are already in the correct state, however, in other applications the error cells may be programmed to ensure they are fully in a SET state. Following this operation, the encoded input data has been written to the subsection and RESET errors 2416e have been corrected.

In order to retrieve input data 2422e, a READ operation is performed on the subsection. The read data is then decoded using BCH ECC in step 2460e. Since the read data has been encoded using the ABF method, the read data must be further decoded in reverse data pattern matching (RDPM) step 2470e. Here, the PRC indicated by the activated flag bits is used to identify which ABF pattern is required to decode the read data. The data subsets within the read data are then selectively inverted according to the ABF pattern, which in this case is pattern 2. Once decoded, the read data matches the input data and the operation concludes in step 2480e. In this way, the three-flag 2-bit ABF method of the present disclosure may be used to correct one even and one odd initialization error in a subsection.

In a final example, FIG. 24F depicts an exemplary programming/read operation 2406 which demonstrates the ability of the three-flag 2-bit ABF method of the present disclosure to correct more than two errors in a subsection, dependent on the error distribution. In a first process step 2410f, all of the cells in subsection 2411f, including flag bits 2412f and data bits 2413f, are initialized into a RESET state, analogous to operation 2312. Next, the subsection is checked for initialization errors in step 2415f. As can be seen, three cells 2416f have failed to RESET and remain in a SET state, and the process proceeds to step 2420f. Here, analogous to data pattern matching (DPM) step 2330, the error pattern is compared to input data 2422f. As can be seen, the first error pair has the pattern 11 and must be corrected to 10. The second error pair, however, has the pattern 01 and there is effectively no error. Although the exemplary set of eight patterns shown in FIG. 21 are only guaranteed to correct up to two errors per subsection, in this case, pattern 8 is capable of correcting all three errors that have occurred due to the distribution of errors and the input data pattern. Thus, pattern 8 is selected to encode the input data.

Now that the appropriate pattern has been identified, the DFEC flags are activated in step 2425f (analogous to operation 2340) according to the pattern reference code (PRC), which is 111 for pattern 8. Next, in step 2430f (analogous to operation 2345), the input data is encoded with the selected pattern, wherein each input data subset is selectively inverted according to the encoding pattern. The DFEC encoded input data and flag cells are then further encoded using BCH ECC in step 2440f.

The encoded input data is then written to the subsection in step 2450f. Since the subsection has already been initialized into a RESET state (aside from error cells 2416f), only those cells requiring a logic 1 according to the encoded input data need to be SET. In some applications, error cells 2416f do not need to be programmed, as they are already in the correct state, however, in other applications the error cells may be programmed to ensure they are fully in a SET state. Unfortunately, since programming operation 2450f only SETs the cells, one of the errors 2416f remains uncorrected by the ABF method, as it needs to be RESET and is currently in a SET state. Following this operation, the encoded input data has been written to the subsection with an uncorrected initialization error 2452f and may remain in this state until overwritten.

In order to retrieve input data 2422f, a READ operation is performed on the subsection. The read data is then decoded using BCH ECC in step 2460f. During the BCH ECC decoding process, the uncorrected error 2452f is detected and corrected by BCH ECC. Since the read data has also been encoded using the ABF method, the read data must be further decoded in reverse data pattern matching (RDPM) step 2470f. Here, the PRC indicated by the activated flag bits is used to identify which ABF pattern is required to decode the read data. The data subsets within the read data are then selectively inverted according to the ABF pattern, which in this case is pattern 8. Once decoded, the read data matches the input data and the operation concludes in step 2480f. In this way, the three-flag 2-bit ABF method of the present disclosure may be used to correct multiple initialization errors in a subsection in concert with a secondary error correction method.

Five-Flag 2-Bit Advanced Bit Flip

As discussed previously, in some circumstances it may be advantageous to utilize all of the possible encoding patterns for a given subset size, despite the larger number of flag bits required. While the set of eight encoding patterns depicted in FIG. 21A are capable of correcting at least two initialization errors per subsection, any errors beyond these two are not considered during data pattern matching and the eight patterns may not be sufficient to address all error patterns. Thus, the chances of being able to correct more than two errors per subsection is lower than if all possible patterns are employed.

Figure 21B:
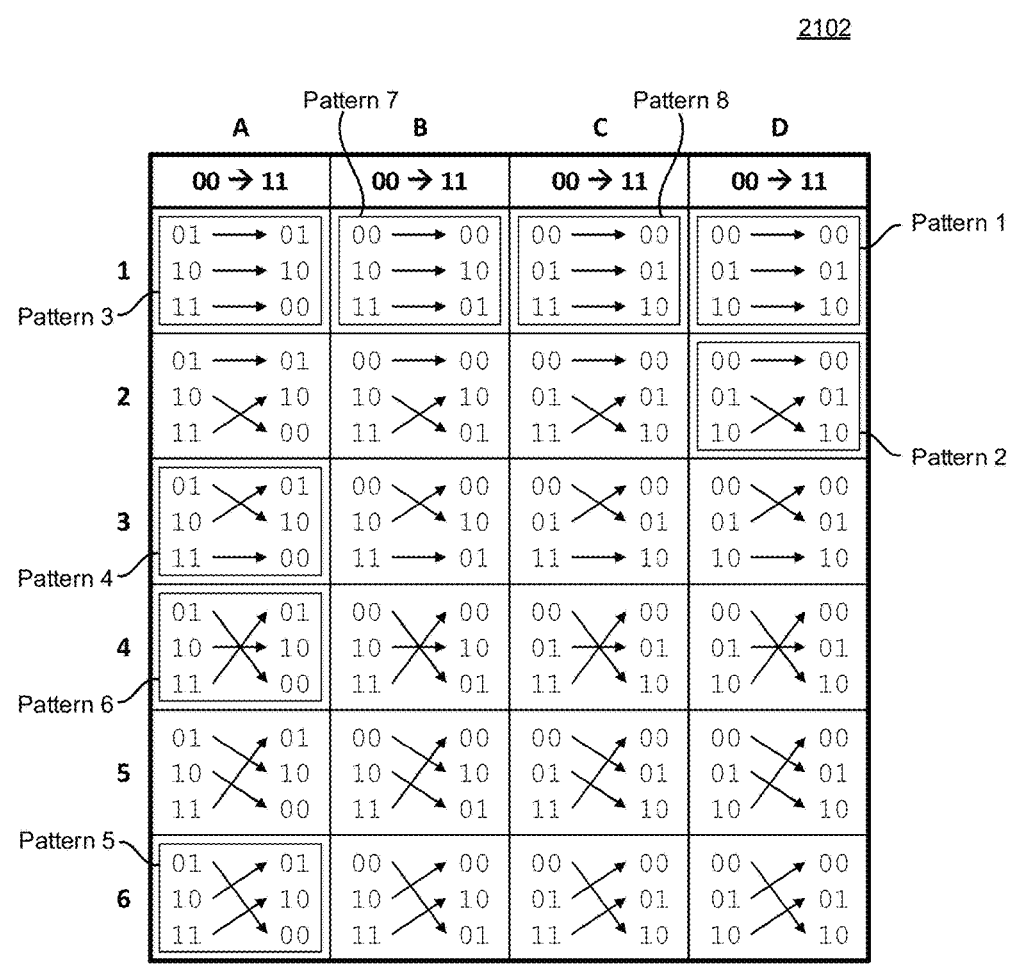

Statistically, assuming a large number of trials and a large number of errors, using all 24 encoding patterns of the 2-bit ABF method can ensure the correction of at least 50% of all errors in a subsection in addition to the two errors which are guaranteed to be corrected (since the 24 patterns of FIG. 21B include the 8 patterns of FIG. 21A). Essentially, the probability of a continuous error (that is, two initialization errors in a single subset) is extremely small (roughly 0.3%) and all errors may therefore be assumed to be either even or odd (that is, to have a data pattern of 10 or 01, respectively) and will be distributed across the possible input patterns (00, 01, 10 or 11). Further, for the purposes of data pattern matching, a continuous error may be treated as both an even and an odd error without being afforded a separate category. From this, it can be seen that any input pattern translated to 11 will be capable of correcting 100% of its corresponding errors (three errors with pattern 10, 01, and 10 with corresponding input pattern 00 can all be corrected if 00 is translated to 11, for instance). Any input pattern translated to 10 or 01, on the other hand, only has a 50% chance of correcting its corresponding errors in the worst case distribution of errors. Only half set of a set of errors 01, 01, 10 and 10 with corresponding input 11 can be corrected if 11 is translated to 01 or 10, for instance. Usually, however, errors will not be evenly distributed, and any imbalance can improve the number of errors corrected above the minimum of 50%. Finally, any input pattern translated to 00 has a 0% chance to correct any errors.

Figure 25A:
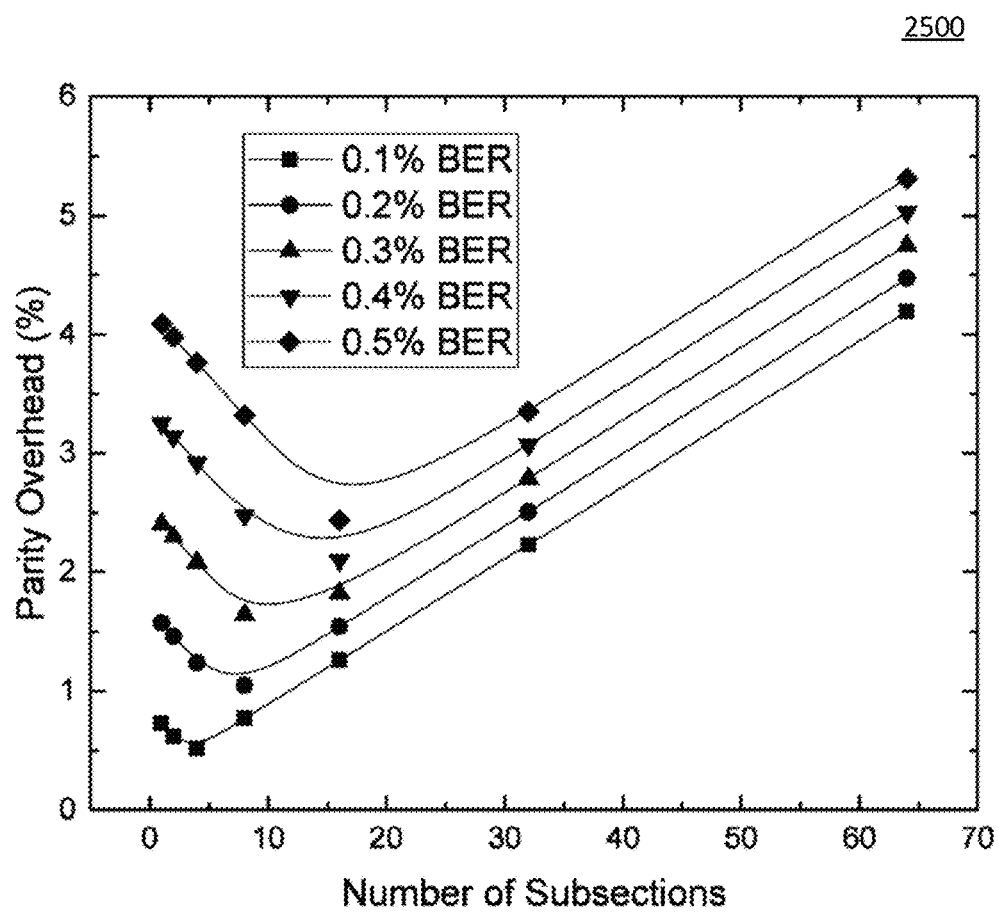
FIG. 25A is a scatter plot showing the parity overhead necessary to achieve five correctable BERs for various subsection sizes using the five-flag 2-bit ABF method.

From this, assuming a worst-case distribution of errors (that is, an equal distribution of errors across input patterns), the minimum number of errors which can be corrected may be calculated by:

$$\text{\# errors corrected} = 100\%\frac{n}{4} + 50\%\frac{n}{4} + 50\%\frac{n}{4} = 0.5\,n$$

where n is the total number of initialization errors, giving a worst-case error correction of 50%. Unlike the three-flag method, however, in which three flags are used to correct at least two errors, the five flag ABF method is generally more efficient with larger subsections and higher error rates since its correction ability scales as a percentage, but is not necessarily more effective. For example, if 30 initialization errors occur in an 8 kb subsection, at least 15 errors may be corrected by five flag bits, giving three errors corrected per flag bit. This may be compared to the 14 parity bits required by BCH to correct a single error in a similar subsection. To illustrate this, FIGS. 25A-25C show calculations of the parity overhead for the five flag method at different BER and subsection size. It should be noted that the examples of FIGS. 25A-25C are provided as an example of the advantages and disadvantages and general trends of the various DFEC methods of the present disclosure and do not reflect experimental data or expected outcomes. The optimization of the DFEC methods taught herein must be performed taking the particular conditions and requirements of a specific application into account.

FIG. 25A shows a plot 2500 of the variation of parity overhead with subsection size at five error rates in an exemplary 8 kb memory block using the five-flag 2-bit ABF method. As seen in previous examples of the DFEC methods, the parity overhead reaches a minimum at a particular number of subsections for each BER, increasing rapidly as the block is divided into more subsections. This behavior is similar to that seen in FIGS. 16B and 16C, wherein the parity overhead reaches a minimum and then increases as more subsections are added. This demonstrates the need to optimize the subsection configuration for the expected BER of a particular application. In the case of the five-flag ABF method, however, the optimal number of subsections at each BER is greatly reduced compared to the previous methods as a result of its particular scaling behavior, as described previously.

FIG. 25B provides a comparison between the parity overhead required for the RFEC, DRFEC, three-flag 2-bit ABF and five-flag 2-bit ABF methods to achieve a correctable BER of 0.2% for a given number of subsections in an exemplary 8 kb memory block. At eight subsections, for instance, the five-flag ABF method provides the lowest overall parity overhead, at 1.05%. This may be compared to the parity overhead of 2.73% required for BCH alone, giving a reduction of nearly 62%. At smaller subsections, however, the five-flag method quickly loses efficiency, leading to a parity overhead of 4.47% at 64 subsections—larger than that required for BCH alone. It is thus imperative to select the DFEC method and the particular configuration thereof to meet the requirements of a given application.

In order to examine the relative strengths of each DFEC method, therefore, FIG. 25C provides a comparison of the optimal configuration of each DFEC method for five correctable error rates. First, the optimal subsection configuration was calculated for each method. It may clearly be seen that the five-flag ABF method requires a significantly reduced number of subsections compared to the other DFEC methods, requiring only a 16 subsections at 0.5% BER compared to the 32 for three-flag ABF, for instance. Again, as discussed previously, this behavior is a result of the error correction scaling of the five-flag ABF method, which provides a guaranteed percentage rather than a discrete number of errors corrected.

Looking to the next five columns, the parity overhead corresponding to each of the optimal configurations was calculated for each error rate. As can be seen, the five-flag ABF method provides the most efficient solution for all BERs. That said, however, at higher BERs of 0.4% and 0.5%, the parity overhead required for the three-flag ABF method is nearly equal to that of the five-flag method. Since the three-flag method may employ a simpler circuit and reduced processing latency, in these cases it may be advantageous to use only three-flags with a properly selected subset of encoding patterns. The selection of the DFEC method employed may thus be conducted according to an analysis of circuit complexity, latency and chip surface area (related to parity overhead) to optimize the DFEC methods to a particular application. It should be noted again, however, that the analysis presented in FIGS. 25A-C is provided only as an example of the ability to optimize the DFEC method employed and the specific configuration thereof to the requirements of a particular application and does not represent experimental data.

Looking now to FIGS. 26A-26E, examples of the five-flag 2-bit ABF method are illustrated. The following examples examine the use of the five-flag ABF method to correct initialization errors in a single subsection of a resistive change element array. As in previous examples, this exemplary resistive change element array is assumed to have an initialization state of logic '0', corresponding to the state expected to result in a greater error rate. Further, the following examples demonstrate the use of two-bit subsets and the set of encoding patterns depicted in FIG. 21B, containing all possible encoding patterns for a two-bit subset. As mentioned previously, however, the ABF method is not limited to the use of two-bit subsets, nor to the encoding patterns provided in FIG. 21B. It will be apparent to those skilled in the art that the methods taught herein may be used to similarly encode subsets of any number of bits, and may employ substantially all or only a selected set of encoding patterns from the total set of all possible encoding patterns for a given subset size.

Figure 26A:
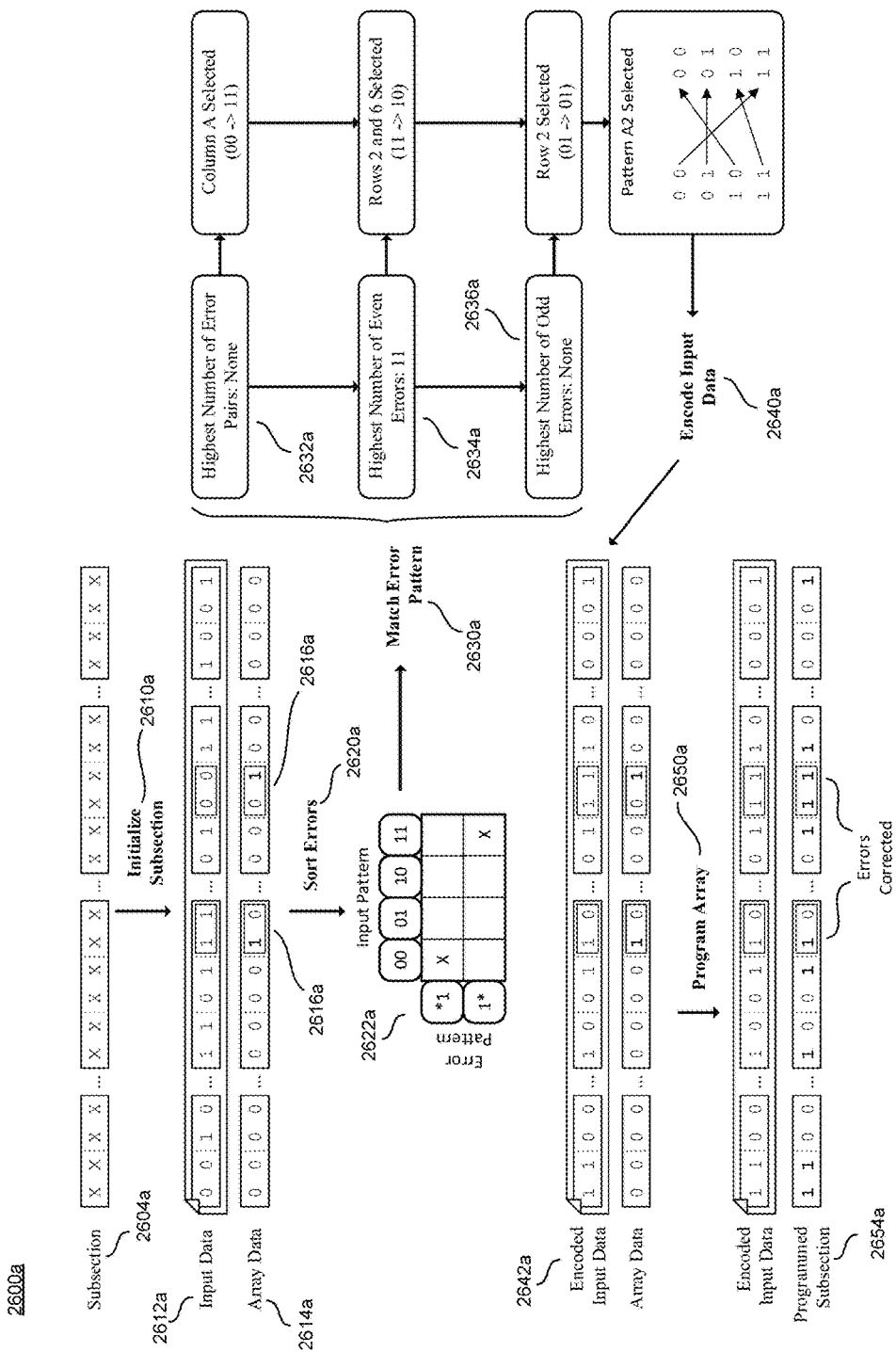
FIG. 26A is a diagram illustrating an exemplary error correction operation according to the five-flag 2-bit ABF method of the present disclosure used to correct at least two initialization errors in a subsection of a resistive change element array.

FIG. 26A depicts an encoding operation 2600a using the five-flag 2-bit ABF method of the present disclosure to correct multiple initialization errors in subsection 2604a of a resistive change element array. First, subsection 2604a, comprising a plurality of data cells and five flag cells, is initialized in step 2610a. Using operations described previously, an initialization operation is performed on all of the data cells within subsection 2604a to attempt to place them into an initialized state. Once initialized, subsection 2604a is read to provide array data 2614a, which contains the logical state of each of the data cells in the subsection. As can be seen, two subsets 2616a within array data 2614a contain data cells which failed to initialize and remain in an uninitialized state (in this case, a logic '1' state) and may be considered error subsets.

Next, each error subset 2616a is compared to its corresponding subset in input data 2612a to determine the presence of effective initialization errors. That is, the logical state of the error cells within subsets 2616a is compared to the logical state of their corresponding bits in input data 2612a. If the logical state of the error cells match the logical state of the input data, then effectively no error has occurred, as the cells are already in the desired state. In this case, the input data may not need to be encoded using the ABF method. If at least one effective initialization error is detected, however, then the process proceeds to a data pattern matching (DPM) operation, comprising sorting operation 2620a and matching operation 2630a.

As shown in FIG. 26A, this data pattern matching operation attempts to identify an encoding pattern which can correct the maximum number of initialization errors in subsets 2616a. To achieve this, the error subsets and their corresponding input subsets are selected and sorted in step 2620a according to input pattern and error pattern, as illustrated with table 2622a, wherein each of the initialization errors in subsets 2616a are depicted with an X. Table 2622a contains two rows to distinguish even (1*) and odd (*1) errors, as well as four columns to distinguish each input pattern (00, 01, 10 and 11). It will be apparent that a similar table can be constructed for any given subset size. As can be seen, the initialization errors in subsets 2616a comprise one even error 10 with a corresponding input pattern of 11, and one odd error 01 with a corresponding input pattern of 00, and have been placed into table 2622a accordingly. Next, the error patterns are matched in operation 2630a, comprising steps 2632a, 2634a, and 2636a. Matching operation 2630a first selects the input pattern which has the highest number of corresponding error pairs (that is, pairs of one even and one odd error, as will be explained in more detail in FIG. 26B and 26E) to translate to 11 in step 2632a. In this case, neither input pattern 00 nor input pattern 11 contain an error pair, so the process selects the input pattern with the largest number of total errors. Since both 00 and 11 contain a single error, the process refers to a default selection. In this case 00 is selected as default, so 00 is selected to translate to 11 and column A is selected from table 2102 of FIG. 21B, which corresponds to the set of encoding patterns which translate 00 to 11.

Next, matching operation 2630a proceeds to step 2634a, wherein the remaining three input patterns (01, 10 and 11) are compared to select the input pattern with the largest number of even errors. Since 11 contains one even error, 11 is selected to translate to 10. Thus, rows within the column selected in step 2632a (column A) which translate 11 to 10 are selected, corresponding to rows 2 and 6 in table 2102 of FIG. 21B. The process then selects the input pattern from the remaining two input patterns (01 and 10) which contains the largest number of odd errors. Since neither 01 nor 10 contains an error, the process refers to a default selection. In this case, 01 is selected as default and is chosen to translate as 01. Thus, one of the two rows selected in step 2634a (rows 2 and 6) within the column selected in step 2632a (column A) which translate 01 to 01 is selected, corresponding to row 2 of table 2102. In this way, the appropriate encoding pattern has been identified as the pattern depicted in column A, row 2, of table 2102, referred to as pattern A2. Although not depicted, pattern A2 has a 5-bit pattern reference code (PRC) which is stored in the five flag bits in subsection 2604a.

Next, the encoding pattern selected in matching operation 2630a (pattern A2) is used to encode input data 2612a in step 2640a. Thus, all subsets within input data 2612a which have a pattern 00 are translated to 11, all subsets with pattern 11 are translated to 10, all subsets with pattern 10 are translated to 00, and all subsets with pattern 01 remain unchanged. In this way, input data 2612a is encoded to produce a set of encoded input data 2642a. As can be seen, all of the error cells in subsets 2616a are now effectively correct, as their logical value matches the value in encoded input data 2642a.

Finally, encoded input data 2642a may be further processed by a secondary error correction code, such as BCH, to correct any additional errors not corrected in encoding step 2640a. Encoded input data 2642a is then programmed into subsection 2604a in programming step 2650a. As described previously, in programming step 2650a a SET operation is performed on each bit in the encoded input data requiring a logic '1' (since the subsection was initialized to logic '0'). Following this programming operation, the data cells in subsection 2604a have been programmed with encoded input data 2642a to obtain a programmed subsection 2654a, and the five flag cells of subsection 2604a have been programmed with the pattern reference code of encoding pattern employed (pattern A2). As can be seen, at this point all of the initialization errors in subsets 2616a have been corrected. Programmed subsection 2654a may subsequently be read and decoded by reversing the encoding pattern indicated by the pattern reference code stored in the DFEC flag bits. In this way, the five-flag 2-bit ABF method of the present disclosure may be used to correct at least two initialization errors per subsection.

Figure 26B:
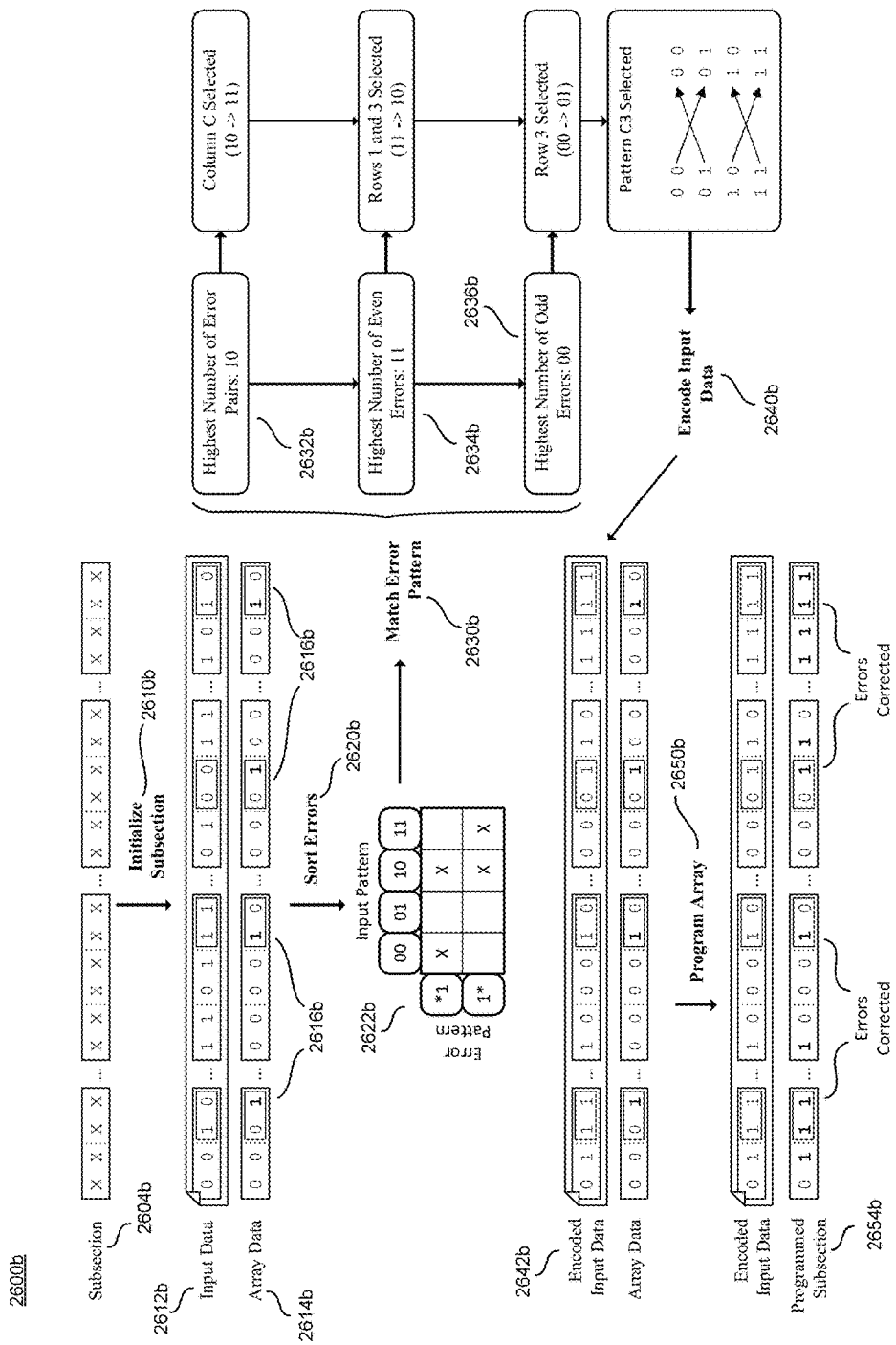
FIG. 26B is a diagram illustrating an exemplary error correction operation according to the five-flag 2-bit ABF method of the present disclosure used to correct a maximum of 100% of initialization errors in a subsection of a resistive change element array due to the favorable error pattern.

Similarly, FIG. 26B depicts an encoding operation 2600b using the five-flag 2-bit ABF method of the present disclosure to correct multiple initialization errors in subsection 2604b of a resistive change element array. First, subsection 2604b, comprising a plurality of data cells and five flag cells, is initialized in step 2610b. Using operations described previously, an initialization operation is performed on all of the data cells within subsection 2604b to attempt to place them into an initialized state. Once initialized, subsection 2604b is read to provide array data 2614b, which contains the logical state of each of the data cells in the subsection. As can be seen, four subsets 2616b within array data 2614b contain data cells which failed to initialize and remain in an uninitialized state (in this case, a logic '1' state) and may be considered error subsets.

Next, each error subset 2616b is compared to its corresponding subset in input data 2612b to determine the presence of effective initialization errors. That is, the logical state of the error cells within subsets 2616b is compared to the logical state of their corresponding bits in input data 2612b. If the logical state of the error cells match the logical state of the input data, then effectively no error has occurred, as the cells are already in the desired state. In this case, the input data may not need to be encoded using the ABF method. If at least one effective initialization error is detected, however, then the process proceeds to a data pattern matching (DPM) operation, comprising sorting operation 2620b and matching operation 2630b.

As shown in FIG. 26B, this data pattern matching operation attempts to identify an encoding pattern which can correct the maximum number of initialization errors in subsets 2616b. To achieve this, the error subsets and their corresponding input subsets are selected and sorted in step 2620b according to input pattern and error pattern, as illustrated with table 2622b, wherein each of the initialization errors in subsets 2616b are depicted with an X. Table 2622b contains two rows to distinguish even (1*) and odd (*1) errors, as well as four columns to distinguish each input pattern (00, 01, 10 and 11). It will be apparent that a similar table can be constructed for any given subset size. As can be seen, the initialization errors in subsets 2616b comprise two even errors 10 with corresponding input patterns of 11 and 10, and two odd errors 01 with corresponding input patterns of 00 and 10, and have been placed into table 2622b accordingly. Next, the error patterns are matched in operation 2630b, comprising steps 2632b, 2634b, and 2636b. Matching operation 2630b first selects the input pattern which has the highest number of corresponding error pairs to translate to 11 in step 2632b. In this case, input pattern 10 contains one even and one odd error, thus it contains one error pair. Since none of the other input patterns contain an error pair, input pattern 10 is selected to translate to 11 and column C is selected from table 2102 of FIG. 21B, which corresponds to the set of encoding patterns which translate 10 to 11.

Next, matching operation 2630b proceeds to step 2634b, wherein the remaining three input patterns (00, 01 and 11) are compared to select the input pattern with the largest number of even errors. Since 11 contains one even error, 11 is selected to translate to 10. Thus, rows within the column selected in step 2632*b* (column C) which translate 11 to 10 are selected, corresponding to rows 1 and 3. The process then selects the input pattern from the remaining two input patterns (00 and 01) which contains the largest number of odd errors. Since 00 contains one odd error, 00 is chosen to translate as 01 and one of the two rows selected in step 2634*b* (rows 1 and 3) within the column selected in step 2632*b* (column C) which translate 00 to 01 is selected, corresponding to row 3 of table 2102. In this way, the appropriate encoding pattern has been identified as the pattern depicted in column C, row 3 of table 2102, referred to as pattern C3. Although not depicted, pattern C3 has a 5-bit pattern reference code (PRC) which is stored in the five flag bits in subsection 2604*b*.

Next, the encoding pattern selected in matching operation 2630*b* (pattern C3) is used to encode input data 2612*b* in step 2640*b*. Thus, all subsets within input data 2612*b* which have a pattern 00 are translated to 01, all subsets with pattern 01 are translated to 00, all subsets with pattern 10 are translated to 11, and all subsets with pattern 11 are translated to 10. In this way, input data 2612*b* is encoded to produce a set of encoded input data 2642*b*. As can be seen, all four of the error cells in subsets 2616*b* are now effectively correct, as their logical value matches the value in encoded input data 2642*b*.

Finally, encoded input data 2642*b* may be further processed by a secondary error correction code, such as BCH, to correct any additional errors not corrected in encoding step 2640*b*. Encoded input data 2642*b* is then programmed into subsection 2604*b* in programming step 2650*b*. As described previously, in programming step 2650*b* a SET operation is performed on each bit in the encoded input data requiring a logic '1' (since the subsection was initialized to logic '0'). Following this programming operation, the data cells in subsection 2604*b* have been programmed with encoded input data 2642*b* to obtain a programmed subsection 2654*b*, and the five flag cells of subsection 2604*b* have been programmed with the pattern reference code of encoding pattern employed (pattern C3). As can be seen, at this point all four of the initialization errors in subsets 2616*b* have been corrected. Programmed subsection 2654*b* may subsequently be read and decoded by reversing the encoding pattern indicated by the pattern reference code stored in the DFEC flag bits. In this way, the five-flag 2-bit ABF method of the present disclosure may be used to correct substantially all initialization errors per subsection, given a certain pattern of errors.

Figure 26C:
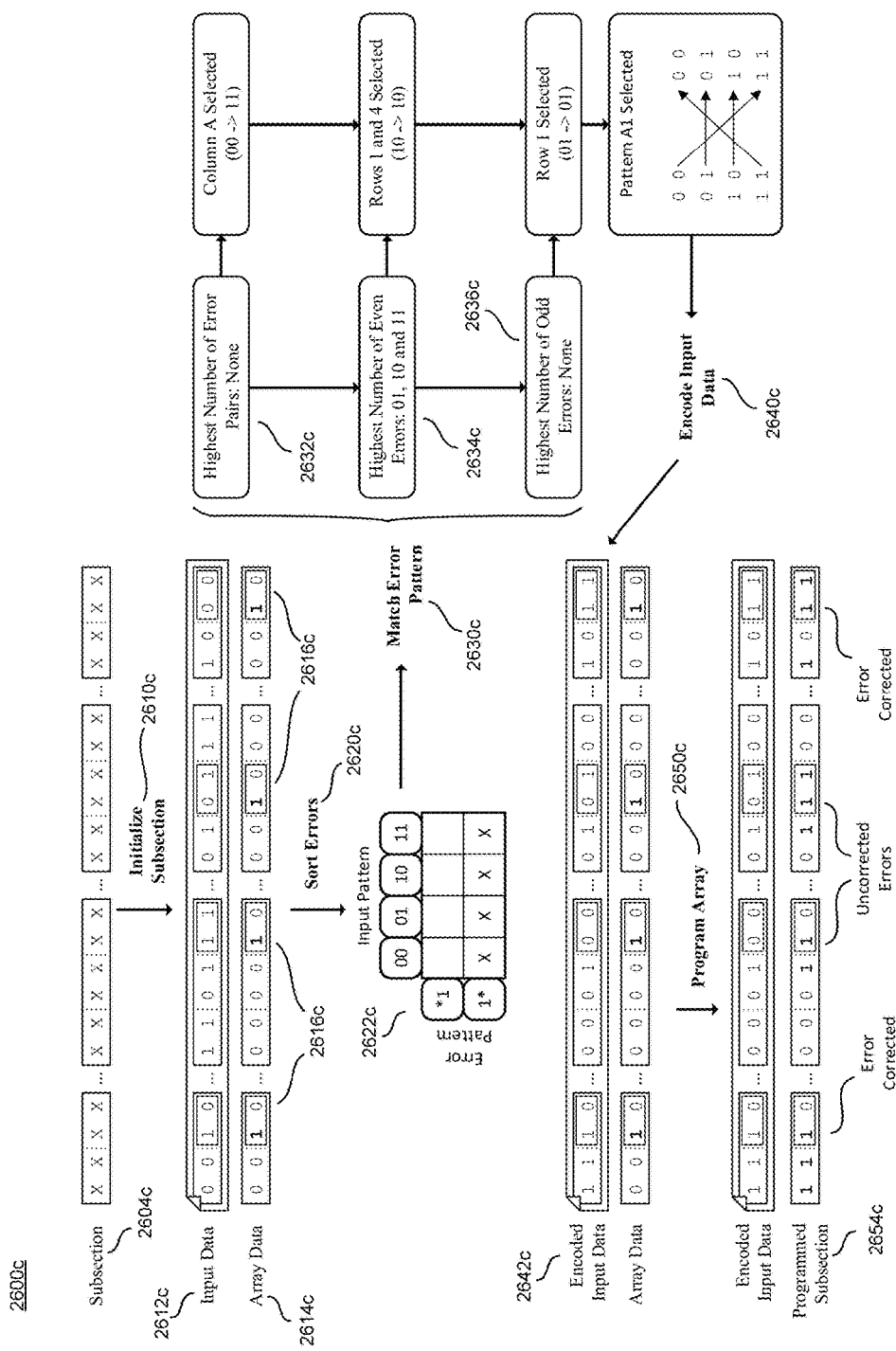
FIG. 26C is a diagram illustrating an exemplary error correction operation according to the five-flag 2-bit ABF method of the present disclosure used to correct a minimum of 50% of initialization errors in a subsection of a resistive change element array due to the unfavorable error pattern.

While the error pattern of FIG. 26A and 26B allowed the ABF method to correct all of the initialization errors, this is not always the case. As explained previously, the five-flag ABF method guarantees a minimum 50% error correction rate in the worst-case distribution of errors. FIG. 26C depicts an encoding operation 2600*c* using the 5-flag 2-bit ABF method of the present disclosure in order to correct multiple initialization errors which have a worst-case error distribution. First, subsection 2604*c*, comprising a plurality of data cells and five flag cells, is initialized in step 2610*c*. Using operations described previously, an initialization operation is performed on all of the data cells within subsection 2604*c* to attempt to place them into an initialized state. Once initialized, subsection 2604*c* is read to provide array data 2614*c*, which contains the logical state of each of the data cells in the subsection. As can be seen, four subsets 2616*c* within array data 2614*c* contain data cells which failed to initialize and remain in an uninitialized state (in this case, a logic '1' state) and may be considered error subsets.

Next, each error subset 2616*c* is compared to its corresponding subset in input data 2612*c* to determine the presence of effective initialization errors. That is, the logical state of the error cells within subsets 2616*c* is compared to the logical state of their corresponding bits in input data 2612*c*. If the logical state of the error cells match the logical state of the input data, then effectively no error has occurred, as the cells are already in the desired state. In this case, the input data may not need to be encoded using the ABF method. If at least one effective initialization error is detected, however, then the process proceeds to a data pattern matching (DPM) operation, comprising sorting operation 2620*c* and matching operation 2630*c*.

As shown in FIG. 26C, this data pattern matching operation attempts to identify an encoding pattern which can correct the maximum number of initialization errors in subsets 2616*c*. To achieve this, the error subsets and their corresponding input subsets are selected and sorted in step 2620*c* according to input pattern and error pattern, as illustrated with table 2622*c*, wherein each of the initialization errors in subsets 2616*c* are depicted with an X. As can be seen, the initialization errors in subsets 2616*c* comprise four even errors 10, one corresponding to each input pattern, and no odd errors. As will be shown, this is a worst-case error distribution, wherein errors of the same type (odd or even) are distributed evenly across the input patterns. Next, the error patterns are matched in operation 2630*c*, comprising steps 2632*c*, 2634*c*, and 2636*c*. Matching operation 2630*c* first selects the input pattern which has the highest number of corresponding error pairs in step 2632*c*. In this case, none of the input patterns contain an error pair, so the process selects the input pattern with the largest number of total errors. Since all of the patterns contain a single error, the process refers to a default selection. In this case 00 is selected as default, so 00 is selected to translate to 11 and column A is selected from table 2102 of FIG. 21B.

Next, matching operation 2630*c* proceeds to step 2634*c*, wherein the remaining three input patterns (01, 10 and 11) are compared to select the input pattern with the largest number of even errors. Since all three input patterns 01, 10 and 11 contain a single even error, the process refers to a default selection. In this case 10 is selected as default, so 10 is selected to translate to 10. Thus, rows within the column selected in step 2632*c* (column A) which translate 10 to 10 are selected, corresponding to rows 1 and 4 in table 2102 of FIG. 21B. The process then selects the input pattern from the remaining two input patterns (01 and 11) which contains the largest number of odd errors. Since neither 01 nor 11 contains an odd error, the process refers to a default selection. In this case, 01 is selected as default and is chosen to translate as 01. Thus, one of the two rows selected in step 2634*c* (rows 1 and 4) within the column selected in step 2632*c* (column A) which translate 01 to 01 is selected, corresponding to row 1 of table 2102. In this way, the appropriate encoding pattern has been identified as the pattern depicted in column A, row 1, of table 2102, referred to as pattern A1. Although not depicted, pattern A1 has a 5-bit pattern reference code (PRC) which is stored in the five flag bits in subsection 2604*c*.

Next, the encoding pattern selected in matching operation 2630*c* (pattern A1) is used to encode input data 2612*c* in step 2640*c*. Thus, all subsets within input data 2612*c* which have a pattern 00 are translated to 11, all subsets with pattern 11 are translated to 00, and all subsets with pattern 01 or 10 remain unchanged. In this way, input data 2612*c* is encoded to produce a set of encoded input data 2642c. As can be seen, two of the error cells in subsets 2616c are now effectively correct, as their logical value matches the value in encoded input data 2642c, while two error cells remain uncorrected. This corresponds to the worst-case error distribution correction rate of 50%.

Finally, encoded input data 2642c may be further processed by a secondary error correction code, such as BCH, to correct any additional errors not corrected in encoding step 2640c. This process is necessary to correct the two initialization errors which were not corrected by the ABF method during encoding step 2640c. Encoded input data 2642c is then programmed into subsection 2604c in programming step 2650c. As described previously, in programming step 2650c a SET operation is performed on each bit in the encoded input data requiring a logic '1' (since the subsection was initialized to logic '0'). Following this programming operation, the data cells in subsection 2604c have been programmed with encoded input data 2642c to obtain a programmed subsection 2654c, and the five flag cells of subsection 2604c have been programmed with the pattern reference code of encoding pattern employed (pattern A1). As can be seen, at this point only half of the initialization errors in subsets 2616c have been corrected. Programmed subsection 2654c must be read and processed by a secondary error correction method before it can be decoded by the ABF method to retrieve the original input data. In this way, the five-flag 2-bit ABF method of the present disclosure may be used to correct at least 50% initialization errors per subsection.

Figure 26D:
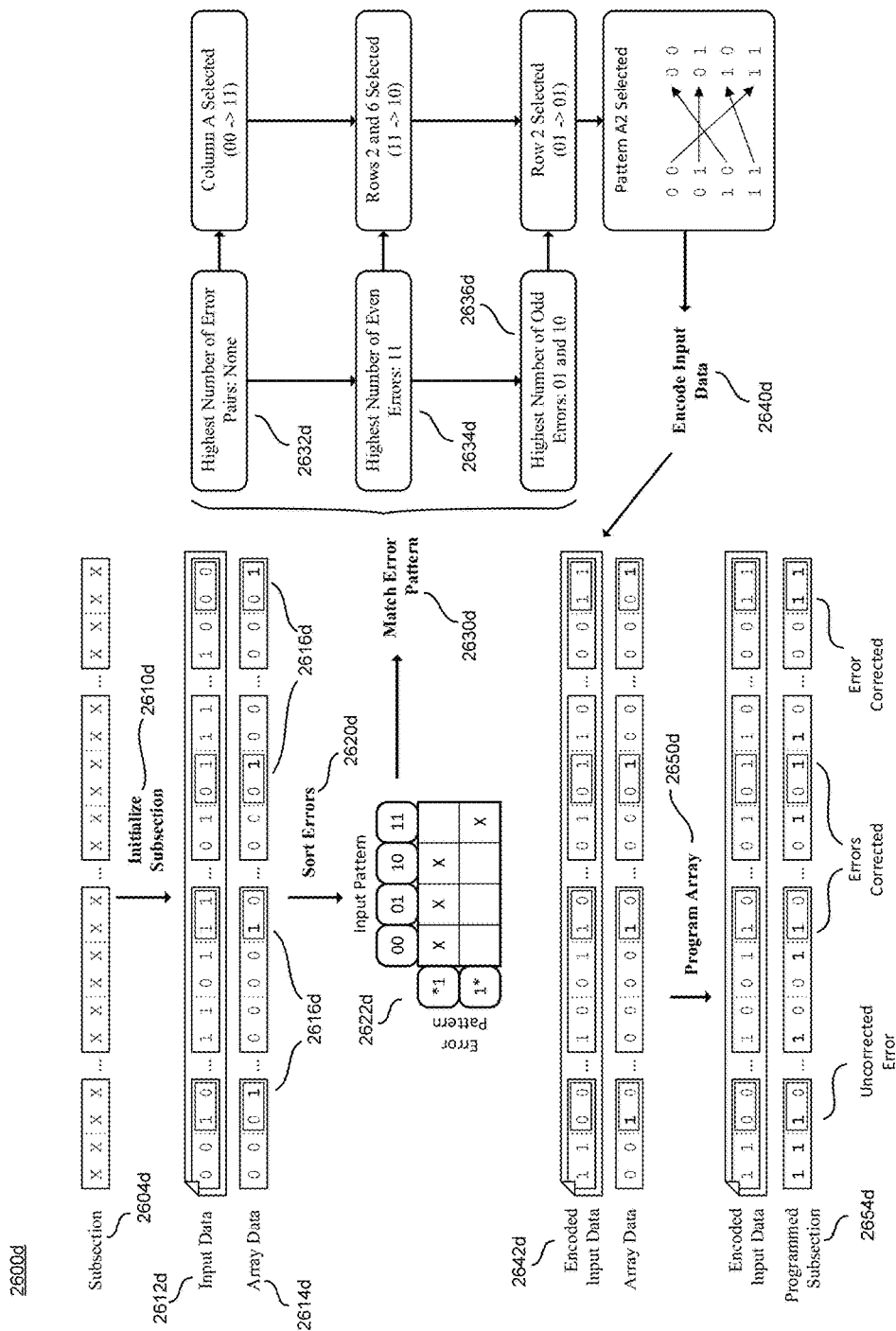
FIG. 26D is a diagram illustrating an exemplary error correction operation according to the five-flag 2-bit ABF method of the present disclosure used to correct between the minimum and maximum percentage of initialization errors in a subsection of a resistive change element array due to the error pattern.

While FIGS. 26A and 26B illustrated best-case error distributions with 100% correction rate, and FIG. 26C depicted a worst-case error distribution with 50% correction rate, most of the possible error distributions will result in a correction rate between these two extremes. To this end, FIG. 26D depicts an encoding operation 2600d using the five-flag 2-bit ABF method of the present disclosure in order to correct multiple initialization errors. First, subsection 2604d, comprising a plurality of data cells and five flag cells, is initialized in step 2610d. Using operations described previously, an initialization operation is performed on all of the data cells within subsection 2604d to attempt to place them into an initialized state. Once initialized, subsection 2604d is read to provide array data 2614d, which contains the logical state of each of the data cells in the subsection. As can be seen, four subsets 2616d within array data 2614d contain data cells which failed to initialize and remain in an uninitialized state (in this case, a logic '1' state) and may be considered error subsets.

Next, each error subset 2616d is compared to its corresponding subset in input data 2612d to determine the presence of effective initialization errors. That is, the logical state of the error cells within subsets 2616d is compared to the logical state of their corresponding bits in input data 2612d. If the logical state of the error cells match the logical state of the input data, then effectively no error has occurred, as the cells are already in the desired state. In this case, the input data may not need to be encoded using the ABF method. If at least one effective initialization error is detected, however, then the process proceeds to a data pattern matching (DPM) operation, comprising sorting operation 2620d and matching operation 2630d.

As shown in FIG. 26D, this data pattern matching operation attempts to identify an encoding pattern which can correct the maximum number of initialization errors in subsets 2616d. To achieve this, the error subsets and their corresponding input subsets are selected and sorted in step 2620d according to input pattern and error pattern, as illustrated with table 2622d, wherein each of the initialization errors in subsets 2616d are depicted with an X. As can be seen, the initialization errors in subsets 2616d comprise three odd errors 01, one corresponding to each input pattern 00, 01, and 10, and one even error corresponding to 11. Next, the error patterns are matched in operation 2630d, comprising steps 2632d, 2634d, and 2636d. Matching operation 2630d first selects the input pattern which has the highest number of corresponding error pairs in step 2632d. In this case, none of the input patterns contain an error pair, so the process selects the input pattern with the largest number of total errors. Since all of the patterns contain a single error, the process refers to a default selection. In this case 00 is selected as default, so 00 is selected to translate to 11 and column A is selected from table 2102 of FIG. 21B.

Next, matching operation 2630d proceeds to step 2634d, wherein the remaining three input patterns (01, 10 and 11) are compared to select the input pattern with the largest number of even errors. Since only 11 contains an even error, 11 is selected to translate to 10, corresponding to rows 2 and 6 in table 2102 of FIG. 21B. The process then selects the input pattern from the remaining two input patterns (01 and 10) which contains the largest number of odd errors. Since both 01 and 10 contain an odd error, the process refers to a default selection. In this case, 01 is selected as default and is chosen to translate as 01. Thus, one of the two rows selected in step 2634d (rows 2 and 6) within the column selected in step 2632d (column A) which translates 01 to 01 is selected, corresponding to row 2 of table 2102. In this way, the appropriate encoding pattern has been identified as the pattern depicted in column A, row 2, of table 2102, referred to as pattern A2. Although not depicted, pattern A2 has a 5-bit pattern reference code (PRC) which is stored in the five flag bits in subsection 2604d.

Next, the encoding pattern selected in matching operation 2630d (pattern A2) is used to encode input data 2612d in step 2640d. Thus, all subsets within input data 2612d which have a pattern 00 are translated to 11, all subsets with pattern 11 are translated to 10, all subsets with pattern 10 are translated to 00, and all subsets with pattern 01 remain unchanged. In this way, input data 2612d is encoded to produce a set of encoded input data 2642d. As can be seen, three of the error cells in subsets 2616d are now effectively correct, as their logical value matches the value in encoded input data 2642d, while two error cells remain uncorrected. This corresponds to an error correction rate of 75%, which is less than the maximum but higher than the minimum correction rate.

Finally, encoded input data 2642d may be further processed by a secondary error correction code, such as BCH, to correct any additional errors not corrected in encoding step 2640d. This process is necessary to correct the remaining initialization error which was not corrected by the ABF method during encoding step 2640d. Encoded input data 2642d is then programmed into subsection 2604d in programming step 2650d. As described previously, in programming step 2650d a SET operation is performed on each bit in the encoded input data requiring a logic '1' (since the subsection was initialized to logic '0'). Following this programming operation, the data cells in subsection 2604d have been programmed with encoded input data 2642d to obtain a programmed subsection 2654d, and the five flag cells of subsection 2604d have been programmed with the pattern reference code of encoding pattern employed (pattern A2). As can be seen, at this point only three of the initialization errors in subsets 2616d have been corrected.

Programmed subsection 2654d must be read and processed by a secondary error correction method before it can be decoded to recover the original input data. In this way, the five-flag 2-bit ABF method of the present disclosure may be used to correct between 100% and 50% of initialization errors in a subsection, dependent on the error distribution.

Figure 26E:
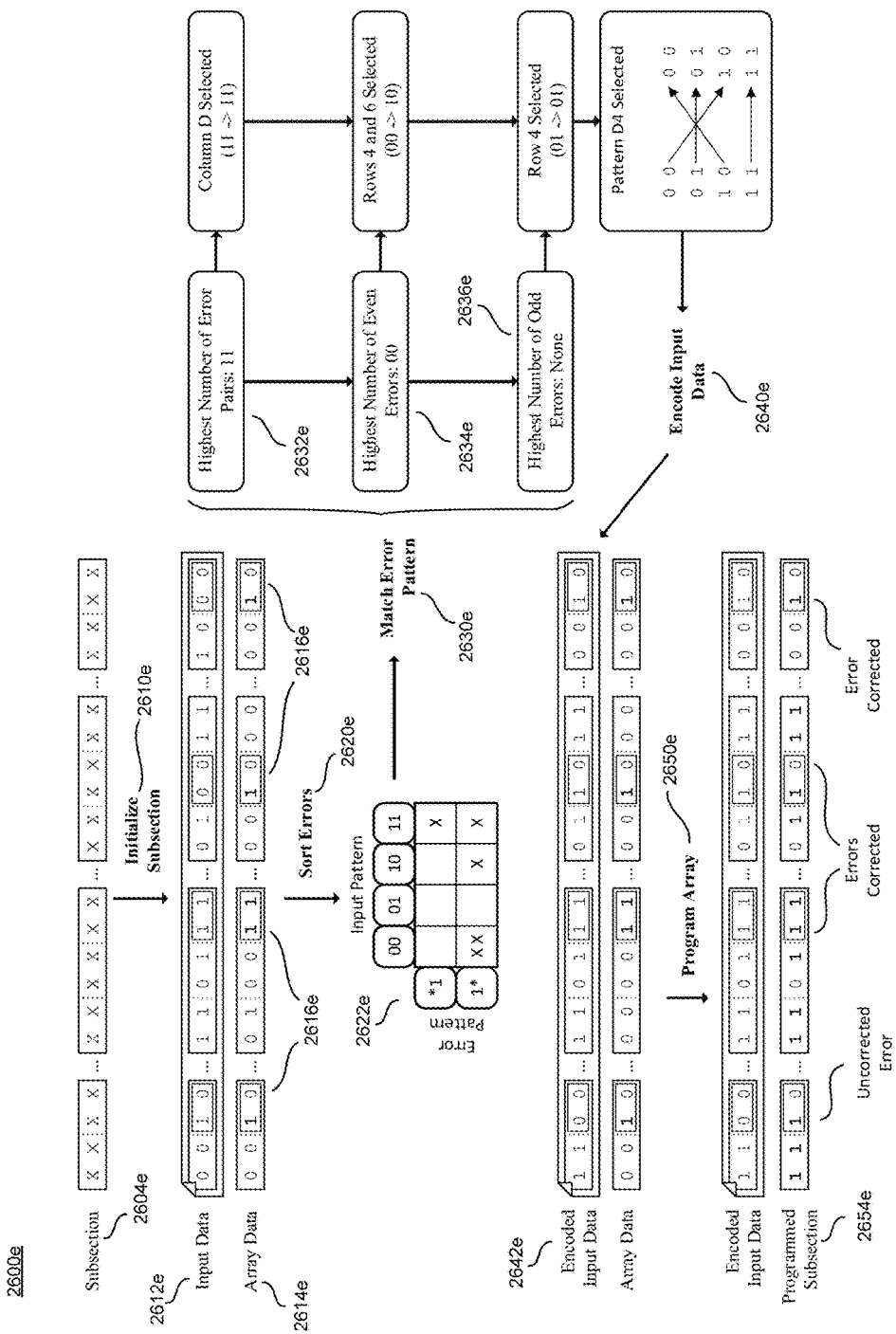
FIG. 26E is a diagram illustrating an exemplary error correction operation according to the five-flag 2-bit ABF method of the present disclosure used to identify the optimal encoding pattern for an exemplary error pattern in a resistive change element array.

FIG. 26E provides a further demonstration of the data pattern matching process to determine the optimal encoding pattern to address a given error distribution, as well as the handling of continuous errors. FIG. 26E depicts an encoding operation 2600e using the five-flag 2-bit ABF method of the present disclosure in order to correct multiple initialization errors. First, subsection 2604e, comprising a plurality of data cells and five flag cells, is initialized in step 2610e. Using operations described previously, an initialization operation is performed on all of the data cells within subsection 2604e to attempt to place them into an initialized state. Once initialized, subsection 2604e is read to provide array data 2614e, which contains the logical state of each of the data cells in the subsection. As can be seen, five subsets 2616e within array data 2614e contain data cells which failed to initialize and remain in an uninitialized state (in this case, a logic '1' state) and may be considered error subsets.

Next, each error subset 2616e is compared to its corresponding subset in input data 2612e to determine the presence of effective initialization errors. That is, the logical state of the error cells within subsets 2616e is compared to the logical state of their corresponding bits in input data 2612e. If the logical state of the error cells match the logical state of the input data, then effectively no error has occurred, as the cells are already in the desired state. In this case, the input data may not need to be encoded using the ABF method. If at least one effective initialization error is detected, however, then the process proceeds to a data pattern matching (DPM) operation, comprising sorting operation 2620e and matching operation 2630e.

As shown in FIG. 26E, this data pattern matching operation attempts to identify an encoding pattern which can correct the maximum number of initialization errors in subsets 2616e. To achieve this, the error subsets and their corresponding input subsets are selected and sorted in step 2620e according to input pattern and error pattern, as illustrated with table 2622e, wherein each of the initialization errors in subsets 2616e are depicted with an X. As can be seen, the initialization errors in subsets 2616e comprise one even and one odd error corresponding to input pattern 11, two even errors 10 corresponding to input pattern 00, and one even error corresponding to 10. In some applications, such a continuous error as the one which has occurred with input pattern 11 may be treated as one even and one odd error, even though they have occurred in the same subset. Next, the error patterns are matched in operation 2630e, comprising steps 2632e, 2634e, and 2636e. Matching operation 2630e first selects the input pattern which has the highest number of corresponding error pairs in step 2632e. In this case, one error pair has occurred for input pattern 11, so 11 is selected to translate to 11 and column D is selected from table 2102 of FIG. 21B.

Next, matching operation 2630e proceeds to step 2634e, wherein the remaining three input patterns (00, 01 and 10) are compared to select the input pattern with the largest number of even errors. Since 00 contains two even errors, 00 is selected to translate to 10, corresponding to rows 4 and 6 in table 2102 of FIG. 21B. The process then selects the input pattern from the remaining two input patterns (01 and 10) which contains the largest number of odd errors. Since neither 01 nor 10 contain an odd error, the process refers to a default selection. In this case, 01 is selected as default and is chosen to translate as 01. Thus, one of the two rows selected in step 2634e (rows 4 and 6) within the column selected in step 2632e (column D) which translates 01 to 01 is selected, corresponding to row 4 of table 2102. In this way, the appropriate encoding pattern has been identified as the pattern depicted in column D, row 4, of table 2102, referred to as pattern D4. Although not depicted, pattern D4 has a 5-bit pattern reference code (PRC) which is stored in the five flag bits in subsection 2604e.

Next, the encoding pattern selected in matching operation 2630e (pattern D4) is used to encode input data 2612e in step 2640e. Thus, all subsets within input data 2612e which have a pattern 00 are translated to 10, all subsets with pattern 10 are translated to 00, and all subsets with pattern 01 or 11 remain unchanged. In this way, input data 2612e is encoded to produce a set of encoded input data 2642e. As can be seen, four of the error cells in subsets 2616e are now effectively correct, as their logical value matches the value in encoded input data 2642e, while one error cell remains uncorrected. This corresponds to an error correction rate of 80%, which is less than the maximum but higher than the minimum correction rate.

Finally, encoded input data 2642e may be further processed by a secondary error correction code, such as BCH, to correct any additional errors not corrected in encoding step 2640e. This process is necessary to correct the remaining initialization error which was not corrected by the ABF method during encoding step 2640e. Encoded input data 2642e is then programmed into subsection 2604e in programming step 2650e. As described previously, in programming step 2650e a SET operation is performed on each bit in the encoded input data requiring a logic '1' (since the subsection was initialized to logic '0'). Following this programming operation, the data cells in subsection 2604e have been programmed with encoded input data 2642e to obtain a programmed subsection 2654e, and the five flag cells of subsection 2604e have been programmed with the pattern reference code of encoding pattern employed (pattern D4). As can be seen, at this point only four of the initialization errors in subsets 2616e have been corrected. Programmed subsection 2654e must be read and processed by a secondary error correction method before it can be decoded to recover the original input data. In this way, the 5-flag 2-bit ABF method of the present disclosure may be used to correct between 100% and 50% of initialization errors in a subsection, dependent on the error distribution.

Figure 26F:
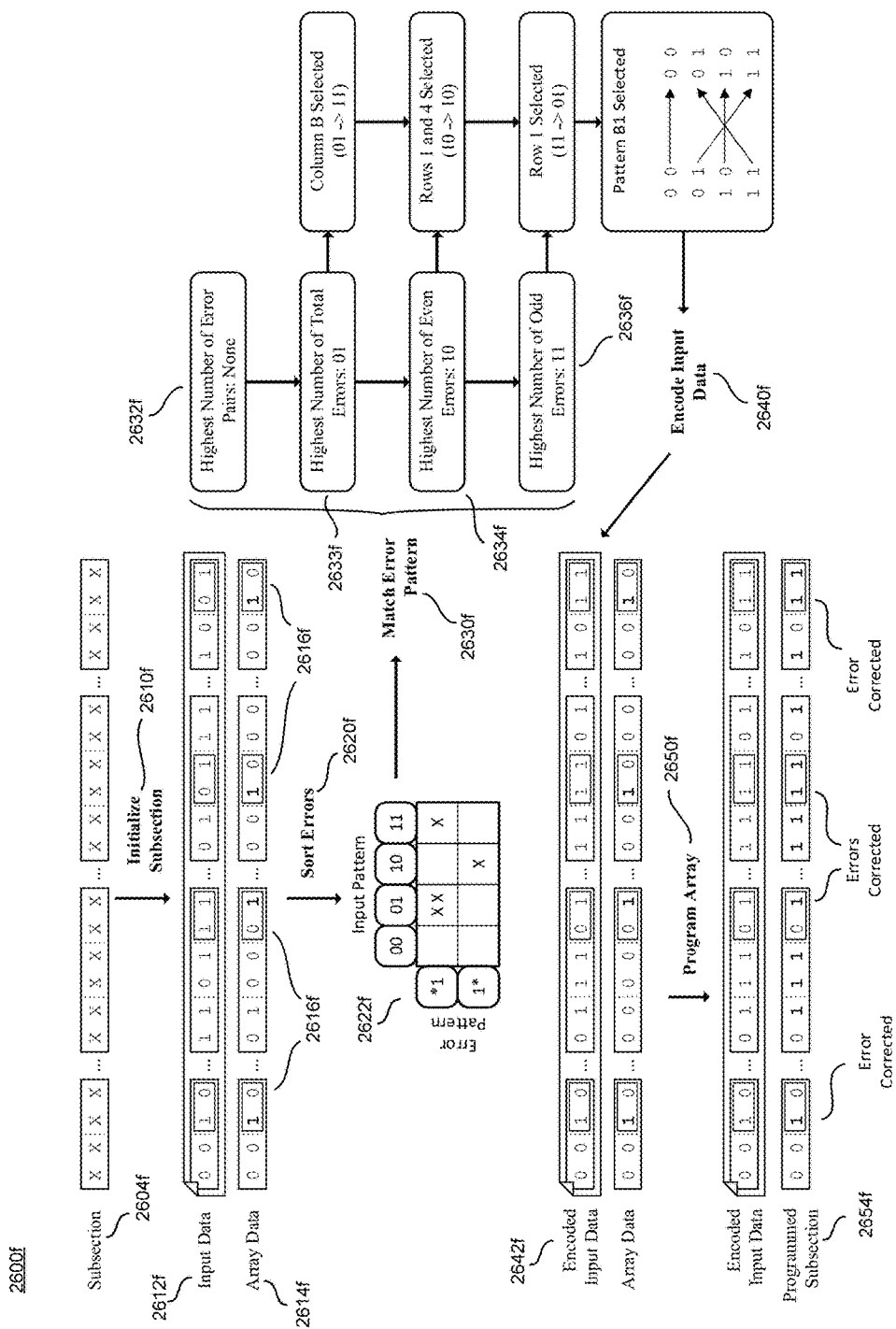
FIG. 26F is a diagram illustrating an exemplary error correction operation according to the five-flag 2-bit ABF method of the present disclosure used to identify the optimal encoding pattern for an exemplary error pattern in a resistive change element array with an additional matching step.

Finally, FIG. 26F provides a demonstration of the data pattern matching process to determine the optimal encoding pattern with an additional selection criteria. FIG. 26F depicts an encoding operation 2600f using the five-flag 2-bit ABF method of the present disclosure in order to correct multiple initialization errors. First, subsection 2604f, comprising a plurality of data cells and five flag cells, is initialized in step 2610f. Using operations described previously, an initialization operation is performed on all of the data cells within subsection 2604f to attempt to place them into an initialized state. Once initialized, subsection 2604f is read to provide array data 2614f, which contains the logical state of each of the data cells in the subsection. As can be seen, four subsets 2616f within array data 2614f contain data cells which failed to initialize and remain in an uninitialized state (in this case, a logic '1' state) and may be considered error subsets.

Next, each error subset 2616f is compared to its corresponding subset in input data 2612f to determine the presence of effective initialization errors. That is, the logical state of the error cells within subsets 2616f is compared to the logical state of their corresponding bits in input data 2612*f*. If the logical state of the error cells match the logical state of the input data, then effectively no error has occurred, as the cells are already in the desired state. In this case, the input data may not need to be encoded using the ABF method. If at least one effective initialization error is detected, however, then the process proceeds to a data pattern matching (DPM) operation, comprising sorting operation 2620*f* and matching operation 2630*f*.

As shown in FIG. 26F, this data pattern matching operation attempts to identify an encoding pattern which can correct the maximum number of initialization errors in subsets 2616*f*. To achieve this, the error subsets and their corresponding input subsets are selected and sorted in step 2620*f* according to input pattern and error pattern, as illustrated with table 2622*f*, wherein each of the initialization errors in subsets 2616*f* are depicted with an X. As can be seen, the initialization errors in subsets 2616*f* comprise one odd error 01 corresponding to input pattern 11, two odd errors 01 corresponding to input pattern 01, and one even error corresponding to 10. Next, the error patterns are matched in operation 2630*f*, comprising steps 2632*f*, 2634*f*, and 2636*f*, in addition to step 2633*f*. Matching operation 2630*f* first selects the input pattern which has the highest number of corresponding error pairs in step 2632*f*. As can be seen, no error pairs have occurred and the process then selects the input pattern with the highest number of total errors to translate to 11 in step 2633*f*. Input pattern 01 has two errors and is thus selected to translate to 11, corresponding to column B of FIG. 21B. Step 2633*f* is only performed if no error pairs are detected in step 2632*f*, and, as demonstrated previously, if multiple input patterns have the same number of errors (if both 00 and 10 have two errors, for instance) then the process may refer to a default setting.

Next, matching operation 2630*f* proceeds to step 2634*f*, wherein the remaining three input patterns (00, 10 and 11) are compared to select the input pattern with the largest number of even errors. Since 10 contains one even error, 10 is selected to translate to 10, corresponding to rows 1 and 4 in table 2102 of FIG. 21B. The process then selects the input pattern from the remaining two input patterns (00 and 11) which contains the largest number of odd errors. Since input 11 has one odd error, 11 is selected to translate to 01. Thus, one of the two rows selected in step 2634*f* (rows 1 and 4) within the column selected in step 2632*f* (column B) which translates 11 to 01 is selected, corresponding to row 1 of table 2102. In this way, the appropriate encoding pattern has been identified as the pattern depicted in column B, row 1, of table 2102, referred to as pattern B1. Although not depicted, pattern B1 has a 5-bit pattern reference code (PRC) which is stored in the five flag bits in subsection 2604*f*.

Next, the encoding pattern selected in matching operation 2630*f* (pattern B1) is used to encode input data 2612*f* in step 2640*f*. Thus, all subsets within input data 2612*f* which have a pattern 01 are translated to 11, all subsets with pattern 11 are translated to 01, and all subsets with pattern 00 or 10 remain unchanged. In this way, input data 2612*f* is encoded to produce a set of encoded input data 2642*f*. As can be seen, all four of the error cells in subsets 2616*f* are now effectively correct, as their logical value matches the value in encoded input data 2642*f*. This corresponds to an error correction rate of 100%, which is only possible because of additional matching step 2633*f*.

Finally, encoded input data 2642*f* may be further processed by a secondary error correction code, such as BCH, to correct any additional errors not corrected in encoding step 2640*f*. This process is necessary to correct the remaining initialization error which was not corrected by the ABF method during encoding step 2640*f*. Encoded input data 2642*f* is then programmed into subsection 2604*f* in programming step 2650*f*. As described previously, in programming step 2650*f* a SET operation is performed on each bit in the encoded input data requiring a logic '1' (since the subsection was initialized to logic '0'). Following this programming operation, the data cells in subsection 2604*f* have been programmed with encoded input data 2642*f* to obtain a programmed subsection 2654*f*, and the five flag cells of subsection 2604*f* have been programmed with the pattern reference code of encoding pattern employed (pattern B1). As can be seen, at this point all four of the initialization errors in subsets 2616*f* have been corrected, and programmed subsection 2654*f* may be read and decoded by reversing the encoding pattern to recover the input data. In this way, the five-flag 2-bit ABF method of the present disclosure may be used to correct the maximum number of initialization errors in a subsection.

DFEC Hardware Systems

Figure 27:
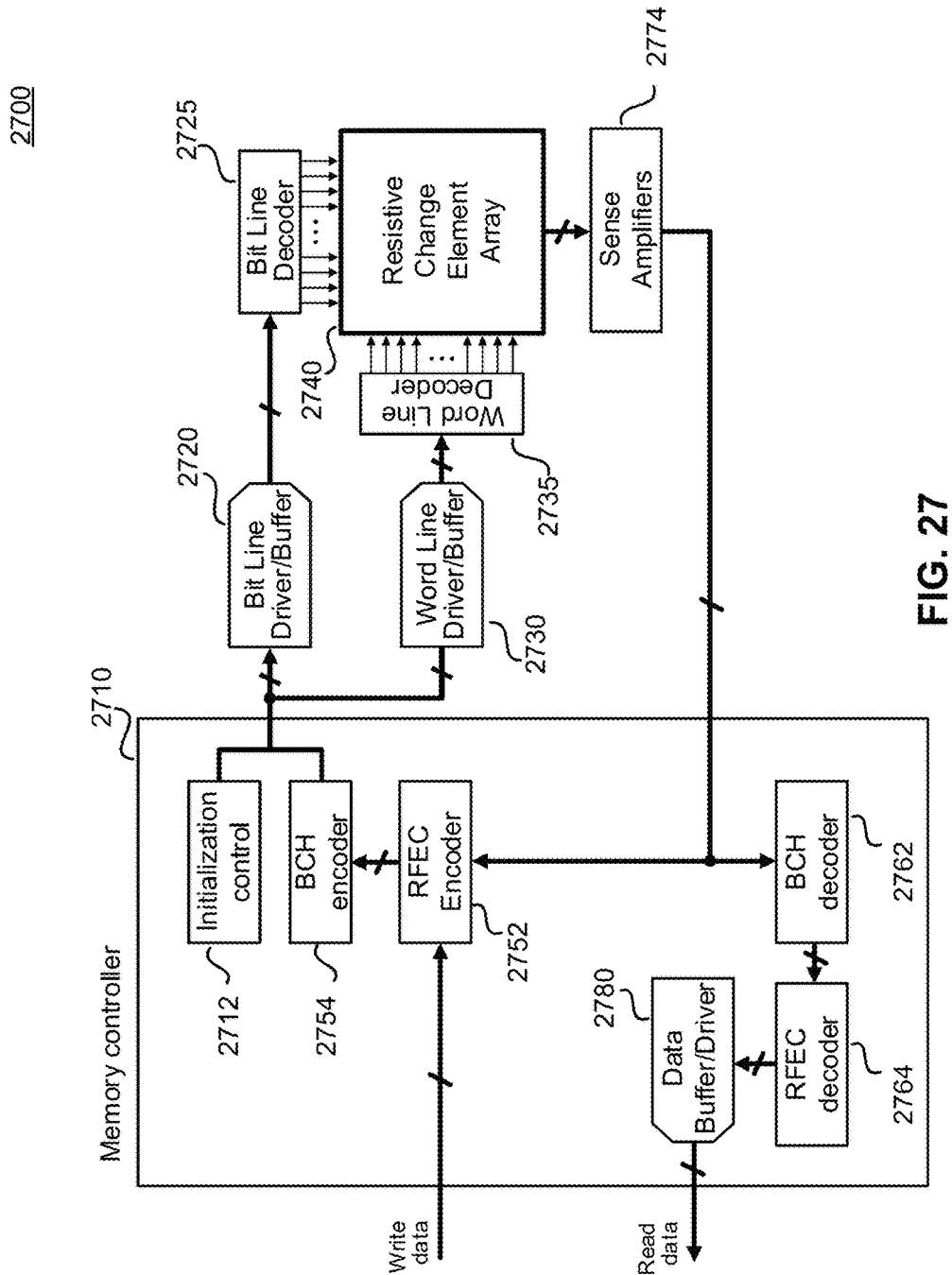
FIG. 27 is a simplified block diagram of a resistive change element array memory system suitable for use with the error correction methods of the present disclosure.

Referring now to FIG. 27, a system level block diagram is shown illustrating a memory system 2700 comprising a resistive change element array 2740 and suitable for use with the DFEC methods of the present disclosure.

At the core of the access and addressing system 2700 is a resistive change element array 2740 similar in architecture to the arrays shown in FIGS. 2, 4, and 5. A processor control element 2710 provides an array of address control lines to a bit line driver/buffer circuit 2720 and to a word line driver/buffer circuit 2730. The bit line driver/buffer circuit 2720 then generates an array of bit lines through bit line decoder element 2725 and provides those bit lines to resistive change element array 2740. Similarly, the word line driver/buffer circuit 2730 generates an array of word lines through word line decoder element 2735 and provides those word lines to resistive change element array 2740. It should be noted that order of the driver, buffer and decoder circuits for the bit line and word line may vary depending on the needs of a particular application. Thus, the buffer may be placed first, followed by the decoder, then the driver, or in any other order, the invention is not limited in this regard. Further, in some applications the driver may be unnecessary and may be removed. In this way, electrical stimuli can be provided to the resistive change element array 2740 from processor control element 2710 in order to adjust the state of cells within the array (as described with respect to FIGS. 2, 3, 4, and 5 above).

A DFEC encoder circuit 2752 (such as exemplary encoder circuit 1201 in FIG. 12A or 2001 in FIG. 20A) is responsive to resistive change element array 2740 and provides programming data (analogous to 1240 in FIG. 12A or 2050 in FIG. 20A) to a BCH error correction circuit 2754. The BCH error correction circuit 2754 then provides BCH encoded data back to resistive change element array 2740. The resistive change element array 2740 is then able to output read data first through BCH ECC decoder 2762 and then through DFEC decoder circuit 2764 (such as exemplary decoder circuit 1202 in FIG. 12B or 2002 in FIG. 20B). In this way, memory system 2700 is able to execute the DFEC methods of the present disclosure as detailed in FIGS. 10, 18 and 23, and described throughout the present specification.

DFEC decoder circuit 2764 provides corrected data to an array of sense amplifiers 2774 through an analog multiplexer element 2772. Responsive to control signals from the processor control element 2710, the analog multiplexer element 2772 interconnects the bit lines, words lines, and, in some cases, reference bit lines (as shown in FIG. 2, for example)

to the array of sense amplifiers 2774. A system of I/O gates 2776 is responsive to the array of sense amplifiers 2774 and control signals from the processor control element 2710 and is used to temporally latch and store logic values read from the resistive change element array. Responsive to the I/O gate element 2776, a data buffer driver element 2780 provides the corrected data values read from the array back to the processor control element 2710.

The processor control element 2710 within the exemplary access and addressing system of FIG. 27 is used to represent a programming operation circuit (or the like) that can be used to apply the different voltages and other conditions to the arrays of bit lines and word lines within a resistive change element array as required by the methods of the present disclosure and discussed with respect to the figures above. Such electrical stimuli can be implemented through a variety of structures as best fits the needs of a specific application. For example, FPGAs, PLDs, microcontrollers, logic circuits, or a software program executing on a computer could all be used to execute the dynamic programming operations and dynamic READ operations as detailed in the previous discussions.

It should be noted that though the resistive change memory array architectures of the present disclosure are presented using the exemplary simplified schematics within FIGS. 2, 4, 5, 8B, 9B, 12A-12B, and 20A-20B, and the block diagrams of FIGS. 8A, 9A, 17A, 22A and 25, the methods of the present disclosure should not be limited to those specific electrical circuits depicted. Indeed, it will be clear to those skilled in the art that the electrical circuits depicted in these figures can be altered in a plurality of ways to optimize a circuit to practice the described error correction methods within a specific application.

It is preferred, then, that the preceding description of resistive change memory array architectures be representative and inclusive of these variations and not otherwise limited to the specific illustrative parameters detailed.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method of error correction for a resistive change element array comprising:
providing a resistive change element array, said resistive change element array comprising:
a plurality of resistive change elements, each of said plurality of resistive change elements capable of adjusting between at least two non-volatile resistive states responsive to applied electrical stimuli, wherein one of said non-volatile resistive states is an initialized state;
wherein said plurality of resistive change elements within said array are organized into a plurality of subsections, each of said subsections including a plurality of resistive change elements assigned as data cells and at least one resistive change element assigned as a flag cell, said data cells further organized into a plurality of data subsets, each of said data subsets having at least two data cells;
receiving input data to be programmed into at least one of said subsections;
initializing all of said data cells and said flag cells within at least one of said subsections into said initialized state;
reading said data cells within said at least one subsection to identify any data subsets with initialization errors;
comparing said identified data subsets within said at least one subsection with initialization errors to said input data to select an encoding pattern capable of correcting at least one of said initialization errors, said encoding pattern having a pattern reference code;
encoding said input data with said selected encoding pattern to obtain encoded input data;
programming said encoded input data into said data cells and said pattern reference code into said flag cells within said at least one subsection;
accessing at least one of said programmed subsections during a read operation to obtain encoded read data; and
decoding said encoded read data according to an encoding pattern indicated by said flag cells within said at least one programmed subsection to generate output data;
wherein said encoding step provides a first error correction operation.

2. The method of claim 1 wherein said encoding pattern is selected by:
organizing said input data into a plurality of input data subsets corresponding to said subsection data subsets;
comparing each of said subsection data subsets with initialization errors to its corresponding input data subset to determine at least one encoding pattern capable of correcting at least one initialization error within said subsection data subset; and
selecting an encoding pattern best suited to correcting said initialization errors within said array.

3. The method of claim 2 wherein said steps of organizing, comparing, and selecting are performed multiple times.

4. The method of claim 3 wherein the number of data bits within said subsection data subsets is selected in said comparing step prior to repeating said organizing step.

5. The method of claim 4 wherein said number of data bits is selected to maximize the number of initialization errors that can be corrected by said first error correction operation.

6. The method of claim 1 wherein said resistive change element array further comprises error correction parity cells and said encoded input data is processed through a second error correction operation prior to said step of programming and said step of programming further comprises programming said parity cells with a parity code according to said second error correction operation.

7. The method of claim 6 wherein said encoded read data is processed through said second error correction operation and corrected responsive to said parity code and said second error correction operation prior to said step of decoding.

8. The method of claim 7 wherein said input data and said encoded input data remains unchanged by said second error correction operation during said processing steps.

9. The method of claim 6 wherein the number of said flag cells within said resistive change element array and the number of parity cells within said resistive change element array define a combined parity overhead, a combined correctable bit error rate (BER), and a combined error correction latency for said resistive change element array.

10. The method of claim 9 wherein at least one of said combined parity overhead, said combined correctable bit error rate (BER), said combined error correction latency is improved as compared to a respective equivalent parity overhead, equivalent combined correctable bit error rate (BER), and equivalent error correction latency that would be realized using said second error correction operation alone.

11. The method of claim 6 wherein said second error correction operation corrects programming errors, data retention errors, and initialization errors not corrected by said first error correction operation.

12. The method of claim 1 wherein said array possesses a bias towards error during programming said data cells into one of said non-volatile resistive states.

13. The method of claim 12 wherein said biased non-volatile resistive state is selected as said initialized state.

14. The method of claim 1 wherein said first error correction operation is capable of correcting at least two initialization errors per subsection within said array.

15. The method of claim 1 wherein said first error correction operation provides a preselected correctable bit error rate (BER).

16. The method of claim 15 wherein said preselected correctable bit error rate (BER) is within the range of 0.1% to 0.2%.

17. The method of claim 15 wherein said preselected correctable bit error rate (BER) is within the range of 0.2% to 0.5%.

18. The method of claim 1 wherein said subsection data sets comprise three data cells.

19. The method of claim 1 wherein said subsection data sets comprise four data cells.

20. The method of claim 1 wherein said encoding pattern is selected using a software algorithm.

21. The method of claim 1 wherein said encoding pattern is selected using an electrical circuit.

22. The method of claim 1 wherein said steps of encoding and decoding are performed using a software algorithm.

23. The method of claim 22 wherein said software algorithm is executed within one of a microprocessor, a microcontroller, an FPGA, a PLD, and a computer.

24. The method of claim 1 where said steps of encoding and decoding are performed using an electrical circuit.

25. A method of encoding data for error correction, comprising:
providing a first set of data and a second set of data of equal length;
organizing said first set of data into a first plurality of subsets and said second set of data into a corresponding plurality of subsets, each of said subsets comprising an equal number of data bits, wherein the logical values of said data bits within each of said subsets forms a logical pattern;
comparing each bit within said first plurality of subsets which has a preselected logical value to its corresponding bit, wherein each of said bits which has a difference in logical value with its corresponding bit is an error bit and each subset within said first plurality of subsets containing at least one error bit is an error subset, the logical pattern of bits in said error subset being an error pattern;
matching said error subsets and said corresponding subsets to select an encoding pattern, said matching step comprising:
sorting each of said error subsets according to the logical pattern of its corresponding subset;
selecting a first logical pattern within said corresponding subsets which has the largest number of error subsets containing different error patterns to translate to a second logical pattern, and selecting a primary set of encoding patterns capable of said translation of said first logical pattern to said second logical pattern;
determining the logical pattern within said corresponding subsets which has the largest number of a single error pattern to translate to a logical pattern capable of correcting said single error pattern, and selecting a second set of encoding patterns from said primary set of encoding patterns capable of said translation;
repeating said determining step for each of said logical patterns within said corresponding subsets which has an associated error subset until a single encoding pattern is selected from said primary set of encoding patterns;
translating each of said subsets within said corresponding plurality of subsets into an encoded subset according to said selected encoding pattern to obtain an encoded set of data;
wherein said encoding pattern is selected from the set of all possible reversible translation patterns for the possible logical combinations of bits in a subset containing said number of data bits;
wherein said correction of said error bits comprises translating its corresponding bit to have a logical value equal that of said error bit according to said selected encoding pattern; and
wherein said encoding pattern is selected to maximize the number of error bits corrected.

26. The method of claim 25 wherein said subsets comprise two data bits.

27. The method of claim 25 wherein said subsets comprise at least three data bits.

28. The method of claim 25 wherein said preselected logical value is selected according to the logical value having lower occurrence in said first set of data.

29. The method of claim 25 wherein said method is capable of always correcting at least two of said error bits.

30. The method of claim 25 wherein said encoding pattern is selected from a predefined subset of said all possible reversible translation patterns.

31. The method of claim 30 wherein said set of encoding patterns within said predefined subset is selected to provide the ability to correct a selected number of errors.

32. The method of claim 31 wherein the number of said encoding patterns within said predefined subset is minimized.

33. The method of claim 25 wherein said encoding pattern is selected by a software algorithm.

34. The method of claim 25 further comprising selecting said first logical pattern within said corresponding subsets according to the logical pattern which has the largest number of total error patterns to translate to said second logical pattern, and selecting said primary set of encoding patterns capable of translating said first logical pattern to said second logical pattern.

* * * * *